US006946684B2

(12) United States Patent
Shigihara et al.

(10) Patent No.: US 6,946,684 B2
(45) Date of Patent: Sep. 20, 2005

(54) OPTICAL SEMICONDUCTOR DEVICE WITH LOW REFLECTANCE COATING

(75) Inventors: Kimio Shigihara, Tokyo (JP); Kazushige Kawasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 30 days.

(21) Appl. No.: 10/372,247

(22) Filed: Feb. 25, 2003

(65) Prior Publication Data

US 2003/0168667 A1 Sep. 11, 2003

(30) Foreign Application Priority Data

Mar. 8, 2002 (JP) ....................................... 2002-063891
Jun. 25, 2002 (JP) ....................................... 2002-185105
Dec. 16, 2002 (JP) ....................................... 2002-364244

(51) Int. Cl.[7] ................................................ H01L 29/26
(52) U.S. Cl. ............................. 257/80; 257/13; 257/79; 257/98; 257/184
(58) Field of Search .............................. 257/13, 79–80, 257/98, 184

(56) References Cited

U.S. PATENT DOCUMENTS 4,147,409 A * 4/1979 Apfel ......................... 359/584
4,837,526 A * 6/1989 Suzuki et al. .................. 385/2
4,900,137 A * 2/1990 Carter ......................... 359/488
5,012,478 A * 4/1991 Hattori et al. ................ 372/49
5,084,894 A * 1/1992 Yamamoto ................... 372/50
5,161,164 A * 11/1992 Shigihara et al. ............. 372/20
5,282,219 A 1/1994 Shigihara et al.
5,334,854 A * 8/1994 Ono et al. ..................... 257/13
5,347,533 A * 9/1994 Higashi et al. ............... 372/96
5,393,994 A * 2/1995 Kobayashi et al. ........... 257/84
5,673,140 A * 9/1997 Fisher ........................ 359/332
6,300,650 B1 * 10/2001 Sato ........................... 257/184
6,327,554 B1 * 12/2001 Kobori .......................... 703/5
6,628,689 B2 * 9/2003 Okada et al. ................. 372/49
RE38,305 E * 11/2003 Gunjima et al. ............... 349/9
2002/0006143 A1 * 1/2002 Nakayama et al. ........... 372/45
2003/0031222 A1 * 2/2003 Balsamo et al. .............. 372/46

OTHER PUBLICATIONS

Ohtoshi, T. et al.; "High–power visible GaAlAs lasers with self–aligned strip buried heterostructure", *J. Appl. Phys.*, vol. 56, No. 9, pp. 2491–2496 (1984).

Shigihara, K et al.; "Antireflection coating for laser diodes", *Electronic Letters*, vol. 31, No. 18, pp. 1574–1575, (Aug. 31, 1995).

Hiroo Yonezu, Optical Communication Engineering (Light–emitting/Light receiving devices), Kougakutosho Co. edition, Feb. 15, 1984 (First edition).

* cited by examiner

*Primary Examiner*—Michael Trinh
*Assistant Examiner*—Ida M. Soward
(74) *Attorney, Agent, or Firm*—Leydig, Voit & Mayer, Ltd.

(57) ABSTRACT

An optical semiconductor device includes a semiconductor laser having an equivalent refractive index nc; and a low-reflective coating film disposed on one end face of the semiconductor laser. The low-reflective coating film includes a first-layer coating film having a refractive index n1 and a thickness d1; and a second-layer coating film having a refractive index n2 and a thickness d2. n0 and λ0 denote refractive index of free space on a surface of the second-layer coating film and the wavelength of laser light produced by the semiconductor laser. Both a real part and an imaginary part of amplitude reflectance, determined by the wavelength λ0, the refractive indexes n1 and n2, and the thicknesses d1 and d2, are zero and only one of refractive indexes n1 and n2 is smaller than the square root of a product of the refractive indexes nc and n0.

20 Claims, 33 Drawing Sheets

PRIOR ART

PRIOR ART

OPTICAL SEMICONDUCTOR DEVICE WITH LOW REFLECTANCE COATING

BACKGROUND OF THE INVENTION

1. Field of the Invention

The present invention relates to the field of optical semiconductor devices including a semiconductor laser device used as a light source for optical information processing, a signal source for optical communications, or an excitation light source for fiber amplifiers, semiconductor optical amplifiers (SOAs), superluminescent diodes (SLDs), and optical modulators. More particularly, the present invention relates to an optical semiconductor device having coating films provided on the end faces of its optical semiconductor element.

2. Description of the Related Art

Description will be made below of a semiconductor laser device, which is one of optical semiconductor devices.

FIG. 53 is a schematic diagram showing an output dependence of the wavelength of a conventional semiconductor laser.

The diagram is disclosed in an article entitled "High-power visible GaAlAs lasers with self-aligned strip buried heterostructure" by Ohtoshi et al., J. Appl. Phys., Vol. 56, No. 9, pp. 2491–2496, 1984.

The output dependence in FIG. 53 is exhibited by a semiconductor laser having an $SiO_2$ film and an $SiO_2$ film/amorphous silicon (hereinafter referred to as a-Si) multilayer film coated on its front and rear end faces, respectively. The reflectance of the front end face is 6%, while that of the rear end face is 94%.

As the optical output increases from 1 mW to 30 mW, the oscillation wavelength increases from 780 nm to 786 nm, showing a change of 6 nm, as shown in FIG. 53. On a per-milliwatt basis, the change is 0.21 nm/mA, which is 0.21 nm/mA assuming that the slope efficiency is 1 mW/mA.

This change in the wavelength is attributed to an increase in the temperature of the active layer due to increased injection current. The magnitude of such a change with the AlGaAs semiconductor laser is said to be approximately 0.2 to 0.3 nm/° C. on a per-temperature basis, while that for the InGaAsP semiconductor laser is said to be approximately 0.4 to 0.7 nm/° C. (see a book entitled "Optical Communications Device Engineering", second edition, by Hiroo Yonezu, Kougakutosho Ltd., pp. 244–255)

Thus, as shown in FIG. 53, even if the optical output is changed, the oscillation wavelength remains around 780 nm. That is, when the injection current (which corresponds to the optical output) is changed, the oscillation wavelength continuously changes by only approximately 0.21 nm/mA.

Furthermore, since the $SiO_2$ film provided on a front end face of the conventional semiconductor laser has a thickness of only λ/4 (λ denotes the wavelength), the reflectance of the end face is approximately 6%, which is much larger than a desired low reflectance of 1% or less.

Configurations of the nonreflective films of conventional semiconductor lasers are described in, for example, Japanese Patent No. 3014208 and IEE Electronics Lett. Vol. 31, No. 31, pp. 1574–1575.

Thus, the conventional semiconductor laser having the configuration described above can be provided with a low-reflective end face coating film having a reflectance of 6% at lowest.

The conventional semiconductor laser may be provided with a coating film having a total film thickness less than ¼ of a desired wavelength λ0 to set the width of the wavelength region of the film which is a neighborhood of the wavelength λ0 and whose reflectance is 1% or smaller to be wider than 100 nm. In such a configuration, however, since the total film thickness is thin, the heat dissipation is reduced, which may degrade the end faces.

Furthermore, if a coating film is formed such that no reflection occurs at a desired wavelength λ0 and the thickness of the coating film is thicker than ¼ of the wavelength λ0 to increase the heat dissipation, a problem arises that the reflectance dependence on the wavelength is steep.

FIG. 54 is a schematic diagram showing the configuration of a nonreflective film of a conventional semiconductor laser.

The configuration of the nonreflective film shown in FIG. 54 is disclosed in, for example, Japanese Patent No. 3014208 and IEE Electronics Lett. Vol. 31, No. 31, pp. 1574–1575.

In the figure, reference numeral 200 denotes a conventional semiconductor laser; 202 denotes a semiconductor laser element having an effective refractive index of np; and 204 denotes a first layer film with a refractive index of n01 and a film thickness of d01 formed on an end face of the semiconductor laser 202. Reference numeral 206 denotes a second layer film with a refractive index of n02 and a film thickness of d02 formed on a surface of the first layer film 204. Reference numeral 208 denotes a third layer film with a refractive index of n03 and a film thickness of d03 formed on a surface of the second layer film 206. Reference numeral n0 denotes the refractive index of the free space on a surface of the third layer film 208.

FIG. 55 includes graphs each showing the wavelength dependence of the reflectance of a conventional nonreflective film.

In the figure, curves a and b each indicate the wavelength dependence of the reflectance of a nonreflective film near the wavelength λ0 (=1.3 μm) when the effective refractive index (denoted by nc) of the semiconductor laser element 202 is 3.2.

Specifically, the curve a indicates a reflectance obtained when: the first layer film 204 and the third layer film 208 are each formed of $Al_2O_3$ having a refractive index (denoted by n01 or n03, respectively) of 1.6; the second layer film 206 is formed of amorphous silicon (a-Si) having a refractive index (denoted by n02) of 3.2; and the film thicknesses d01, d02, and d03 of the above first to third layer films are 90.23 nm, 8.25 nm, and 90.23 nm, respectively.

The curve b indicates a reflectance obtained when: the first layer film 204 and the third layer film 208 are each formed of $Al_2O_3$ having a refractive index (denoted by n01 or n03, respectively) of 1.6; the second layer film 206 is formed of amorphous silicon (a-Si) having a refractive index (denoted by n02) of 3.2; and the film thicknesses d01, d02, and d03 of the above first to third layer films are 90.23 nm, 199.43 nm, and 90.23 nm, respectively.

If the effective refractive index nc of the semiconductor laser 202 is 3.2, $nf=(nc*n0)^{1/2}=1.78885$. Assuming that the wavelength λ0=1.3 μm, λ0/4 is approximately 325 nm.

In the example indicated by the curve a, the total film thickness (n01*d01+n02*d02+n03*d03) of the three layer films is 314.5 nm, which is approximately equal to λ0/4. The low-reflective region whose reflectance is 1% or smaller has a width of 265 nm, which is wide. However, in this case, since it is not always possible to obtain sufficient film thickness, the heat dissipation may be reduced, which might degrade the end faces of the semiconductor laser element 202.

In the example indicated by the curve b, on the other hand, the total film thickness is as thick as approximately 927 nm, increasing the heat conductivity. However, the low-reflective region whose reflectance is 1% or smaller has a width of only 55 nm, which is extremely narrow.

On the other hand, to realize the characteristics of an ideal single layer film, conventional methods use a two-layer film or a three-layer film to form a nonreflective film and increase the film thickness.

For example, Japanese Patent No. 3014208 discloses a nonreflective coating film made of a three-layer film in which the total film thickness (n01*d01+n02*d02+n03*d03) is set at an integer multiple of ¼ of a desired wavelength λ0, where n01, n02, and n03 denote the refractive indexes of the coating films (constituting the three-layer film) whereas d01, d02, and d03 denote their thickness. This configuration makes the characteristic matrix of the three-layer film equal to that of an ideal single-layer film.

In another method which uses a two-layer film, the film thickness (n01*d01) of the first layer and the film thickness (n02*d02) of the second layer are each made equal to ¼ of a desired wavelength λ0, and they are laminated one on the other.

However, the degree of freedom for selecting materials is reduced in the above methods in which the total film thickness (n01*d01+n02*d02+n03*d03) is set at an integer multiple of ¼ of a desired wavelength λ0, or the film thickness (n01*d01) of the first layer and the film thickness (n02*d02) of the second layer are each made equal to ¼ of a desired wavelength λ0, making it difficult to design the device.

It should be noted that Japanese Patent Laid-Open Publication No. Hei 3(1991)-293791 discloses a technique for a semiconductor laser device in which dielectric thin films formed in two or more layers are used as a non-reflective coating film on an end face, wherein the first layer provides a passivation function and the second and subsequent layers are made of a λ/4 non-reflective coating film.

SUMMARY OF THE INVENTION

The present invention has been devised to solve the above problems. Therefore, an object of the present invention is to provide an optical semiconductor device having a low-reflective coating film which provides a high degree of freedom for designing the optical semiconductor device at the wavelength of the light propagating through the optical semiconductor element.

According to one aspect of the present invention, there is provided an optical semiconductor device comprising: an optical semiconductor element having an equivalent refractive index of nc and provided with an end face for receiving or emitting light; and a coating film layer structure which includes a first coating film disposed on the end face of the optical semiconductor element and having a refractive index of n1 and a film thickness of a0*d1 where a0 is a positive real number and a second coating film disposed on the first coating film and having a refractive index of n2 and a film thickness of a0*d2, wherein when n0 and λ0 denote a refractive index of a free space on a surface of the coating film layer structure and a wavelength of light propagating through the optical semiconductor element, respectively, both a real part and an imaginary part of an amplitude reflectance, which is decided by the wavelength λ0, the refractive indexes n1 and n2, and the film thickness a0*d1 and a0*d2, are zero, and only one of said refractive indexes n1 and n2 is smaller than a square root of a product of the refractive indexes nc and n0.

Accordingly, it is possible to employ a low-reflective coating film layer other than a simple replacement of an ideal single-layer film to realize its characteristics for the specific wavelength and thereby enhance the degree of freedom for selecting materials of the low-reflective coating film layer, making it easy to provide an optical semiconductor device having a desired low-reflective coating film layer.

The another object is to provide an optical semiconductor device which has a coating film with a total film thickness more than ¼ of a desired wavelength λ0 and whose wavelength is stable.

In another aspect of the present invention, there is provided an optical semiconductor device comprising: a semiconductor laser, and a low-reflective coating film structure on an end face of said semiconductor laser, wherein a reflectance of the low-reflective coating film structure has a minimum value at a given wavelength λ0, wherein a sum of a product of a refractive index and a film thickness of the low-reflective coating film structure is larger than ¼ of a given laser light wavelength λ0 of the semiconductor laser, and wherein the coating film layer structure has a reflectance which is 1% or smaller at a wavelength region whose width is of 55 nm or wider at neighborhood of wavelength λ0 of the semiconductor laser.

Accordingly, it is possible to provide an optical semiconductor device with a semiconductor laser configured such that its heat dissipation is increased and its oscillation wavelength changes only a little with changing ambient temperature or changing injection current, making it easy to provide an optical semiconductor device with a semiconductor laser whose oscillation wavelength is stable.

A further object is to provide an optical semiconductor device whose wavelength exhibits a small change with temperature.

In further aspect of the present invention, there is provided an optical semiconductor device comprising a semiconductor laser, wherein a reflectance of one end face of a resonator of the semiconductor laser has a minimum value at a given wavelength λ0, and wherein a total loss of the semiconductor laser becomes equal to a gain of the semiconductor laser at a wavelength in a region in which the reflectance decreases with increasing wavelength.

Accordingly, it is possible to configure a semiconductor laser such that its oscillation wavelength changes only a little with changing ambient temperature or changing injection current, making it easy to provide a semiconductor laser whose oscillation wavelength is stable.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

In the following descriptions of preferred embodiments of the present invention, semiconductor laser devices employing a semiconductor laser element, which is an optical semiconductor element, are explained as representative optical semiconductor devices.

First Embodiment

Figure 1:
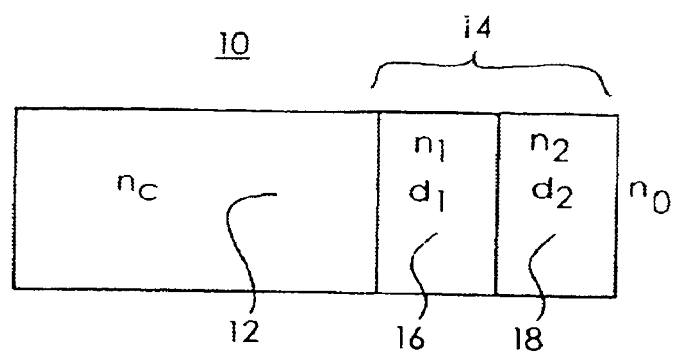
FIG. 1 is a schematic diagram showing a semiconductor laser according to an embodiment of the present invention. Brief Description of the Drawings

FIG. 1 is a schematic diagram showing a semiconductor laser according to an embodiment of the present invention.

In the figure, reference numeral 10 denotes a semiconductor laser device of the present embodiment; 12 a semiconductor laser element, which is an optical semiconductor element, having an equivalent refractive index of nc; 14 a low-reflective coating film disposed on a surface of the semiconductor laser element 12 as a coating film layer structure, wherein one interface surface of the low-reflective coating film 14 is in close contact with, for example, the front end face of the semiconductor laser element 12 whereas the other interface surface is in contact with a free space whose refractive index n0 is equal to 1, such as an air layer, a nitrogen layer, or a vacuum layer.

Reference numeral 16 denotes a first-layer coating film constituting the low-reflective coating film 14 as a first coating film, which is made of a material having a refractive index of n1 and has a film thickness of d1. The film thickness is expressed as a0*d1 in a generalized form. However, this embodiment assumes that a0=1.

Reference numeral 18 denotes a second-layer coating film constituting the low-reflective coating film 14 as a second coating film. According to the present embodiment, one interface surface of the second-layer coating film is in close contact with the first-layer coating film 16 whereas the other interface surface is in contact with the free space. The second-layer coating film 18 has a film thickness of d2 and is made of a material having a refractive index of n2. The film thickness is expressed as a0*d2 in a generalized form. However, this embodiment assumes that a0=1.

The low-reflective coating film 14 will be described below.

Let λ denote a desired wavelength included in light emitted from the semiconductor laser, and φ1 and φ2 denote phase changes in the first-layer coating film 16 and the second-layer coating film 18, respectively. The phase changes φ1 and φ2 are expressed by the following equations.

$$\phi 1=(2\pi * n1 * d1)/\lambda \quad (1)$$

$$\phi 2=(2\pi * n2 * d2)/\lambda \quad (2)$$

At that time, the amplitude reflectance r is expressed by the following equation.

$$r=(A-iB)/(C-iD) \quad (3)$$

where $$A=(nc-1)\cos\phi 1\cos\phi 2+((n1/n2)-(n2*nc)/n1)\sin\phi 1\sin\phi 2 \quad (4)$$

$$B=((nc/n2)-n2)\cos\phi 1\sin\phi 2+((nc/n1)-n1)\sin\phi 1\cos\phi 2 \quad (5)$$

$$C=(nc+1)\cos\phi 1\cos\phi 2-((n1/n2)+(n2*nc)/n1)\sin\phi 1\sin\phi 2 \quad (6)$$

$$D=((nc/n2)+n2)\cos\phi 1\sin\phi 2+((nc/n1)+n1)\sin\phi 1\cos\phi 2 \quad (7)$$

The symbol "i" indicates the imaginary unit.

The power reflectance R is expressed as $|r|^2$.

The power reflectance R is reduced to zero when the following equations (8) and (9) are satisfied.

$$nc-1+((n1/n2)-(n2*nc)/n1)\tan\phi 1\tan\phi 2=0 \quad (8)$$

$$((nc/n1)-n1)\tan\phi 1+((nc/n2)-n2)\tan\phi 2=0 \quad (9)$$

Furthermore, one of n1 and n2 should be smaller than $(nc*n0)^{1/2}$ and the other should be larger than $(nc*n0)^{1/2}$. Since n0=1 in this case, $(nc)^{1/2}$ must exist between n1 and n2.

EXAMPLE 1

Assume the following: the equivalent refractive index of the semiconductor laser nc=3.37; the first-layer coating film 16 is formed of $Ta_2O_5$ and therefore its refractive index n1=2.057; the second-layer coating film 18 is formed of $Al_2O_3$ and therefore its refractive index n2=1.62; and the wavelength of the laser light λ0=980 nm. Further assume that the film thickness d1 of the first-layer coating film 16 is set at 71.34 nm. In such a case, no reflection occurs when the film thickness d2 of the second-layer coating film 18 is set at 86.20 nm. Naturally, no reflection occurs not only with the above film thickness combination but also when φ1 and φ2 are each an integer multiple of 2π. These relations also hold in the following embodiments.

In the above nonreflective film-configuration, the total film thickness (n1*d1+n2*d2) is not an integer multiple of λ0/4, which means that its characteristic matrix is not equal to that of a ideal single-layer film. Therefore, d1 and d2 of the coating films can be adjusted after selecting their n1 and n2, making it easy to select the materials of the coating films, resulting in an increased degree of freedom for designing a low-reflective film, making it easy to provide an optical semiconductor device having a desired low-reflective coating film layer.

It should be noted that the total film thickness of a coating film is the sum of the product of the film thickness and the refractive index of each layer constituting the coating film.

Second Embodiment

Figure 2:
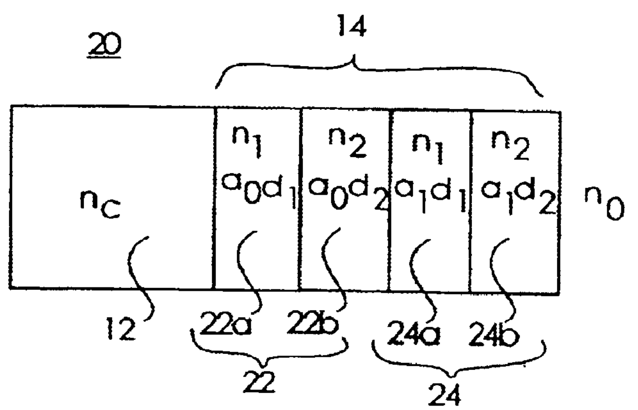
FIG. 2 is a schematic diagram showing a semiconductor laser device according to an embodiment of the present invention.

FIG. 2 is a schematic diagram showing a semiconductor laser device according to an embodiment of the present invention.

In FIG. 2 (and the subsequent figures in this specification), the components which are the same or corresponding to those in FIG. 1 are denoted by like numerals.

In a semiconductor laser device of the present embodiment, two coating film pairs are formed. The base coating film pair is formed of a coating film with a film thickness of a0*d1 made of a material having a refractive index of n1 and a coating film with a film thickness of a0*d2 made of a material having a refractive index of n2. The first coating film pair (the other one), on the other hand, is formed of a coating film with a film thickness of a1*d1 made of a material having a refractive index of n1 and a coating film with a film thickness of a1*d2 made of a material having a refractive index of n2. The first coating film pair is laminated on the base coating film pair to form the low-reflective coating film 14 in a two-coating-film-pair structure.

Specifically, referring to FIG. 2, reference numeral 20 denotes a semiconductor laser device; 22*a* denotes a first-layer coating film with a film thickness of a0*n1 made of a material having a refractive index of n1; and 22*b* denotes a second-layer coating film with a film thickness of a0*d2 made of a material having a refractive index of n2. The first-layer coating film 22*a* and the second-layer coating film 22*b* form a base coating film pair 22.

Reference numeral 24 denotes a first coating film pair; and 24*a* denotes a third-layer coating film, as a third coating film, with a film thickness of a1*d1 made of a material having a refractive index of n1. Reference numeral 24*b* denotes a fourth-layer coating film, as a fourth coating film, with a film thickness of a1*d2 made of a material having a refractive index of n2.

The low-reflective coating film 14 is made up of the base coating film pair 22 and the first coating film pair 24 formed on the base coating film pair 22.

The symbols "a0" and "a1" indicate parameters whose values are positive real numbers.

The nonreflective conditions are derived as in the first embodiment. Specifically, the film thicknesses d1 and d2 are set such that the end face on which the low-reflective coating film 14 of the second embodiment is disposed has an amplitude reflectance r whose real part and imaginary part are equal to 0.

That is, the film thicknesses d1 and d2 are set such that the real part and the imaginary part of the amplitude reflectance r expressed by the formula (10) are equal to 0.

$$r=((m11+m12)nc-(m21+m22))/((m11+m12)nc+(m21+m22)) \quad (10)$$

where $$\begin{bmatrix} m_{11} & m_{12} \\ m_{21} & m_{22} \end{bmatrix} = \begin{bmatrix} \cos a_0\phi_1 & -\frac{i}{n_1}\sin a_0\phi_1 \\ -in_1\sin a_0\phi_1 & \cos a_0\phi_1 \end{bmatrix} \begin{bmatrix} \cos a_0\phi_2 & -\frac{i}{n_2}\sin a_0\phi_2 \\ -in_2\sin a_0\phi_2 & \cos a_0\phi_2 \end{bmatrix} \times \begin{bmatrix} \cos a_1\phi_1 & -\frac{i}{n_1}\sin a_1\phi_1 \\ -in_1\sin a_1\phi_1 & \cos a_1\phi_1 \end{bmatrix} \begin{bmatrix} \cos a_1\phi_2 & -\frac{i}{n_2}\sin a_1\phi_2 \\ -in_2\sin a_1\phi_2 & \cos a_1\phi_2 \end{bmatrix} \quad (11)$$

Furthermore, as in the first embodiment, n1 and n2 are set such that one of n1 and n2 is smaller than $(nc*n0)^{1/2}$ and the other is larger than $(nc*n0)^{1/2}$. Since n0=1, the setting is made so that $(nc)^{1/2}$ exists between n1 and n2.

EXAMPLE 2

Assume the following: the equivalent refractive index of the semiconductor laser nc=3.37; the first-layer coating film 22*a* and the third-layer coating film 24*a* are formed of $Al_2O_3$ and therefore their refractive index n1=1.62; the second-layer coating film 22*b* and the fourth-layer coating film 24*b* are formed of $Ta_2O_5$ and therefore their refractive index n2=2.057; and the wavelength of the laser light λ0=980 nm. Further assume that a0=1.2 and a1=0.8. In such a case, no reflection occurs when d1=319.91 nm and d2=33.40 nm.

Figure 3:
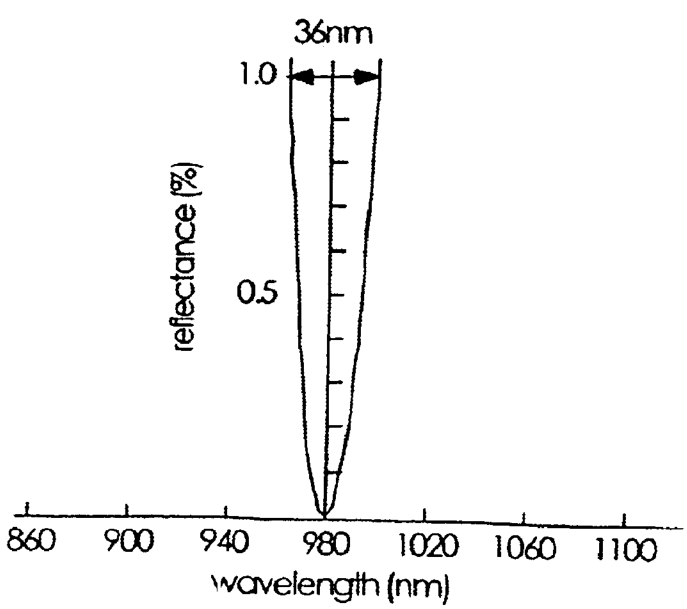
FIG. 3 is a graph showing the reflectance calculation result of Example 2, which is an embodiment of the present invention.

FIG. 3 is a graph showing the reflectance calculation result of Example 2, which is an embodiment of the present invention.

As shown in FIG. 3, the wavelength region which is a neighborhood of the wavelength λ0 (=980 nm) and whose reflectance is 1% or smaller has a width of 36 nm.

Description will be made below of an arrangement in which two coating film pairs are further laminated on a base coating film pair disposed on an end face of a semiconductor laser device, providing a low-reflective coating film in a three-coating-film-pair structure.

Figure 4:
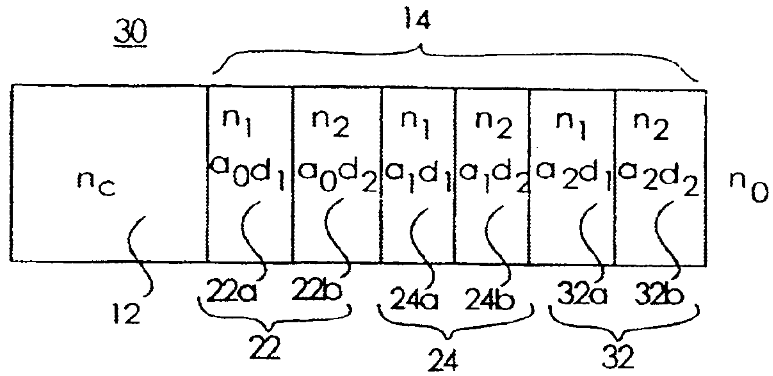
FIG. 4 is a schematic diagram showing a semiconductor laser device according to an embodiment of the present invention.

FIG. 4 is a schematic diagram showing a semiconductor laser device according to an embodiment of the present invention.

In the semiconductor laser device of the present embodiment, a first coating film pair is formed on a base coating film pair, and then a second coating film pair is formed on the first coating film pair, producing the low-reflection coating film 14 in a three-coating-film-pair structure. The base coating film pair is formed of a coating film with a film thickness of a0*d1 made of a material having a refractive index of n1 and a coating film with a film thickness of a0*d2 made of a material having a refractive index of n2; the first coating film pair is formed of a coating film with a film thickness of a1*d1 made of a material having a refractive index of n1 and a coating film with a film thickness of a1*d2 made of a material having a refractive index of n2; and the second coating film pair is formed of a coating film with a film thickness of a2*d1 made of a material having a refractive index of n1 and a coating film with a film thickness of a2*d2 made of a material having a refractive index of n2.

Referring to FIG. 4, reference numeral 30 denotes a semiconductor laser device; 32 denotes a second coating film pair formed on a first coating film pair 24; and 32*a* denotes a fifth-layer coating film, as a third coating film, with a film thickness of a2*d1 made of a material having a refractive index of n1. Reference numeral 32*b* denotes a sixth-layer coating film, as a fourth coating film, with a film thickness of a2*d2 made of a material having a refractive index of n2.

The second coating film pair 32 is made up of the fifth-layer coating film 32*a* and the sixth-layer coating film 32*b*. One interface surface of the sixth-layer coating film 32*b* is in close contact with the fifth-layer coating film 32*a* and the other interface surface is in contact with a free space whose refractive index n0 is equal to 1 in the present embodiment. The symbol "a2" indicates a parameter whose value is a positive real number.

The nonreflective conditions are derived as in the first embodiment. Specifically, the film thicknesses d1 and d2 are set such that the end face on which the low-reflection coating film 14 is disposed has an amplitude reflectance r whose real part and imaginary part are equal to 0.

Furthermore, n1 and n2 are set such that one of n1 and n2 is smaller than $(nc*n0)^{1/2}$ and the other is larger than $(nc*n0)^{1/2}$. Since n0=1, the setting is made so that $(nc)^{1/2}$ exists between n1 and n2.

EXAMPLE 3

Assume the following: the equivalent refractive index of the semiconductor laser nc=3.37; the first-layer coating film 22*a*, the third-layer coating film 24*a*, and the fifth-layer coating film 32*a* are formed of $Al_2O_3$ and therefore their refractive index n1=1.62; the second-layer coating film 22*b*, the fourth-layer coating film 24*b*, and the sixth-layer coating film 32*b* are formed of $Ta_2O_5$ and therefore their refractive index n2=2.057; and the wavelength of the laser light λ0=980 nm. Further assume that a0=1.2, a1=1.0, and a2=0.8. In such a case, no reflection occurs when d1=251.65 nm and d2=303.73 nm.

At that time, the wavelength region which is a neighborhood of the wavelength λ0 (=980 nm) and whose reflectance is 1% or smaller has a width of 20 nm, which is narrower than the width of the wavelength region whose reflectance is 1% or smaller for the low-reflective coating film 14 formed of a four-layer coating film.

Description swill be made below of another example in which a low-reflective coating film 14 having a three-coating-film-pair structure is employed.

EXAMPLE 4

Assume the following: the equivalent refractive index of the semiconductor laser nc=3.37; the first-layer coating film 22*a*, the third-layer coating film 24*a*, and the fifth-layer coating film 32*a* are formed of $Al_2O_3$ and therefore their refractive index n1=1.62; the second-layer coating film 22*b*, the fourth-layer coating film 24*b*, and the sixth-layer coating film 32*b* are formed of $Ta_2O_5$ and therefore their refractive index n2=2.057; and the wavelength of the laser light λ0=980 nm. Further assume that a0=1.2, a1=1.0, and a2=0.8. In such a case, no reflection also occurs when d1=64.86 nm and d2=61.60 nm.

At that time, the wavelength region which is a neighborhood of the wavelength λ0 (=980 nm) and whose reflectance is 1% or smaller has a width of 61 nm, which is wider than the width (20 nm) obtained in Example 3.

The calculation conditions for Example 4 are different from those for Example 3 in that Example 4 uses different parameter values for setting the phases φ1 and φ2.

It should be noted that the total film thickness of Example 4 (including the film thicknesses of the first-layer coating film 22*a* to the sixth-layer coating film 32*b*), that is, the sum of the product of the refractive index of each layer coating film and its film thickness is 695.35 nm, which is larger than λ0/4 (245 nm).

Description will be made below of the semiconductor laser device of Example 5 in which a surface layer coating film, as a fifth coating film, with a film thickness of b1*d1 (the parameter b1 is a positive real number) made of a material having a refractive index of n1 is added to the low-reflective coating film 14 having a three-coating-film-pair structure in Example 4 which employs three coating film pairs each formed of coating films configured by using either the refractive index n1 and the film thickness d1 or the refractive index n2 and the film thickness d2 and further using one of the parameters a0, a1, and a2.

With this arrangement, it is possible to enhance the degree of freedom for setting the wavelength dependence of the reflectance of an end face on which a coating film layer is disposed, making it easy to provide an optical semiconductor device having a low-reflective coating film layer whose reflectance has a desired wavelength dependence selected from various types of wavelength dependence.

EXAMPLE 5

Figure 5:
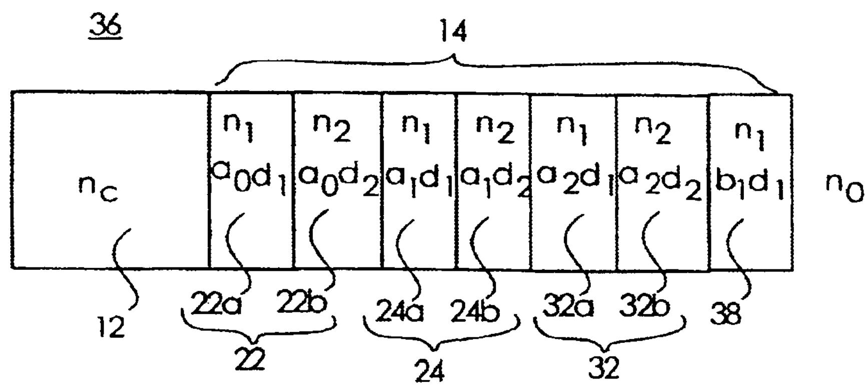
FIG. 5 is a schematic diagram showing a semiconductor laser device according to an embodiment of the present invention.

FIG. 5 is a schematic diagram showing a semiconductor laser device according to an embodiment of the present invention.

Referring to FIG. 5, reference numeral 36 denotes a semiconductor laser device and 38 denotes a surface layer coating film with a film thickness of b1*d1 made of a material having a refractive index of n1.

Assume the following: the equivalent refractive index of the semiconductor laser nc=3.37; the first-layer coating film 22*a*, the third-layer coating film 24*a*, the fifth-layer coating film 32*a*, and the surface layer coating film 38 are formed of $Al_2O_3$ and therefore their refractive index n1=1.62; the second-layer coating film 22*b*, the fourth-layer coating film 24*b*, and the sixth-layer coating film 32*b* are formed of $Ta_2O_5$ and therefore their refractive index n2=2.057; and the wavelength of the laser light λ0=980 nm. Further assume that a0=1.0, a1=0.5, a2=1.5, and b1=3.5. In such a case, no reflection occurs when d1=32.07 nm and d2=70.75 nm.

Figure 6:
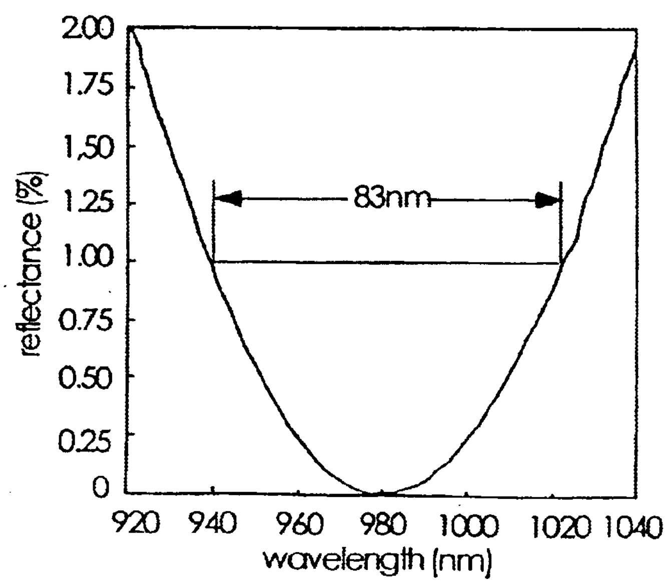
FIG. 6 is a graph showing the reflectance calculation result of Example 5, which is an embodiment of the present invention.

FIG. 6 is a graph showing the reflectance calculation result of Example 5, which is an embodiment of the present invention.

In Example 5, as shown in FIG. 6, the wavelength region which is a neighborhood of the wavelength λ0 (=980 nm) and whose reflectance is 1% or smaller has a width of 83 nm, which is much wider than the widths obtained in the above examples.

At that time, the total film thickness (including the film thicknesses of the first-layer coating film 22*a* to the surface layer coating film 38), that is, the sum (a0*n1*d1+a0*n2*d2+a1*n1*d1+a1*n2*d2+a2*n1*d1+a2*n2*d2+b1*n1*d1) is 774.36 nm, which is larger than λ0/4.

EXAMPLE 6

Description will be made of another example which uses the low-reflective coating film 14 having the three-coating-film-pair structure shown in FIG. 4.

Assume the following: the equivalent refractive index of the semiconductor laser nc=3.37; the first-layer coating film 22*a*, the third-layer coating film 24*a*, and the fifth-layer coating film 32*a* are formed of a-Si and therefore their refractive index n1=2.60; the second-layer coating film 22*b*, the fourth-layer coating film 24*b*, and the sixth-layer coating film 32*b* are formed of $Al_2O_3$ and therefore their refractive index n2=1.65; and the wavelength of the laser light λ0=980 nm. Further assume that a0=1.0, a1=2.0, and a2=4.0. In such a case, no reflection occurs when d1=29.50 nm and d2=37.89 nm.

Figure 7:
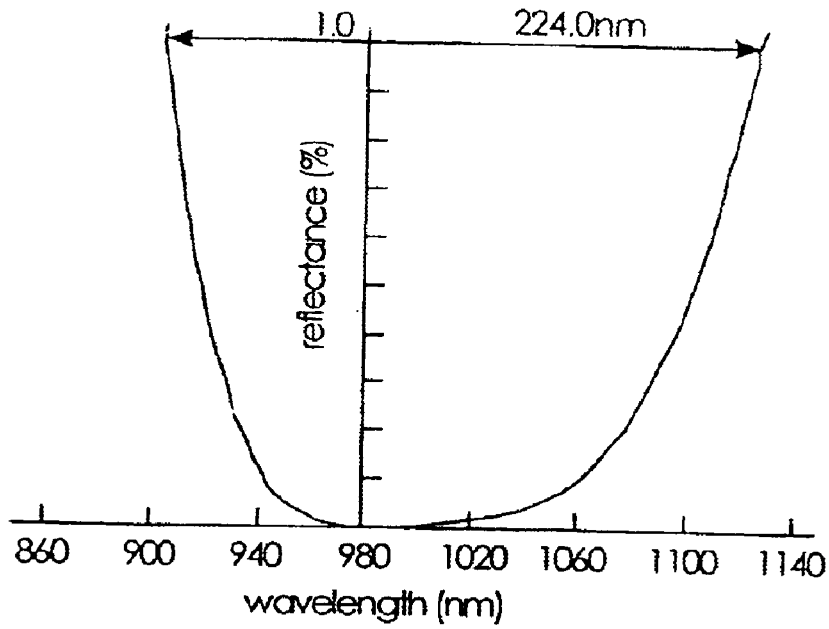
FIG. 7 is a graph showing the reflectance calculation result of Example 6, which is an embodiment of the present invention.

FIG. 7 is a graph showing the reflectance calculation result of Example 6, which is an embodiment of the present invention.

In Example 6, as shown in FIG. 7, the wavelength region which is a neighborhood of the wavelength λ0 (=980 nm) and whose reflectance is 1% or smaller has a width of 224.0 nm, which is much wider than the widths obtained in the above examples.

It should be noted that the above example assumes that the refractive index of a-Si is 2.60. This assumption was made considering the fact that it is easy to produce a-Si having a refractive index of 3.0 or less by preparing some film formation conditions such as introduction of oxygen.

Similarly, the refractive index of $Al_2O_3$ is assumed to be 1.65 in the above calculation in Example 6.

The semiconductor laser devices according to the present embodiment described above employ one of the following three configurations for the low-reflective coating film 14. The first configuration having a two-coating-film-pair structure employs two coating film pairs each formed of coating films configured by using either the material refractive index n1 and the film thickness d1 or the material refractive index n2 and the film thickness d2 and further using one of the parameters a0, and a1 for changing the thicknesses. The second configuration having a three-coating-film-pair structure employs three coating film pairs each formed as in the first configuration and further using a parameters a2. In the third configuration, a coating film with a film thickness of d1 made of a material having a refractive index of n1 and further using a parameters b1 is added to the second configuration (the three-coating-film-pair structure). However, the present invention is not limited to these specific structures (the two-coating-film-pair structure and the three-coating-film-pair structure). The present invention can be applied to a low-reflective coating film having a multi-coating-film-pair structure employing more than three coating film pairs.

In the above nonreflective film-configurations, the total film thickness (a0*n1*d1+a0*n2*d2+a1*n1*d1+a1*n2*d2+ . . . +ak*n1*d1+ak*n2*d2+ . . . ) or (a0*n1*d1+a0*n2*d2+a1*n1*d1+a1*n2*d2+ . . . +ak*n1*d1+ak*n2*d2+b1*n1*d1) is not an integer multiple of λ0/4, which means that the characteristic matrix of the film is not equal to that of an ideal single-layer film, as in the first embodiment. Therefore, d1 and d2 of the coating films can be adjusted after selecting their n1 and n2, making it easy to select the materials of the coating films, resulting in an increased degree of freedom for designing the low-reflective film.

Furthermore, according to the present embodiment, the parameters $a_k$, where k=1, 2, 3, . . . , and so on, (for example, a0, a1, a2, and b1 in the embodiment) can be set to various values, providing a comparatively high degree of freedom for selecting a wavelength dependence of the reflectance by, for example, changing the width of the wavelength region which is a neighborhood of a desired wavelength λ0 (included in a given laser light) and whose reflectance is 1% or smaller. With this arrangement, it is possible to set various laser output characteristics and thereby easily configure a semiconductor laser device in various ways, making it easy to provide an optical semiconductor device having a low-reflective coating film layer whose reflectance has a desired wavelength dependence.

Third Embodiment

Figure 8:
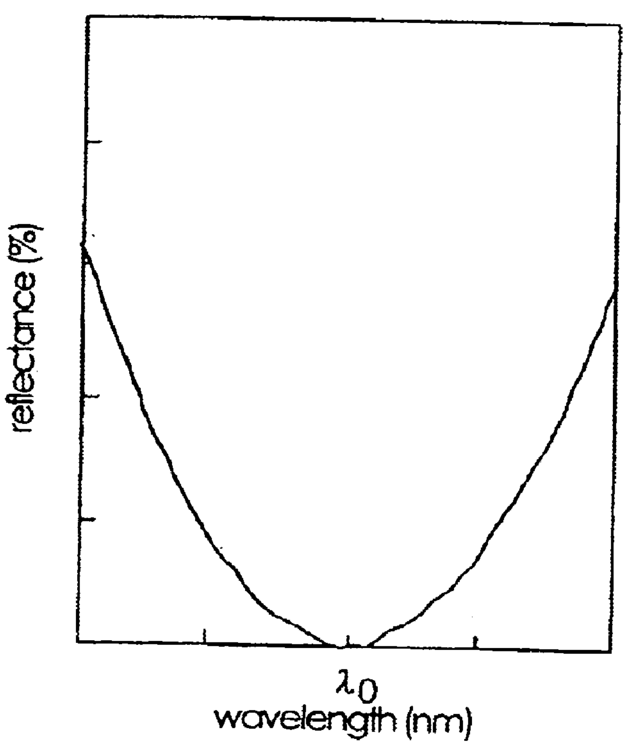
FIG. 8 is a graph showing the wavelength dependence of the reflectance of a low-reflective coating film of a semiconductor laser device according to the present invention.

FIG. 8 is a graph showing the wavelength dependence of the reflectance of a low-reflective coating film of a semiconductor laser device according to the present invention.

Referring to FIG. 8, this semiconductor laser device is configured such that at a desired wavelength λ0, no reflection occurs or the reflectance is minimized, and the reflectance is higher at the other wavelengths. It is possible to easily configure a nonreflective film or a low-reflective film so that its reflectance has a wavelength dependence as described above by adopting one of the configurations of the low-reflective coating films employed by the first and second embodiments.

The total loss αt of a semiconductor laser is expressed by the following formula (12) using the internal loss αin, the length L of the resonator, the reflectance Rf of the laser-light-emitting front end face, and the reflectance Rr of the rear end face.

$$\alpha t=\alpha in+(1/(2L))\ln(1/(Rf*Rr)) \quad (12)$$

Figure 9:
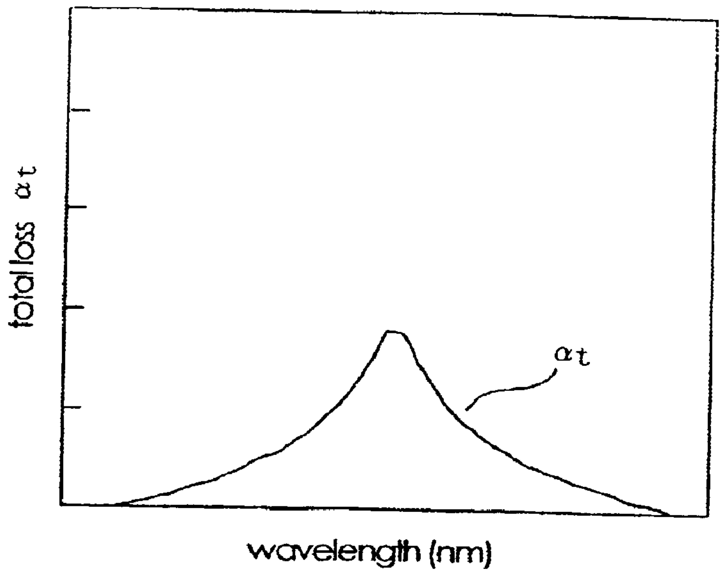
FIG. 9 is a graph showing the wavelength dependence of the total loss $\alpha t$ of a semiconductor laser device according to the present invention.

FIG. 9 is a graph showing the wavelength dependence of the total loss αt of a semiconductor laser device according to the present invention.

When the front end face reflectance Rf is minimized at a desired wavelength λ0, the total loss has a wavelength dependence in which the total loss is maximized at the wavelength λ0, as shown in FIG. 9.

Figure 10:
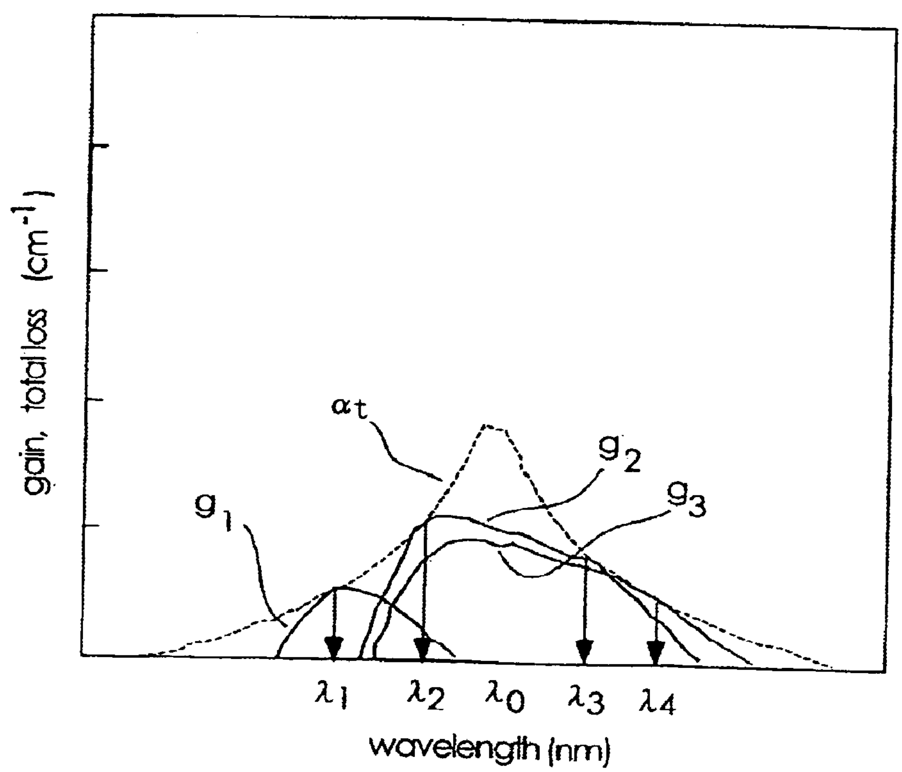
FIG. 10 is a graph showing the wavelength dependence of the total loss $\alpha t$ and the gain g of a semiconductor laser device according to the present invention.

FIG. 10 is a graph showing the wavelength dependence of the total loss αt and the gain g of a semiconductor laser device according to the present invention.

In the figure, the solid curves indicate the gains g1, g2, and g3, while the broken curve indicates the total loss αt. The curve g1 indicates a gain obtained when the injection current is small or the temperature is low; and the curve g3 indicates a gain obtained when the injection current is large or the temperature is high. The curve g2 indicates a gain obtained under intermediate conditions between those for the curves g1 and g3.

The gain indicated by the curve g1 becomes equal to the total loss at λ1, while the gain indicated by the curve g3 becomes equal to the total loss at λ4. A laser oscillation occurs at each wavelength.

The gain indicated by the curve g2 becomes equal to the total loss at the two wavelengths λ2 and λ3 each on the respective side of the wavelength λ0, and a laser oscillation can occur at λ2 and λ3.

Specifically, when a rise in the temperature of the semiconductor laser device caused by heat generation is small due to a reduced injection current or a low ambient temperature, the gain is low as indicated by the curve g1. In this case, the gain becomes equal to the loss only at a wavelength shorter than the wavelength λ0 (on the shorter-wavelength side of the wavelength λ0), thereby causing the semiconductor laser to oscillate at this wavelength.

When the rise in the temperature of the semiconductor laser device is increased since the ambient temperature is higher than that for the curve g1 or the injection current is increased, the gain is high as indicated by the curve g2. In this case, the gain becomes equal to the loss on both sides (the shorter-wavelength side and the longer-wavelength side) of the wavelength λ0, thereby causing the semiconductor laser to oscillate at the wavelengths indicated by λ2 and λ3 in the figure.

When the rise in the temperature of the semiconductor laser device is further increased since the ambient temperature or the injection current is further increased, the gain becomes equal to the loss at a wavelength only on the longer-wavelength side of the wavelength λ0 as indicated by the curve g3, thereby causing the semiconductor laser to oscillate at the wavelength indicated by λ4 in the figure.

Thus, a semiconductor laser can be provided with a nonreflective film on its end face, which film is configured such that the reflectance is minimized at a desired wavelength λ0, and the gain is equal to the loss on both sides (the shorter-wavelength side and the longer-wavelength side) of the wavelength λ0. With this arrangement, it is possible to provide a semiconductor laser device which oscillates at two wavelengths.

EXAMPLE 7

Figure 11:
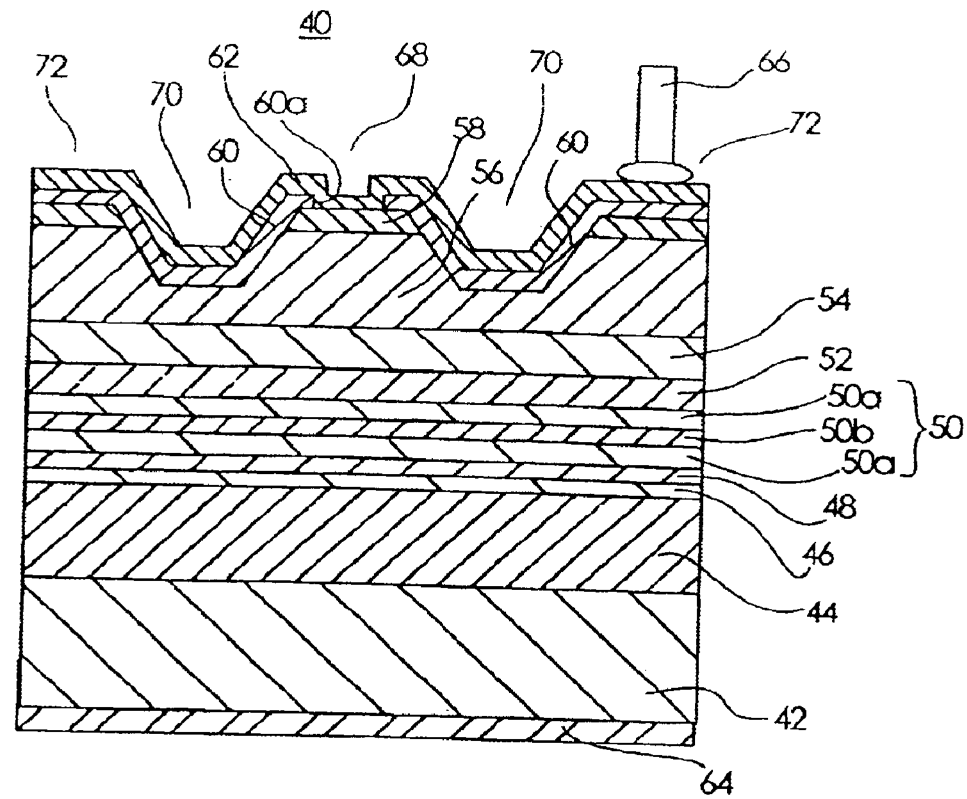
FIG. 11 is a cross-sectional view of a semiconductor laser according to an embodiment of the present invention.

FIG. 11 is a cross-sectional view of a semiconductor laser according to an embodiment of the present invention.

In the figure, reference numeral 40 denotes a semiconductor laser; 42 an n type GaAs substrate ("n type" and "p type" are hereinafter expressed as "n–" and "p–", respectively) of the semiconductor laser 40; 44 an n-AlGaAs cladding layer disposed on the n-GaAs substrate 42; 46 an undoped n-side AlGaAs guide layer disposed on the n-AlGaAs cladding layer; 48 an undoped n-side GaAs guide layer disposed on the n-side AlGaAs guide layer 46; and 50 an active layer having a quantum well structure and disposed on the n-side GaAs guide layer 48, the active layer 50 including undoped InGaAs quantum well layers 50*a* and an undoped GaAs barrier layer 50*b*.

Reference numeral 52 denotes an undoped p-side GaAs guide layer disposed on the active layer 50; 54 an undoped p-side AlGaAs guide layer disposed on the p-side GaAs guide layer 52; 56 a p-AlGaAs cladding layer disposed on the p-side AlGaAs guide layer 54; and 58 a p-GaAs capping layer disposed on the p-AlGaAs cladding layer 56. The p-side AlGaAs guide layer 54 and the p-GaAs capping layer 58 form a ridge-type optical waveguide, and both end faces of the waveguide form a resonator. The resonator in this example is 1500 μm long, and its oscillation wavelength is 980 nm.

Reference numeral 60 denotes an $Si_3N_4$ insulation film, in which an opening portion 60*a* is formed to provide a current path to the p-GaAs capping layer 58. Reference numeral 62 denotes a p-side electrode disposed on the $Si_3N_4$ insulation film 60. The p-side electrode 62 is in contact with the p-GaAS capping layer 58 through the opening portion 60*a*. Reference numeral 64 denotes an n-side electrode disposed on the rear surface of the n-GaAs substrate 42; 66 a gold wire; 68 a ridge region including the optical waveguide; 70 low-refractive-index regions disposed on both sides of the ridge region 68; and 72 high-refractive-index regions disposed outside the low-refractive-index regions 70 on both sides of the ridge region 68.

Since the low-refractive-index regions 70 are disposed outside the ridge region 68, it is possible to efficiently confine the laser light within the ridge region 68. Furthermore, the formation of the opening portion 60*a* in the $Si_3N_4$ insulation film 60 makes it possible to confine the current. The high-refractive-index regions 72 are disposed outside the low-refraction-index regions 70, and the gold wire 66 is wire-bonded onto one high-refractive-index region 72.

Then, a low-reflective coating film (not shown) is disposed on the front end face of the optical waveguide.

The low-reflective coating film is configured in the same way as the low-reflective coating film 14 of the first embodiment as follows. The equivalent refractive index of the semiconductor laser nc=3.37; the first-layer coating film 16 is formed of $Al_2O_3$ so that it has a refractive index n1 of 1.62 and a film thickness of 240 nm; and the second-layer coating film 18 is formed of $Ta_2O_5$ so that it has a reflection index n2 of 2.057 and a film thickness of 183 nm. The reflectance Rr of the rear end face is 98%.

It should be noted that even though the semiconductor laser 40 shown in FIG. 11 is a 980-nm semiconductor laser for exciting a fiber amplifier, the present invention is not limited to this specific type of semiconductor laser.

Figure 12:
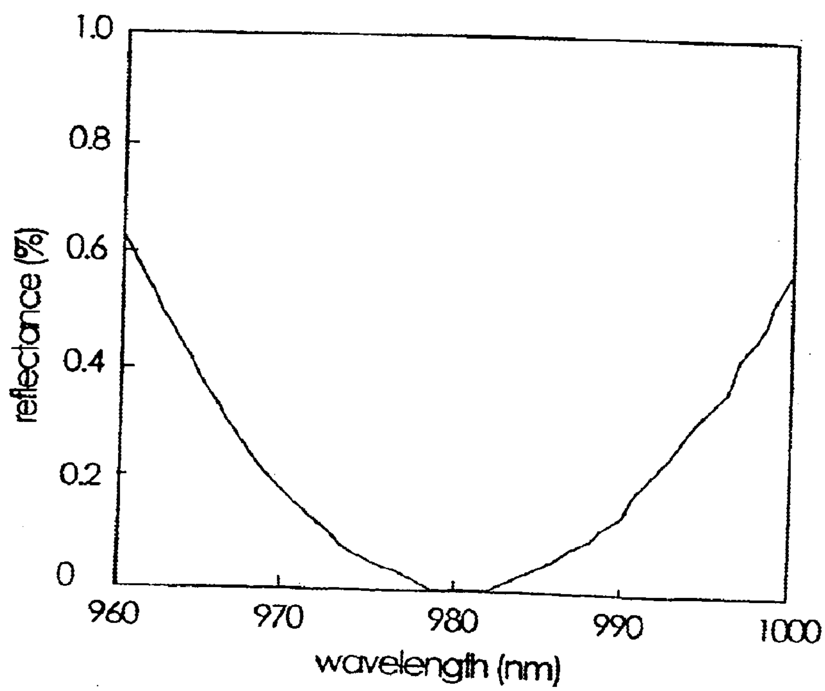
FIG. 12 is a graph showing the reflectance of a low-reflective coating film of a semiconductor laser according to an embodiment of the present invention.

FIG. 12 is a graph showing the reflectance of a low-reflective coating film of a semiconductor laser according to an embodiment of the present invention.

The wavelength region which is a neighborhood of the λ0 (980 nm) and whose reflectance is 1% or smaller has a width of approximately 52 nm.

Figure 13:
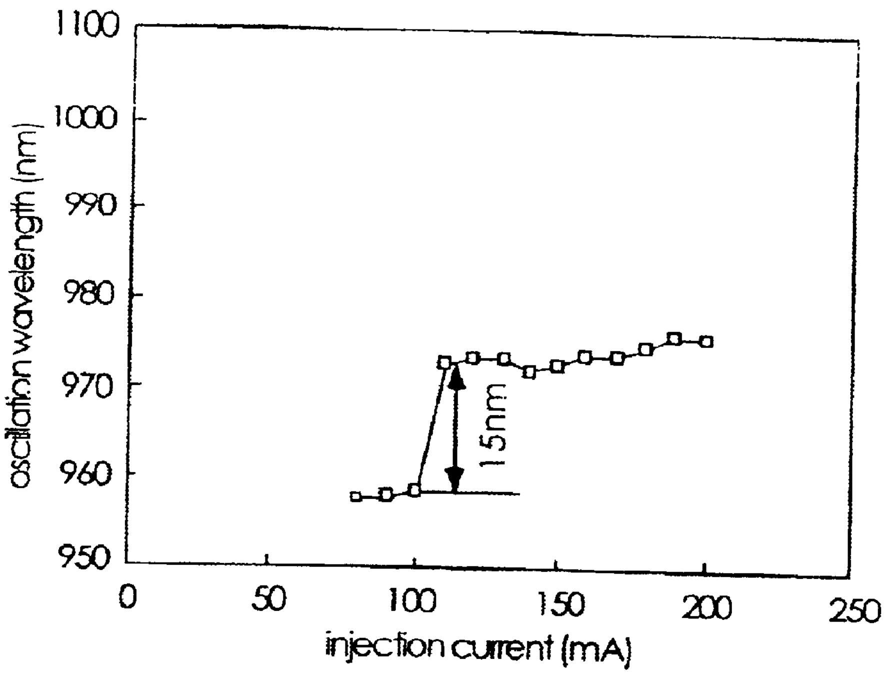
FIG. 13 is a graph showing an experimental result on the injection current dependence of the oscillation wavelength of a semiconductor laser device according to the embodiment.

FIG. 13 is a graph showing an experimental result on the injection current dependence of the oscillation wavelength of a semiconductor laser device according to the embodiment.

Referring to FIG. 13, when the injection current has reached near approximately 100 mA after it was slowly increased, the wavelength abruptly increases by 15 nm (shifts toward the longer-wavelength region by 15 nm). This means that a single semiconductor laser can emit light having two wavelengths which are 15 nm apart. A further experiment indicates that two-wavelength oscillation can occur if the wavelength region whose reflectance is 1% or smaller has a width narrower than approximately 55 nm.

EXAMPLE 8

In this example, the semiconductor laser is configured as in Example 7, and the configuration of the low-reflective coating film is the same as that of a low-reflective coating film of the second embodiment described above which includes 6 coating films formed in layers.

The first-layer, third-layer, and fifth-layer coating films are formed: of $Al_2O_3$ having a refractive index n1 of 1.62; the second-layer, fourth-layer, and sixth-layer coating films are formed of $Ta_2O_5$ having a refractive index n2 of 2.057; and the film thicknesses of the first to sixth layers are 24.2 nm, 196.3 nm, 30.2 nm, 245.4 nm, 36.2 nm, and 294.5 nm, respectively.

Figure 14:
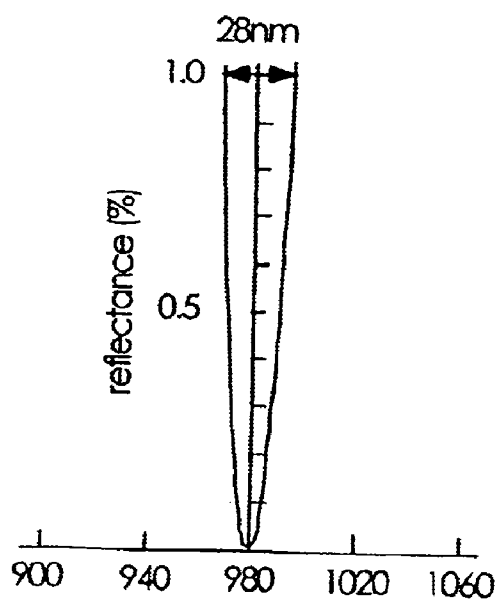
FIG. 14 is a graph showing the reflectance of Example 8, which is an embodiment of the present invention.

FIG. 14 is a graph showing the reflectance of Example 8, which is an embodiment of the present invention.

As shown in FIG. 14, the width of the wavelength region whose reflectance is 1% or smaller is narrow (specifically 28 nm), making it possible to change the wavelength of the laser light by 15 nm or more.

EXAMPLE 9

In this example, the resonator is 900 μm long in contrast with the resonator of the semiconductor laser of Example 7 which is 1500 μm long.

The configuration of the low-reflective coating film on the front end face is the same as that of the low-reflective coating film 14 of the first embodiment as follows. The equivalent refractive index of the semiconductor laser nc=3.37; the first-layer coating film 16 is formed of $Al_2O_3$ having a refractive index n1 of 1.62 such that it has a film thickness of 240 nm; and the second-layer coating film 18 is formed of $Ta_2O_5$ having a refractive index n2 of 2.057 such that it has a film thickness of 183 nm. The reflectance Rr of the rear end face is 98%.

The second item on the right-hand side of the above formula (12) indicates the so-called mirror loss, which is inversely proportional to the length of the resonator. Therefore, decreasing the length of the resonator from 1500 μtm to 900 μm increases the mirror loss.

Figure 15:
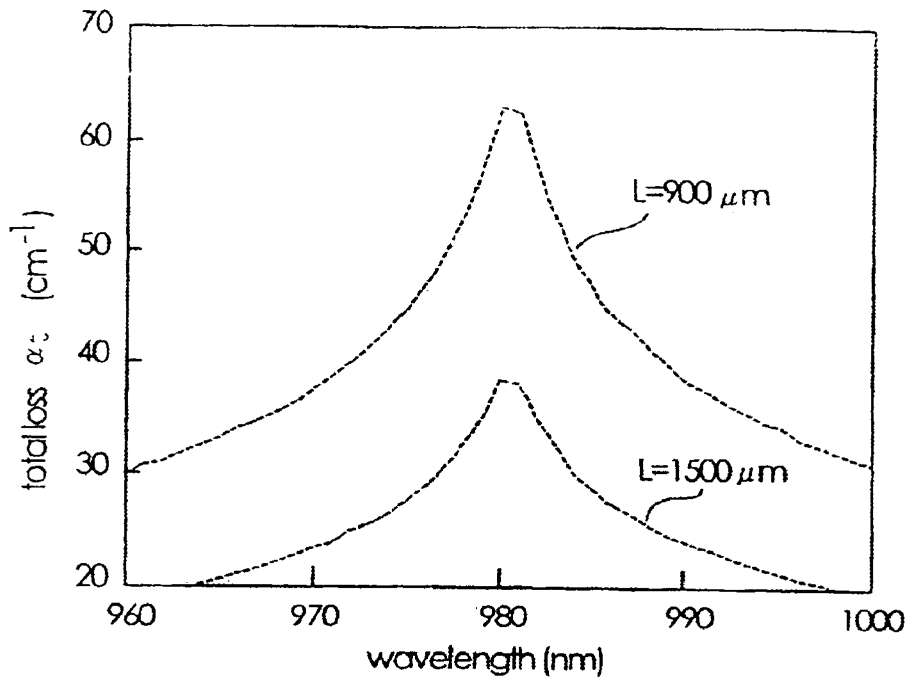
FIG. 15 is a graph comparing the total losses of semiconductor lasers having different resonator lengths.

FIG. 15 is a graph comparing the total losses of semiconductor lasers having different resonator lengths.

Figure 16:
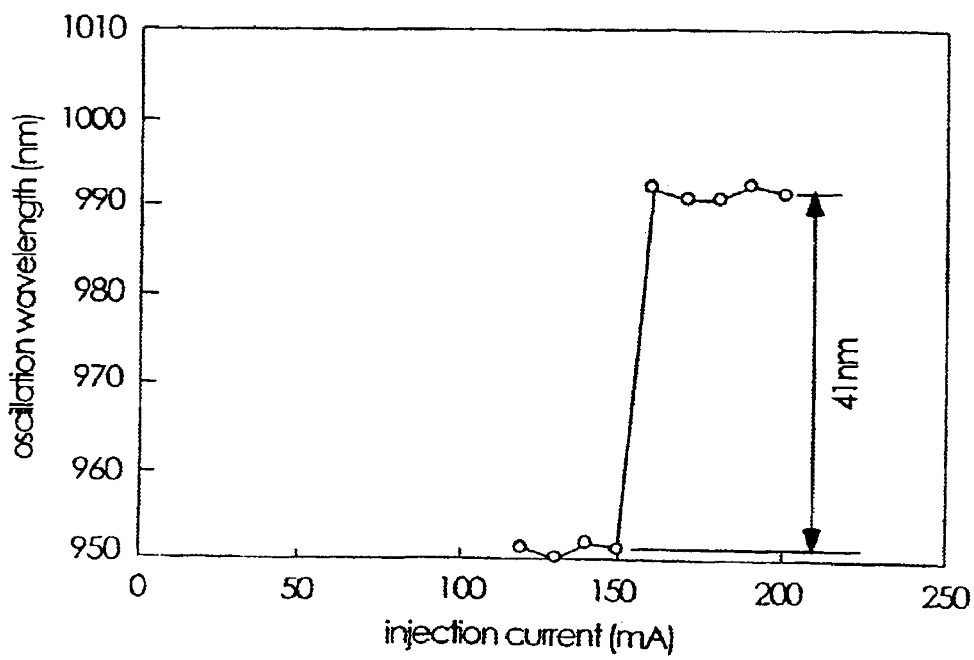
FIG. 16 is a graph showing an experimental result on the oscillation wavelength of the semiconductor laser of Example 9, which is an embodiment of the present invention.

FIG. 16 is a graph showing an experimental result on the oscillation wavelength of the semiconductor laser of Example 9, which is an embodiment of the present invention.

In this example, the configuration of the low-reflective coating film on the end face is the same as that in Example 7, but the length of the resonator is decreased from 1500 μm to 900 μm. The experimental result on the injection current dependence of the oscillation wavelength shown in FIG. 16 indicates that the change in the oscillation wavelength of the semiconductor laser is 41 nm, exhibiting that the change in the oscillation wavelength has been increased by reducing the length of the resonator. That is, a single semiconductor laser can emit two types of light whose wavelengths are 41 nm apart, effectively acting as a two-wavelength laser, making it easy to provide a single semiconductor laser with a resonator length of 1500 $\mu$m or less capable of oscillating light having two wavelengths.

It goes without saying that by further reducing the length of the resonator, it is possible to emit two types of light whose wavelengths are farther part. Similarly, if the length of the resonator is short, it is possible to cause the wavelength change to occur even when the wavelength region whose reflectance is 1% or smaller has a width of more than 55 nm.

According to the present embodiment described above, a low-reflective film is configured such that its reflectance is minimized at a desired wavelength $\lambda 0$, and the gain becomes equal to the loss at two wavelengths each on a respective side (the shorter-wave side and the longer-wave side) of the wavelength $\lambda 0$. This low-reflective film is disposed on the emitting front end face of a semiconductor laser, making it possible to provide a semiconductor laser device which oscillates at two wavelengths using only a single semiconductor laser, making it easy to provide a single semiconductor laser capable of oscillating light having two wavelengths.

Fourth Embodiment

Semiconductor lasers for communications must have stable characteristics exhibiting a small change in the wavelength. Generally, if the total film thickness of the coating film on the end face is thinner than ¼ of a given wavelength ($\lambda 0$), the width of the wavelength region whose reflectance is 1% or smaller exceeds 100 nm, making it possible to reduce the change in the wavelength. However, since the total film thickness is thin and therefore the heat dissipation is reduced, the end face may be degraded.

Figure 17:
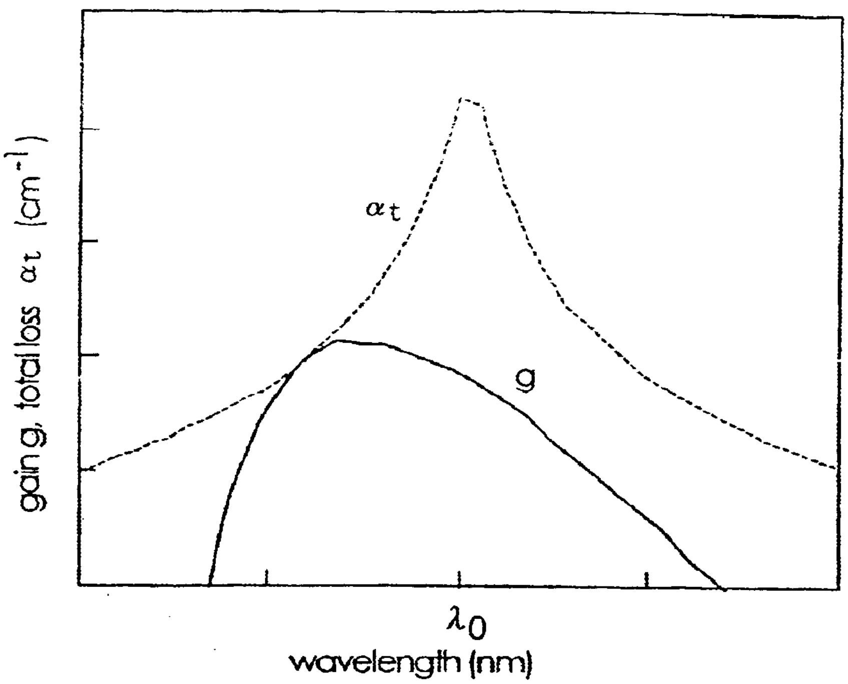
FIG. 17 is a graph showing the relationship between the total loss and the gain of a semiconductor laser device according to an embodiment of the present invention.

FIG. 17 is a graph showing the relationship between the total loss and the gain of a semiconductor laser device according to an embodiment of the present invention.

This semiconductor laser device is configured as follows. The low-reflective coating film employed by the first or second embodiment is disposed on the emitting end face of a semiconductor laser; and the reflectance is minimized at a given wavelength $\lambda 0$, and the gain becomes equal to the total loss at a wavelength on the shorter-wavelength side of the given wavelength $\lambda 0$ a shown in FIG. 17. With this arrangement, if the total loss expressed by the formula (12) and the gain expressed as $g(\lambda)$ satisfy the formula (13) for $\lambda$ on the longer-wavelength side, it is possible to reduce the change in the wavelength.

$$\alpha in+(1/(2L))\ln(1/(Rf^*Rr))>g(\lambda) \quad (13)$$

Conversely, with the above arrangement, consider that the gain becomes equal to the total loss at a wavelength on the longer-wavelength side of the given wavelength $\lambda 0$. In such a case, if the formula (13) is satisfied for $\lambda$ on the shorter-wavelength side of the wavelength $\lambda 0$, it is also possible to reduce the change in the wavelength.

Detailed study shows that if the wavelength region which is a neighborhood of the wave length $\lambda 0$ and whose reflectance is 1% or smaller has a width wider than 55 nm, the formula (13) is satisfied, making it possible to provide a semiconductor laser whose wavelength changes only within 10 nm.

EXAMPLE 10

Since the mirror loss indicated by the second item on the left-hand side of the above formula (13) is inversely proportional to the length of the resonator, increasing the length of the resonator reduces the mirror loss. The semiconductor laser of Example 10 has the same configuration as that of the semiconductor laser of Example 7 shown in FIG. 11, and its equivalent refractive index nc is 3.37. However, the length of the resonator is set at 1800 $\mu$m, and the low-reflective coating film on the emitting front end face is one having the two-coating-film-pair structure employed by the first embodiment described above.

The low-reflective coating film is configured as follows. The first-layer coating film is formed of $Al_2O_3$ having a refractive index n1 of 1.62 such that it has a film thickness of 240 nm; and the second-layer coating film is formed of $Ta_2O_5$ having a refractive index n2 of 2.057 such that it has a film thickness of 183 nm. With this arrangement, the wavelength region which is a neighborhood of the oscillation wavelength and whose reflectance is 1% or smaller has a width of approximately 52 nm.

Figure 18:
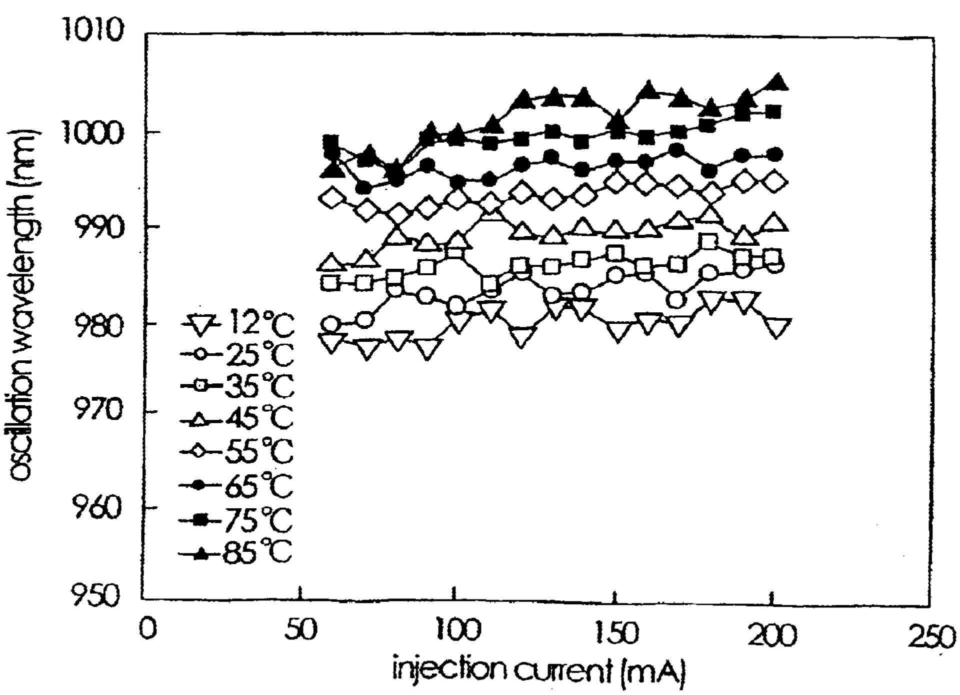
FIG. 18 is a graph showing an experimental result on the current dependence of the oscillation wavelength in Example 10, which is an embodiment of the present invention.

FIG. 18 is a graph showing an experimental result on the current dependence of the oscillation wavelength in Example 10, which is an embodiment of the present invention.

In the figure, a wavelength change of 10 nm or more is not observed even with changing injection current or changing ambient temperature.

In this example, the resonator is 1800 $\mu$m long. However, the present embodiment is not limited to this specific length. Furthermore, with an increased resonator length, it is possible to reduce the change in the wavelength even when the width of the wavelength region which is a neighborhood of the oscillation wavelength and whose reflectance is 1% or smaller is narrower.

According to the present embodiment described above, a semiconductor laser is configured as follows. The coating film layer structure is disposed on an emitting front end face of a semiconductor laser, and a total loss of the semiconductor laser becomes equal to a gain of the semiconductor laser at a wavelength on one of a longer-wavelength side and a shorter-wavelength side of wavelength $\lambda 0$ of the semiconductor laser, whereas the total loss of the semiconductor laser becomes larger than the gain of the semiconductor laser at a wavelength on the other one of the longer-wavelength side and the shorter-wavelength side. Accordingly, it is possible to configure a semiconductor laser such that its oscillation wavelength changes only a little with changing ambient temperature or changing injection current.

Further, a low-reflective coating film is formed on an end face of the semiconductor laser so as to ensure a wavelength, dependence of the reflectance in which the reflectance is minimized at a given wavelength $\lambda 0$ as well as setting the width of the wavelength region having a reflectance of 1% or smaller to be 55 nm or wider. With this arrangement, it is possible to provide a semiconductor laser device which is stable showing a small change in the wavelength with changing ambient temperature and changing injected power amount, making it easy to provide a semiconductor laser whose oscillation wavelength is stable.

Fifth Embodiment

Like the fourth embodiment, the fifth embodiment relates to a semiconductor laser for communications which has stable characteristics showing a small change in the wavelength.

To ensure that the wavelength region which is a neighborhood of a given wavelength $\lambda 0$ and whose reflectance is 1% or smaller has a width of 55 nm or wider, the fourth embodiment disposes the low-reflective coating film employed by the first or second embodiment described above on the emitting end face of the semiconductor laser. The fifth embodiment, on the other hand, inclines the axis of the optical waveguide of the semiconductor laser a little with respect to the end faces of the resonator.

The configuration of this semiconductor laser is the same as that for Example 7 shown in FIG. 11 except that the axis of the ridge type optical waveguide of the semiconductor laser is inclined at an angle of 1.5 degrees with respect to the end faces of the resonator, and a coating film of $Al_2O_3$ having a film thickness of 454 nm is formed on the emitting front end face.

Figure 19:
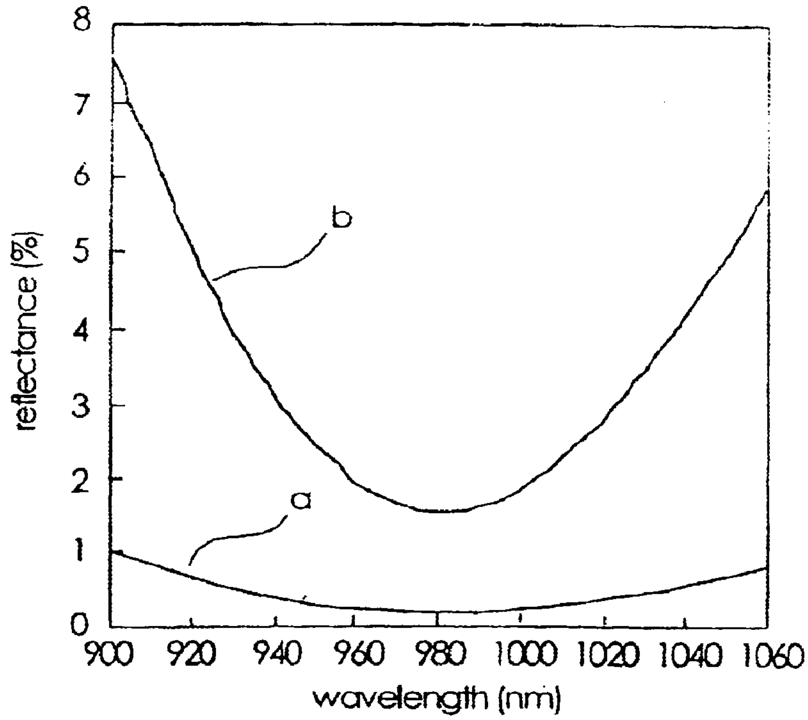
FIG. 19 is a graph showing the wavelength dependence of the reflectance of the semiconductor laser according to the embodiment.

FIG. 19 is a graph showing the wavelength dependence of the reflectance of the semiconductor laser according to the embodiment. For comparison, FIG. 19 also shows the wavelength dependence of the reflectance obtained when the end faces of the resonator are not inclined with respect to the axis of the optical waveguide of the semiconductor laser.

In FIG. 19, the curve a indicates the reflectance obtained when the axis of the optical waveguide of the semiconductor laser is inclined at an angle of 1.5 degrees with respect to the end faces of the resonator, while the curve b indicates the reflectance obtained when the optical waveguide is not inclined with respect to the end faces of the resonator. In both cases, a coating film of $Al_2O_3$ with a film thickness of 454 nm is formed on the emitting front end face.

As shown in FIG. 19, tilting the axis of the optical waveguide of the semiconductor laser at an angle of 1.5 degrees with respect to the end faces of the resonator increases the width of the wavelength region whose reflectance is 1% or smaller to 160 nm.

Figure 20:
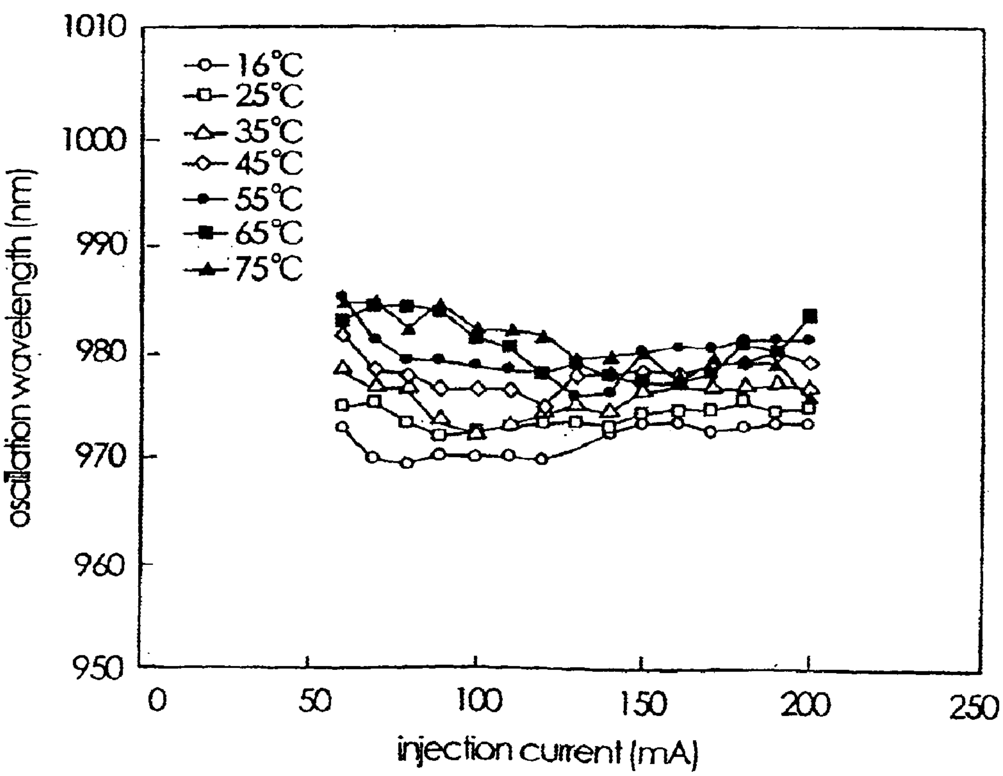
FIG. 20 is a graph showing an experimental result on the current dependence of the oscillation wavelength of the semiconductor laser according to the embodiment.

FIG. 20 is a graph showing an experimental result on the current dependence of the oscillation wavelength of the semiconductor laser according to the embodiment.

Specifically, FIG. 20 shows an experimental result on the current dependence using the ambient temperature as a parameter. As shown in the figure, a wavelength change of 10 nm or more is not observed even with changing injection current or changing ambient temperature.

In the semiconductor laser of the present embodiment described above, the axis of the optical waveguide of the semiconductor laser is inclined a little with respect to the end faces of the resonator so as to set the width of the wavelength region whose reflectance is 1% or smaller to be 55 nm or wider. With this arrangement, it is possible to provide a semiconductor laser device which is stable, showing a small change in the wavelength with changing ambient temperature or changing injected power amount.

Sixth Embodiment

A semiconductor laser device according to this embodiment is configured such that the wavelength at which no reflection occurs is on the longer-wavelength side of the oscillation wavelength decided by the configuration of the active layer of the semiconductor laser. That is, the coating film layer structure is disposed on an emitting front end face of a semiconductor laser, and an oscillation wavelength of the semiconductor laser is shorter than the wavelength λ0.

With this arrangement, it is possible to configure a semiconductor laser such that its oscillation wavelength changes only a little with changing ambient temperature or changing injection current, making it possible to provide a semiconductor laser device whose oscillation wavelength is stable regardless of conditions under which the semiconductor laser device is used.

For example, the semiconductor laser device is configured as follows. The low-reflective coating film 14 including two coating films formed in layers employed by the first embodiment described above is formed on the emitting end face of a semiconductor laser having a resonator length of 900 μm; a coating film of $Al_2O_3$ having a film thickness of 240 nm is formed on the end face of the semiconductor laser by means of electron beam evaporation as the first-layer coating film 16; and a coating film of $Ta_2O_5$ having a film thickness of 183 nm is formed as the second-layer coating film 18. The above arrangement is made so as to minimize the reflectance when the wavelength λ0 is 965 nm.

Figure 21:
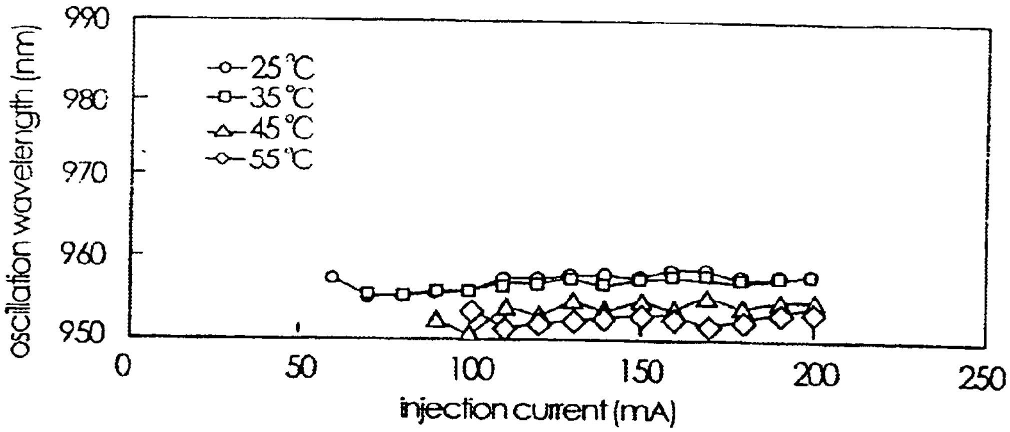
FIG. 21 is a graph showing an experimental result on the operational-current dependence of the oscillation wavelength of a semiconductor laser device according to an embodiment of the present invention.

FIG. 21 is a graph showing an experimental result on the operational-current dependence of the oscillation wavelength of a semiconductor laser device according to an embodiment of the present invention.

Specifically, FIG. 21 shows an experimental result on the oscillation wavelength of the semiconductor laser using the ambient temperature as a parameter, indicating that the oscillation wavelength changes little.

Furthermore, since the oscillation wavelength is near 955 nm, it exists on the shorter-wave side of the wavelength λ0 at which the reflectance is minimized.

Description will be made below of the reason why the oscillation wavelength of the semiconductor laser of the present embodiment changes only a little.

Figure 22:
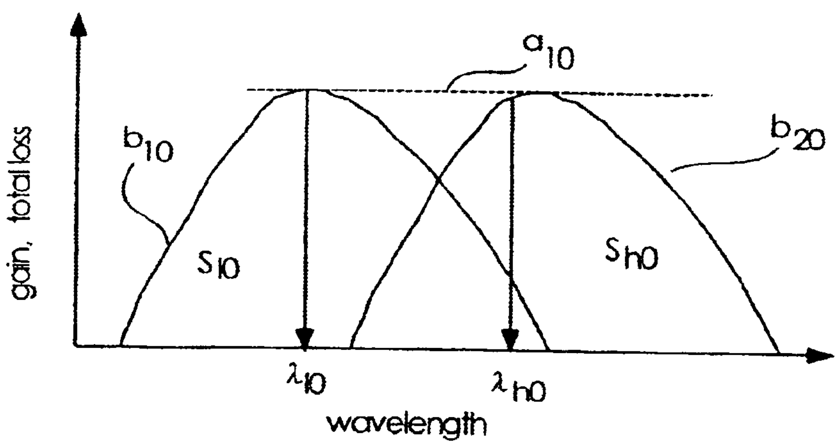
FIG. 22 is a schematic diagram showing the relationship between the loss and the gain when the reflectance of the semiconductor laser has no wavelength dependence.

FIG. 22 is a schematic diagram showing the relationship between the loss and the gain when the reflectance of the semiconductor laser has no wavelength dependence.

In the figure, a broken line a10 indicates the total loss, while solid lines b10 and b20 indicate the gain. Reference numeral Sl0 indicates the total gain at a low temperature, while Sh0 indicates the total gain at a high temperature. Both total gains are proportional to the injection current.

Generally, the injected current is converted into less gain at a higher temperature. Therefore, a large injection current is required at a high temperature. As shown in FIG. 22, since this semiconductor laser oscillates at a wavelength λl0 at a low temperature and at a wavelength λh0 at a high temperature, the change in the wavelength due to a change in the temperature is proportional to (λh0−λl0)/(Sh0−Sl0). Generally, the AlGaAs semiconductor laser and the InGaAs semiconductor laser have wavelenght changes of 0.2 to 03 nm/° C. and 0.4 to 0.7 nm/° C. respectively, which are large values.

Figure 23:
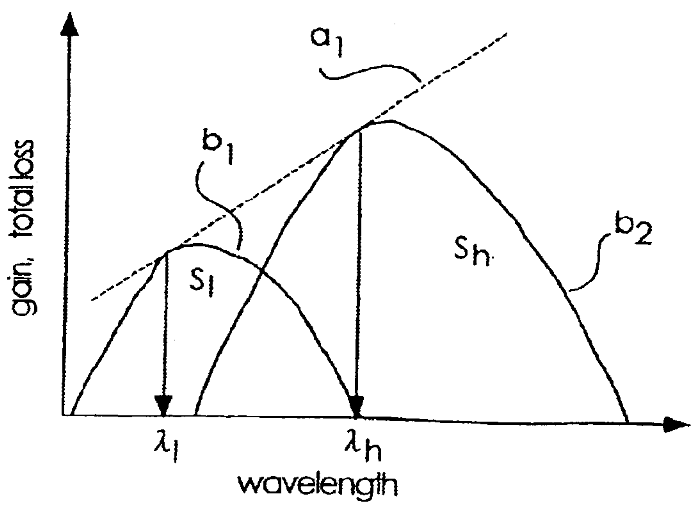
FIG. 23 is a schematic diagram showing the relationship between the loss and the gain of a semiconductor laser according to an embodiment of the present invention.

FIG. 23 is a schematic diagram showing the relationship between the loss and the gain of a semiconductor laser according to an embodiment of the present invention.

In the figure, a broken line a1 indicates the total loss, while solid lines b1 and b2 indicate the gain. Reference numeral Sl indicates the total gain at a low temperature, while Sh indicates the total gain at a high temperature. Both total gains are proportional to the injection current.

As shown in FIG. 23, since the semiconductor laser of the present embodiment oscillates at a wavelength λl at a low temperature and at a wavelength λh at a high temperature, the change in the wavelength due to a change in the temperature is proportional to (λh−λl)/(Sh−Sl). In this region, however, the total loss increases with the wavelength as indicated by the broken line a in the figure, and as a result, Sh>Sl.

Therefore, the change in the wavelength due to a change in the temperature obtained when the total loss has a wavelength dependence is smaller than that obtained when the total loss has no wavelength dependence, as indicated by the formula (14).

$$(\lambda h-\lambda l)/(Sh-Sl)<(\lambda h0-\lambda l0)/(Sh0-Sl0) \tag{14}$$

The above description was made of the change in the wavelength obtained when the loss has no wavelength dependence. However, the degree of the wavelength change also depends on the degree of the wavelength dependence of the loss. That is, as the increase in the loss due to an increase in the wavelength becomes larger, the change in the wavelength due to a change in the temperature or the injection current can be reduced to a larger extent.

Seventh Embodiment

Figure 24:
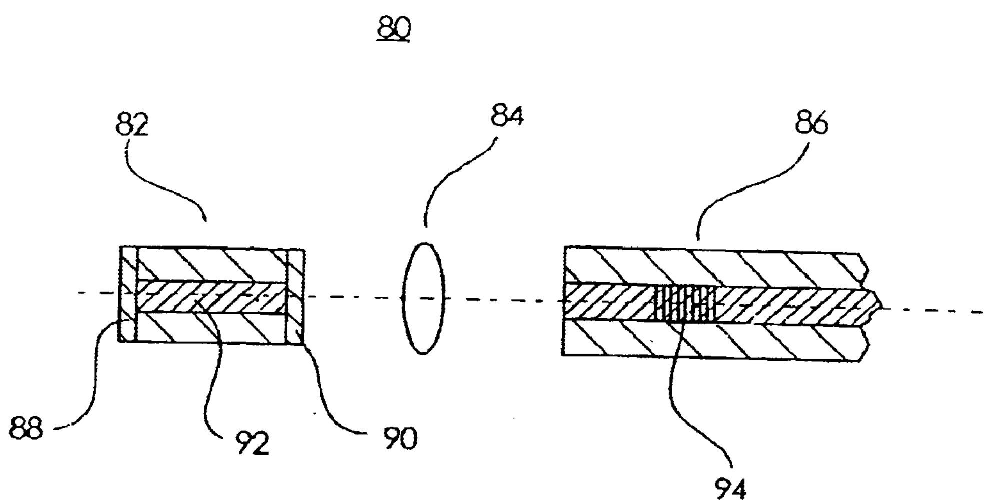
FIG. 24 is a schematic cross-sectional view of a semiconductor laser device according to an embodiment of the present invention.

FIG. 24 is a schematic cross-sectional view of a semiconductor laser device according to an embodiment of the present invention.

In the figure, reference numeral 80 denotes a semiconductor laser device; 82 a semiconductor laser; 84 a lens disposed in alignment with the optical axis of the laser light and facing the emitting end face of the semiconductor laser 82; 86 an optical fiber facing the emitting end face of the semiconductor laser 82 through the lens 84 and disposed in alignment with the optical axis of the laser light.

Reference numeral 88 denotes a coating film disposed on the rear end face of the semiconductor laser 82. The reflectance of the coating film 88 is indicated by the symbol Rr. Reference numeral 90 denotes a low-reflective coating film disposed on the front end face of the semiconductor laser 82. The reflectance of the low-reflective coating film 90 is indicated by the symbol Rf. Reference numeral 92 denotes the optical waveguide region of the semiconductor laser 82, and 94 denotes a fiber grating provided in the optical fiber 86. The reflectance of the fiber grating 94 is indicated by the symbol Rfg.

The semiconductor laser 82 uses the low-reflective coating film employed by the first or second embodiment described above as its low-reflective coating film. The low-reflective coating film 90 has a reflectance which is minimized at a given wavelength λ0 so as to set the width of the wavelength region whose reflectance is 1% or smaller to be 55 nm or wider.

To stabilize the oscillation wavelength of the semiconductor laser 82, the semiconductor laser device 80 is configured as follows. The fiber grating 94 is provided within the optical fiber 86 so as to reflect light having a specific wavelength; the front end face of the semiconductor laser 82 is made low-reflective or nonreflective; and the rear end face of the semiconductor laser 82 is made high-reflective. The portion between the fiber grating 94 and the rear end face of the semiconductor laser 82 constitutes a resonator. The lens 84 is provided to efficiently enter the light from the semiconductor laser 82 into the optical fiber 86.

The operation will be described below.

Figure 25:
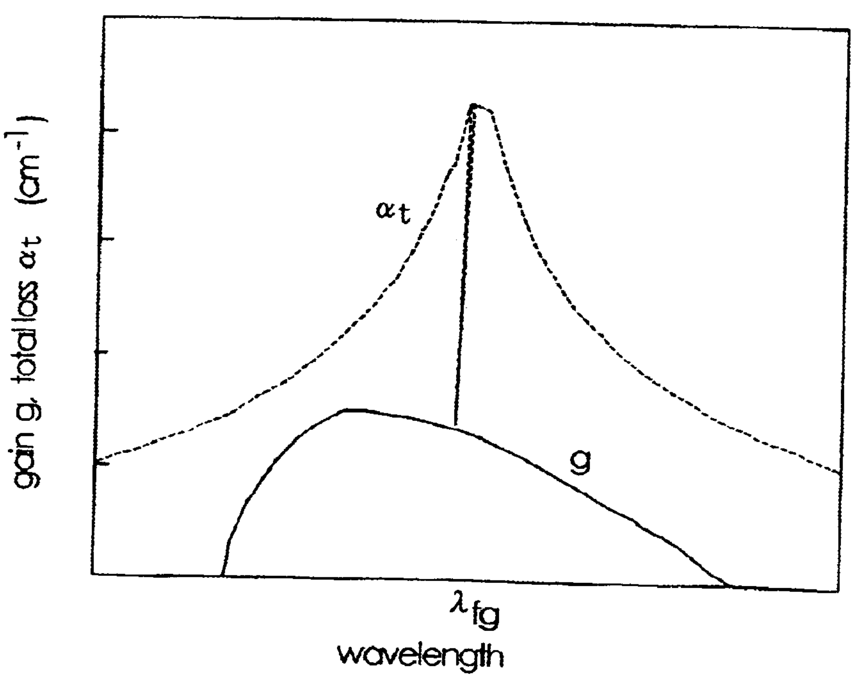
FIGS. 25 and 26 are graphs each showing the gain and the loss of a semiconductor laser device having a conventional fiber grating.
Figure 26:
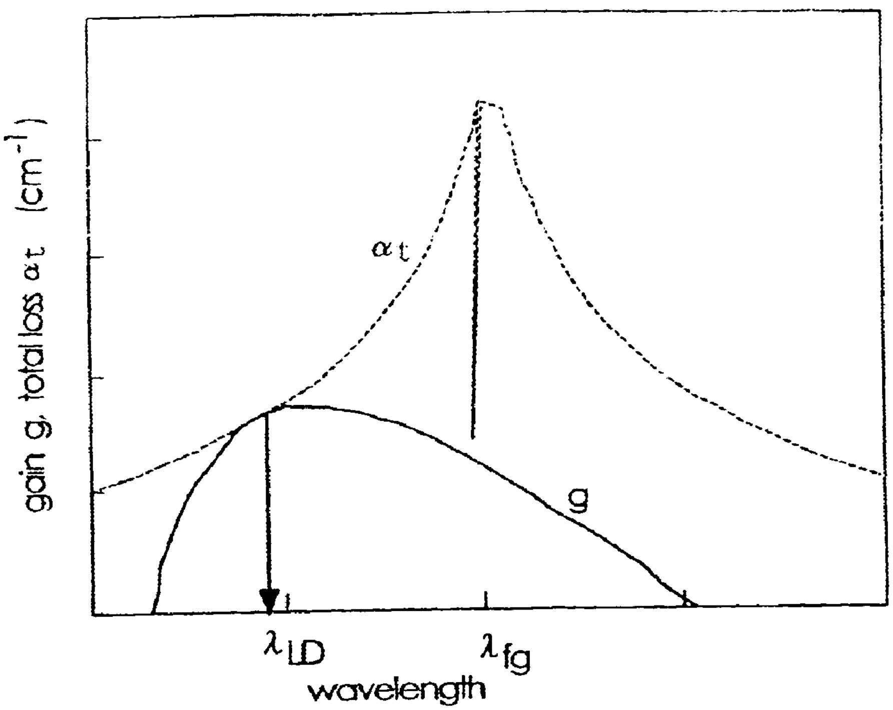

FIGS. 25 and 26 are graphs each showing the gain and the loss of a semiconductor laser device having a conventional fiber grating.

In FIG. 25, the fiber grating has a reflectance of Rfg for a specific wavelength λfg and substantially zero for the other wavelengths. Therefore, the loss is reduced at the wavelength λfg, and as a result the semiconductor laser oscillates at this wavelength.

However, at a low ambient temperature, for example, the gain distribution shifts toward the shorter-wavelength side. At that time, the loss decided by the coating film on the front end face of the semiconductor laser may be smaller than the loss decided by the fiber grating, as shown in FIG. 26. In such a case, the semiconductor laser oscillates at the wavelength λLD instead of the λfg.

At that time, the side mode suppression ratio (which is the ratio of the light intensity at the wavelength λLD to the light intensity at the wavelength λfg) may be small or the semiconductor laser may oscillate at a wavelength other than the wavelength decided by the fiber grating.

According to the present embodiment, a low-reflective coating film is provided on the emitting front end face of a semiconductor laser, and furthermore the low-reflective coating film is configured such that the width of the wavelength region whose reflectance is 1% or smaller is-set to be 55 nm or wider. With this arrangement, it is possible to suppress the oscillation decided by the wavelength dependence of the coating film on the front end face of the semiconductor laser, thereby preventing the side mode suppression ratio from being reduced, making it easy to provide a semiconductor laser device which stably oscillates at an oscillation wavelength decided by a fiber grating.

Figure 27:
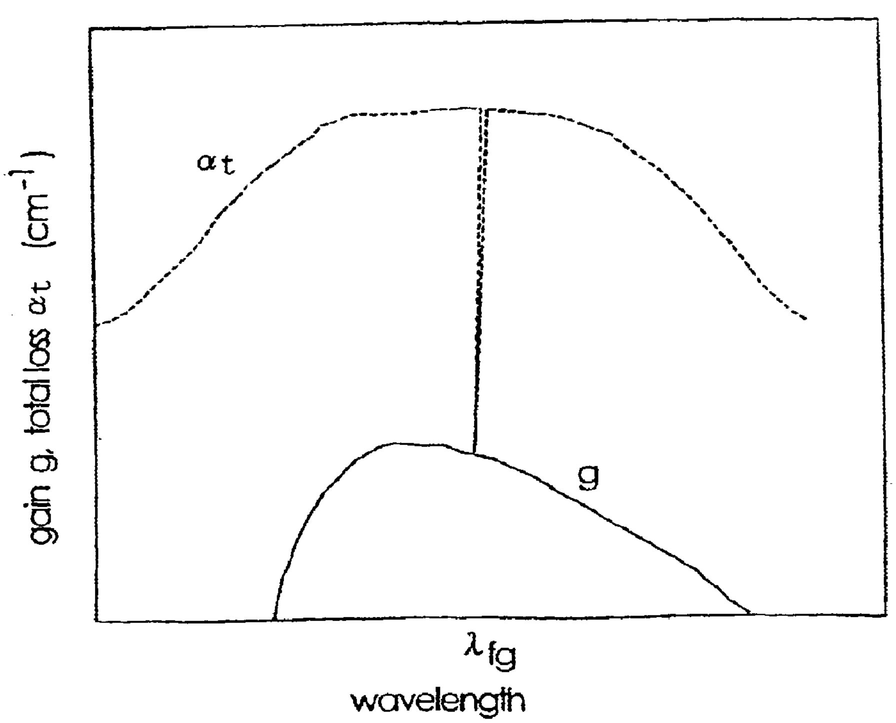
FIG. 27 is a graph showing the gain and the loss of a semiconductor laser device having a fiber grating according to an embodiment of the present invention.

FIG. 27 is a graph showing the gain and the loss of a semiconductor laser device having a fiber grating according to an embodiment of the present invention.

In FIG. 27, since the low-reflective coating film 90 on the front end face of the semiconductor laser 82 is configured such that the width of the wavelength region whose reflectance is 1% or smaller is set to be, for example, 100 nm or wider, the semiconductor laser 82 does not oscillate at the wavelength decided by the low-reflective coating film 90 on the front end face of the semiconductor laser 82, but oscillates at the wavelength decided by the fiber grating even when the ambient temperature or the injection current is changed. With this arrangement, it is possible to provide a semiconductor laser device whose oscillation wavelength is stable.

Eighth Embodiment

According to the eighth embodiment, a semiconductor laser device has a fiber grating as in the seventh embodiment. The basic configuration is the same as that of the seventh embodiment.

However, the configuration of the low-reflective coating film 90 disposed on the front end face of the semiconductor laser 82 is different. That is, the low-reflective coating film 90 is set as follows. When a given wavelength λ0 at which the reflectance is minimized is shorter than the wavelength λfg of the fiber grating, the reflectance of the low-reflective coating film 90 increases with increasing wavelength more gradually on the longer-wavelength side of the wavelength λ0 than the shorter-wavelength sided and when the given wavelength λ0 at which the reflectance is minimized is longer than the wavelength λfg of the fiber grating, the reflectance of the low-reflective coating film 90 decreases with increasing wavelength more gradually on the shorter-wavelength side of the wavelength λ0 than the longer-wavelength side.

With this arrangement, it is possible to set a large side mode suppression ratio, causing the semiconductor laser device to stably oscillate at the oscillation wavelength decided by the wavelength λfg of the fiber grating, making it easy to provide a semiconductor laser device which stably oscillates at an oscillation wavelength decided by a fiber grating.

EXAMPLE 11

In this example, the low-reflective coating film 90 (which includes four films formed in layers) employed by the second embodiment described above is formed on the front end face of a semiconductor laser whose equivalent refractive index nc=3.37.

The low-reflective coating film 90 is formed as follows. An $Al_2O_3$ film having a refractive index n1 of 1.62 and a film thickness of 25.23 is formed as its first layer; a $Ta_2O_5$ film having a refractive index n2 of 2.057 and a film thickness of 24.69 is formed as its second layer; an $Al_2O_3$ film having a refractive index n1 of 1.62 and a film thickness of 37.84 is formed as its third layer; and a $Ta_2O_5$ film having a refractive index n2 of 2.057 and a film thickness of 37.04 is formed as its fourth layer.

Figure 28:
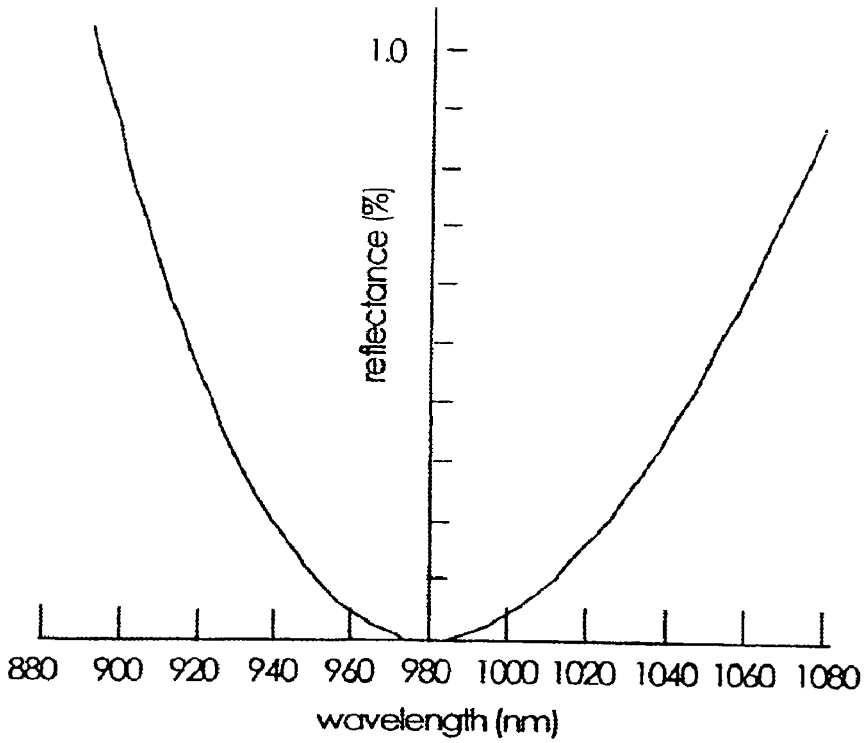
FIG. 28 is a graph showing the wavelength dependence of the reflectance of a semiconductor laser device according to an embodiment of the present invention.

FIG. 28 is a graph showing the wavelength dependence of the reflectance of a semiconductor laser device according to an embodiment of the present invention.

In FIG. 28, the reflectance is reduced to zero at the wavelength λ0 (980 nm), and then the reflectance increases with both increasing and decreasing wavelength. However, with changing wavelength, the reflectance changes more gradually on the longer-wavelength side than on the shorter-wavelength side.

Figure 29:
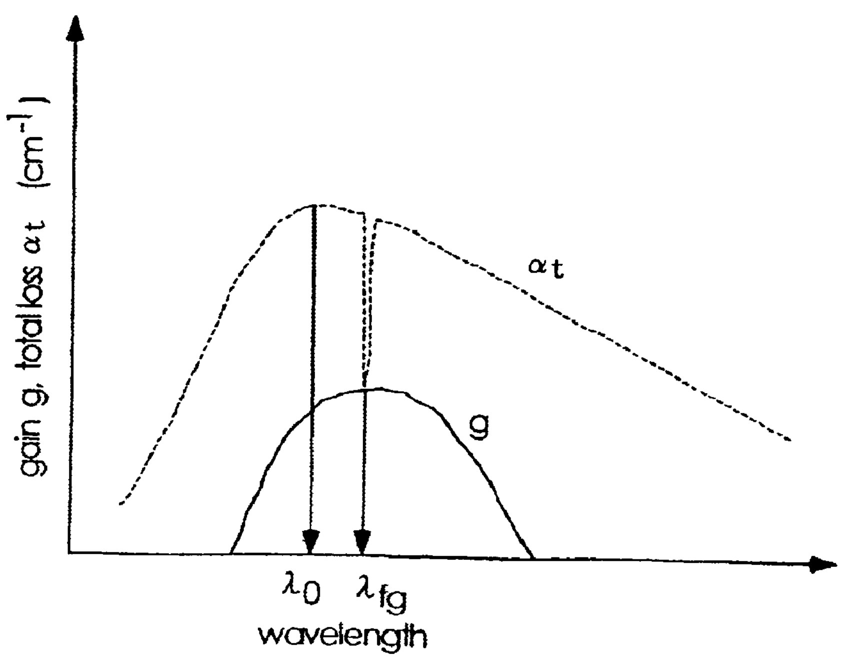
FIG. 29 is a graph showing the loss and the gain of a semiconductor laser device having a fiber grating according to Example 11, which is an embodiment of the present invention.

FIG. 29 is a graph showing the loss and the gain of a semiconductor laser device having a fiber grating according to Example 11, which is an embodiment of the present invention.

In FIG. 29, the broken line indicates the total loss αt, and the solid line indicates the gain g. Furthermore, λ0 denotes the-wavelength at which the reflectance is minimized, while λfg denotes the fiber grating wavelength.

As shown in the figure, the change in the total loss becomes gradual on the longer-wavelength side of the wavelength λ0. Therefore, if the fiber grating wavelengthλfg is set to be on the longer-wavelength side of the wavelength λ0 at which low reflection or no reflection occurs, the gain of the semiconductor laser is unlikely to become equal to the loss on the shorter-wavelength side, resulting in a large side mode suppression ratio.

Ninth Embodiment

A ninth embodiment is obtained as a result of extending Example 5 of the second embodiment.

The ninth embodiment is configured in the same way as Example 5 of the second embodiment as follows.

A base coating film pair is formed of a coating film with a film thickness of a0*d1 made of a material having a refractive index of n1 and a coating film with a film thickness of a0*d2 made of a material having a refractive index n2; m coating film pairs (a first coating film pair to an m-th coating film pair) are formed on the base coating film, each coating film pair consisting of a third coating film with a refractive index of n1 and a fourth coating film with a refractive index of n2 disposed on the third coating film, wherein the third coating film of the k-th coating film pair has a film thickness of ak*d1, and the fourth coating film of the k-th coating film pair has a film thickness of ak*d2, where k is 1, 2, . . . , and m, and ak is a positive real number; and a fifth coating film with a film thickness of b1*d1 made of a material having a refractive index of n1 is formed on the surface of the fourth coating film of the coating film pair in the top layer.

Furthermore, the ninth embodiment provides another seven-layer film example and an example extended to a nine-layer film.

Figure 30:
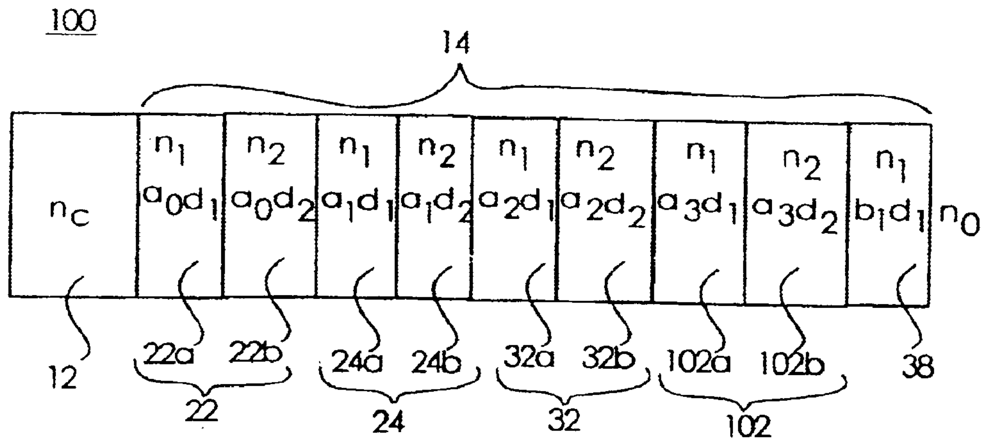
FIG. 30 is a schematic diagram showing a semiconductor laser device according to an embodiment of the present invention.

FIG. 30 is a schematic diagram showing a semiconductor laser device according to an embodiment of the present invention.

Referring to FIG. 30, reference numeral 100 denotes a semiconductor laser device, 102 denotes a third coating film pair formed on a second coating film pair 32, and 102*a* denotes a seventh-layer coating film, as a third coating film, with a film thickness of a3*d1 made of a material having a refractive index of n1. Reference numeral 102*b* denotes an eighth-layer coating film, as a fourth coating film, with a film thickness of a3*d2 made of a material having a refractive index of n2. The symbol "a3" indicates a parameter whose value is a positive real number.

Reference numeral 38 denotes a surface layer coating film, as a fifth coating film, with a film thickness of b1*d1 made of a material having a refractive index of n1, where the parameter b1 is a positive real number.

The third coating film pair 102 is made up of the seventh-layer coating film 102*a* and the eighth-layer coating film 102*b*. One interface surface of the surface layer coating film 38 is in close contact with the eighth-layer coating film 102*b* whereas the other surface is in contact with a free space whose refractive index n0 is equal to 1 in this embodiment.

The nonreflective conditions are derived as in the second embodiment. Specifically, the film thicknesses d1 and d2 are set such that the end face on which the low-reflective coating film 14 is disposed has an amplitude reflectance r whose real part and imaginary part are equal to 0.

Furthermore, n1 and n2 are set such that one of n1 and n2 is smaller than $(nc*n0)^{1/2}$ and the other is larger than $(nc*n0)^{1/2}$. Since n0=1, the setting is made so that $(nc)^{1/2}$ exists between n1 and n2.

Especially, according to the present embodiment, the low-reflective coating film 14 is configured such that a coating film made of a material having a refractive index smaller than $(nc*n0)^{1/2}$ is in close contact with an end face of the semiconductor laser element 12.

This arrangement enhances the degree of freedom for designing the low- reflective coating film as in the embodiments described earlier.

Further, since it is possible to easily configure a coating film whose low-reflective (wavelength) region (having a reflectance of 1% or smaller) is very wide, the coating film is easily used for an optical semiconductor device through which light of a plurality of wavelengths is propagated.

Still further, since the low-reflective (wavelength) region (having a reflectance of 1% or smaller) is very wide and the total film thickness of the coating films can be easily made thicker than the film thickness corresponding to ¼ of the wavelength of the propagation light (hereinafter referred to as "the λ0/4 film thickness"), the heat conductivity of the end faces of the optical semiconductor element is enhanced, resulting in an optical semiconductor device with reduced heat degradation, making it possible to provide an optical semiconductor device through which light having a wide wavelength region can be propagated and which has good thermal stability.

Still further, if a coating film of the present embodiment whose low-reflective (wavelength) region (having a reflectance of 1% or smaller) is very wide is provided on the emitting end face of the semiconductor laser of the semiconductor laser device having a fiber grating employed in the above seventh embodiment, the loss of the fiber grating can be made smaller than the loss decided by the reflectance of the end face of the semiconductor laser over a wide range of wavelengths. Therefore, it is possible to prevent oscillation of the semiconductor laser itself decided by the gain of the semiconductor laser and the reflectance of the end face, thereby preventing the side mode suppression ratio from being reduced, resulting in a semiconductor laser device having good laser characteristics.

EXAMPLE 12

Example 12 is configured in the same way as the example shown in FIG. 5.

Referring to FIG. 5, the equivalent refractive index nc of the semiconductor laser element 12 is set to be 3.37; and the first-layer coating film 22*a*, the third-layer coating film 24*a*, the fifth-layer coating film 32*a*, and the surface layer coating film 38 are formed of $Al_2O_3$ (alumina) having a refractive index (n1) of 1.62.

Furthermore, the second-layer coating film 22*b*, the fourth-layer coating film 24*b*, and the sixth-layer coating film 32*b* are formed of $Ta_2O_5$ (tantalum pentoxide) having a refractive index (n2) of 2.057.

Let the film thickness of each layer coating film be expressed as follows. The film thickness D1 of the first-layer coating film 22*a* is expressed as a0*d1; the film thickness D2 of the second-layer coating film 22*b* as a0*d2; the film thickness D3 of the third-layer coating film 24*a* as a1*d1; the film thickness D4 of the fourth-layer coating film 24*b* as a1*d2; the film thickness D5 of the fifth-layer coating film 32*a* as a2*d1; the film thickness D6 of the sixth-layer coating film 32*b* as a2*d2; and the film thickness Ds of the surface layer coating film 38 as b1*d1. In this case, when a0=0.8, a1=2.0, a2=2.0, and b1=2.0 and the phase changes φ1 and φ2 of $Al_2O_3$ and $Ta_2O_5$ are such that φ1=0.695388 and φ2=1.05768, no reflection occurs at the wavelength λ0 (=980 nm).

At that time, the film thickness of each layer is such that D1=53.56 nm, D2=64.16 nm, D3=133.90 nm, D4=160.40 nm, D5=133.90 nm, D6=160.40 nm, and Ds=133.90 nm (hereinafter expressed as "D1/D2/D3/D4/D5/D6/Ds=53.56/64.16/133.90/160.40/133.90/160.40/133.90 nm" for short). The total film thickness (n1*D1+n2*D2+n1*D3+n2*D4+n1*D5 +n2*D6+n1*Ds) is 1529.38 nm, which is very thick since it is approximately 6.2 times as thick as the λ0/4 film thickness (245 nm).

Figure 31:
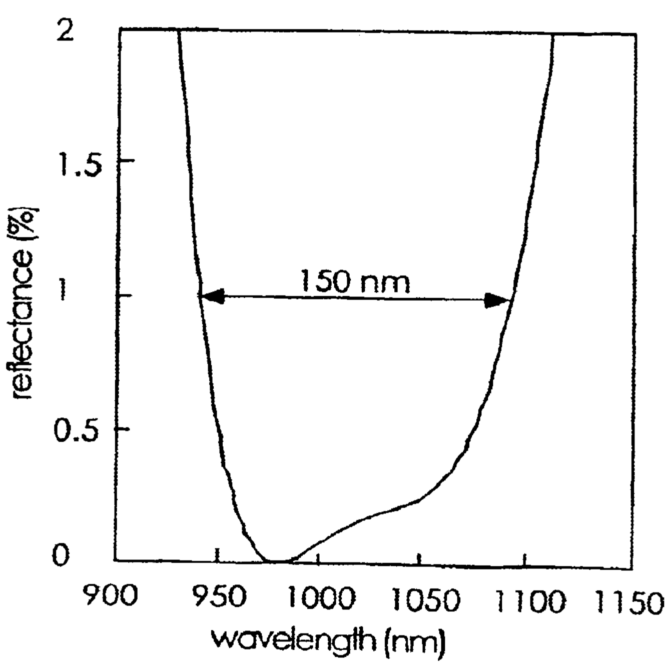
FIGS. 31–40 are graphs showing the wavelength dependence of the reflectance of an end face of a semiconductor laser according to embodiments (Example 12–21) of the present invention.

FIG. 31 is a graph showing the wavelength dependence of the reflectance of an end face of a semiconductor laser according to an embodiment (Example 12) of the present invention.

As shown in FIG. 31, the wavelength dependence (curve) of the reflectance has a U-shape (similar to a bathtub shape) in which the width of the wavelength region whose reflectance is 1% or smaller is as wide as 150 nm.

EXAMPLE 13

When the semiconductor laser in Example 12 is combined with the fiber grating as described earlier, it is desirable to set the wavelength λ0 of the semiconductor laser light at the center of the reflectance distribution having the bathtub shape. That is, it is desirable that the wavelength λ0 of the semiconductor laser light coincide with the center wavelength of the wavelength region whose reflectance is 1%.

In this case, to set the wavelength λ0 (=980 nm) as the center wavelength of the wavelength region whose reflectance is 1% assuming that the configuration of the low-reflective coating film 14 is the same as that of Example 12, each parameter may be set such that a0=0.8, a1=2.0, a2=2.0, and b1=2.0, and the phase changes φ1 and φ2 of $Al_2O_3$ and $Ta_2O_5$ are 0.695388 and 1.05768, respectively. Then, no reflection occurs at the wavelength λ (=944 nm).

It should be noted that if the values of a0, a1, a2 and b1 and the values of the phase changes φ1 and φ2 are the same as those for Example 12, the values of d1 and d2 (and therefore, the values of the film thickness D1, D2, D3, D4, D5, D6, and Ds of the layers) change as the wavelength at which no reflection occurs changes.

Thus, in the above case, the film thickness of each layer is such that D1/D2/D3/D4/D5/D6/Ds=51.59/61.80/128.98/154.51/128.98/154.51/128.98. This rule is applied to other embodiments to be described later.

Figure 32:
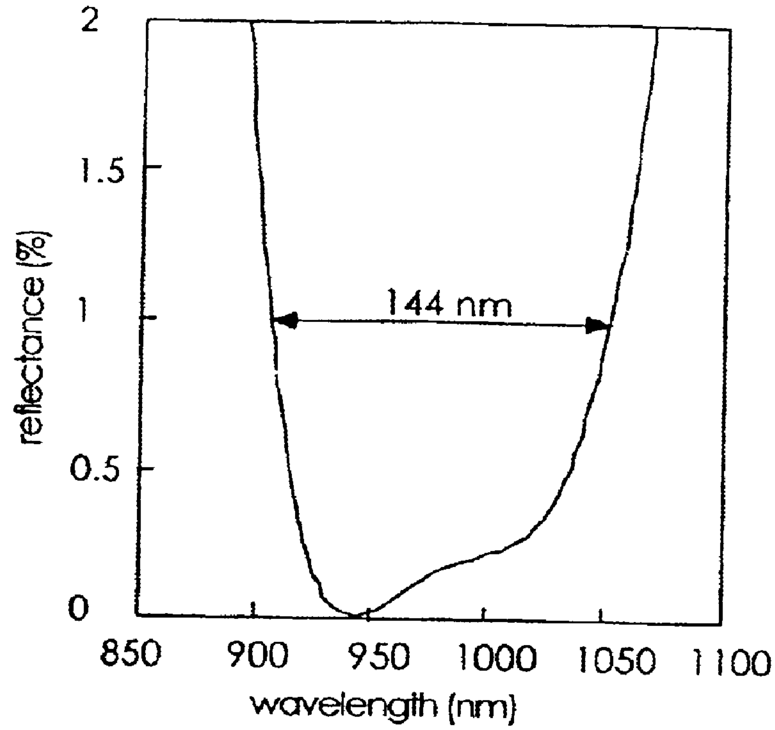

FIG. 32 is a graph showing the wavelength dependence of the reflectance of an end face of a semiconductor laser according to an embodiment (Example 13) of the present invention.

In FIG. 32, the width of the wavelength region whose reflectance is 1% or smaller is 144 nm.

EXAMPLE 14

Example 14 is configured in the same way as the example shown in FIG. 30.

Referring to FIG. 30, the equivalent refractive index nc of the semiconductor laser is set to be 3.37; and the first-layer coating film 22*a*, the third-layer coating film 24*a*, the fifth-layer coating film 32*a*, the seventh-layer coating film 102*a*, and the surface layer coating film 38 are formed of $Al_2O_3$ having a refractive index (n1) of 1.62.

Furthermore, the second-layer coating film 22*b*, the fourth-layer coating film 24*b*, the sixth-layer coating film 32*b*, and the eighth-layer coating film 102*b* are formed of $Ta_2O_5$ having a refractive index (n2) of 2.057.

Let the film thickness of each layer coating film be expressed as follows. The film thickness D1 of the first-layer coating film 22*a* is expressed as a0*d1; the film thickness D2 of the second-layer coating film 22*b* as a0*d2; the film thickness D3 of the third-layer coating film 24*a* as a1*d1; the film thickness D4 of the fourth-layer coating film 24*b* as a1*d2; the film thickness D5 of the fifth-layer coating film 32*a* as a2*d1; the film thickness D6 of the sixth-layer coating film 32*b* as a2*d2; the film thickness D7 of the seventh-layer coating film 38 as a3*d1; the film thickness D8 of the eighth-layer coating film 102*b* as a3*d2; and the film thickness Ds of the surface layer coating film 38 as b1*d1. In this case, when a0=0.8, a1=2.15, a2=1.8, a3=2.08, and b1=2.0 and the phase changes φ1 and φ2 of $Al_2O_3$ and $Ta_2O_5$ are such that φ1=0.471712 and φ2=1.3307, no reflection occurs at the wavelength λ0 (=980 nm).

At that time, the film thickness of each layer is such that D1/D2/D3/D4/D5/D6/D7/D8/Ds=36.33/80.72/97.64/216.94/81.75/181.62/94.47/209.87/90.83 nm.

The total film thickness (n1*D1+n2*D2+n1*D3+n2*D4+n1*D5+n2*D6+n1*D7+n2*D8+n1*Ds) is 2067.23, which is very thick since it is approximately 8.4 times as thick as the λ0/4 film thickness (245 nm).

Figure 33:
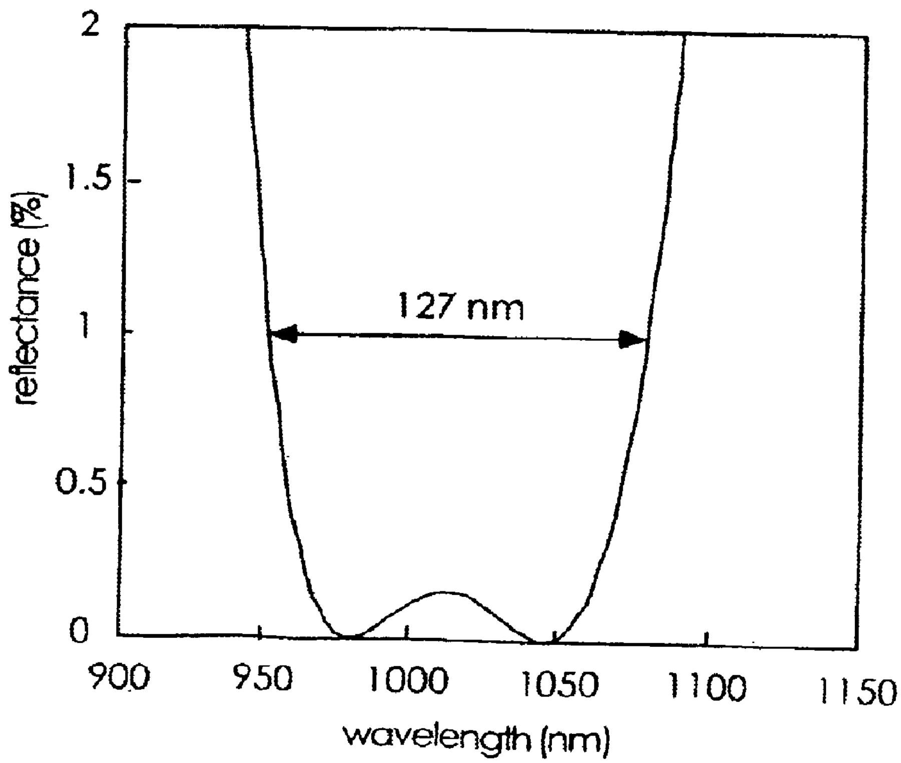

FIG. 33 is a graph showing the wavelength dependence of the reflectance of an end face of a semiconductor laser according to an embodiment (Example 14) of the present invention.

As shown in FIG. 33, the wavelength dependence (curve) of the reflectance has a U-shape (similar to a bathtub shape) in which the width of the wavelength region whose reflectance is 1% or smaller is as wide as 127 nm.

EXAMPLE 15

When the semiconductor laser in Example 14 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that of Example 14, each parameter may be set such that a0=0.8, a1=2.15, a2=1.8, a3=2.08 and b1=2.0, and the phase changes φ1 and φ2 of $Al_2O_3$ and $Ta_2O_5$ are 0.471712 and 1.3307, respectively. Then, no reflection occurs at the wavelength λ (=945 nm).

It should be noted that at that time, the film thickness of each layer is such that D1/D2/D3/D4/D5/D6/D7/D8/Ds=35.04/77.84/94.16/209.19/78.83/175.13/91.09/202.38/87.59 nm.

Figure 34:
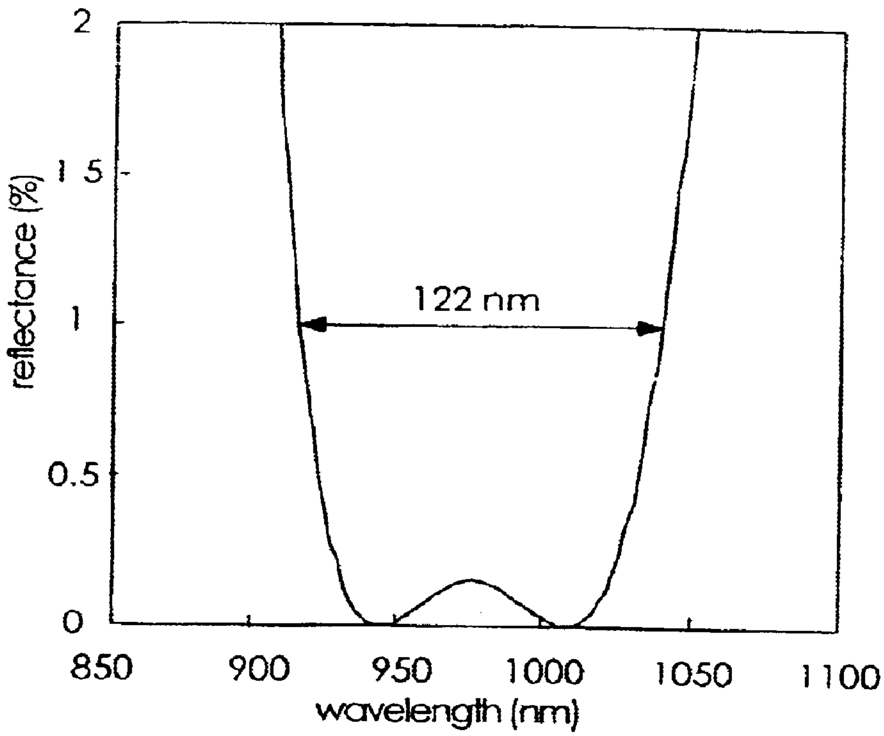

FIG. 34 is a graph showing the wavelength dependence of the reflectance of an end face of a semiconductor laser according to an embodiment (Example 15) of the present invention.

In FIG. 34, the width of the wavelength region whose reflectance is 1% or smaller is 122 nm.

EXAMPLE 16

Example 16 is configured in the same way as the example shown in FIG. 5. Example 16 is different from Example 12 in that the second-layer coating film 22*b*, the fourth-layer coating film 24*b*, and the sixth-layer coating film 32*b* are formed of Si (silicon) having a refractive index (n2) of 2.954. The first-layer coating film 22*a*, the third-layer coating film 24*a*, the fifth-layer coating film 32*a*, and the surface layer coating film 38, on the other hand, are formed of $Al_2O_3$ having a refractive index (n1) of 1.62 as in Example 12.

In Example 16, when a0=0.66, a1=2.5, a2=2.0 and b1=2.0 and the phase changes $\phi$1 and $\phi$2 of $Al_2O_3$ and Si are such that $\phi$1=0.561105 and $\phi$2=1.33856, no reflection occurs at the wavelength λ0 (=980 nm).

At that time, the film thickness of each layer is such that D1/D2/D3/D4/D5/D6/Ds=35.65/46.65/135.06/176.69/108.05/141.35/108.05 nm.

The total film thickness is 1703.92 nm, which is very thick since it is approximately 7.0 times as thick as the λ0/4 film thickness (245 nm).

Figure 35:
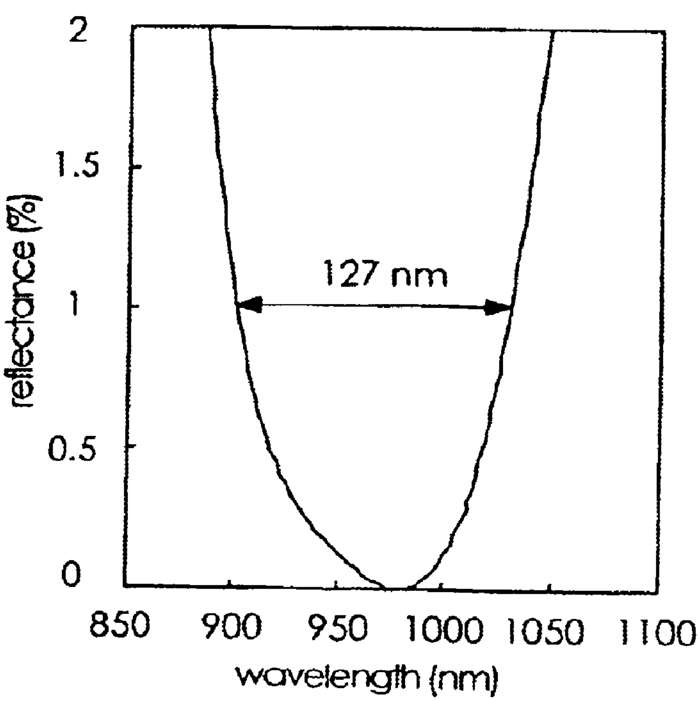

FIG. 35 is a graph showing the wavelength dependence of the reflectance of an end face of a semiconductor laser according to an embodiment (Example 16) of the present invention.

As shown in FIG. 35, the wavelength dependence (curve) of the reflectance has a U-shape (similar to a bathtub shape) in which the width of the wavelength region whose reflectance is 1% or smaller is as wide as 127 nm.

EXAMPLE 17

When the semiconductor laser in Example 16 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that in Example 16, each parameter may be set such that a0=0.66, a1=2.5, a2=2.0, and b1=2.0, and the phase changes $\phi$1 and $\phi$2 of $Al_2O_3$ and Si are 0.561105 and 1.33856, respectively. Then, no reflection occurs at the wavelength λ (=993 nm).

It should be noted that at that time, the film thickness of each layer is such that D1/D2/D3/D4/D5/D6/Ds=36.13/47.27/136.85/179.03/109.48/143.23/109.48 nm.

Figure 36:
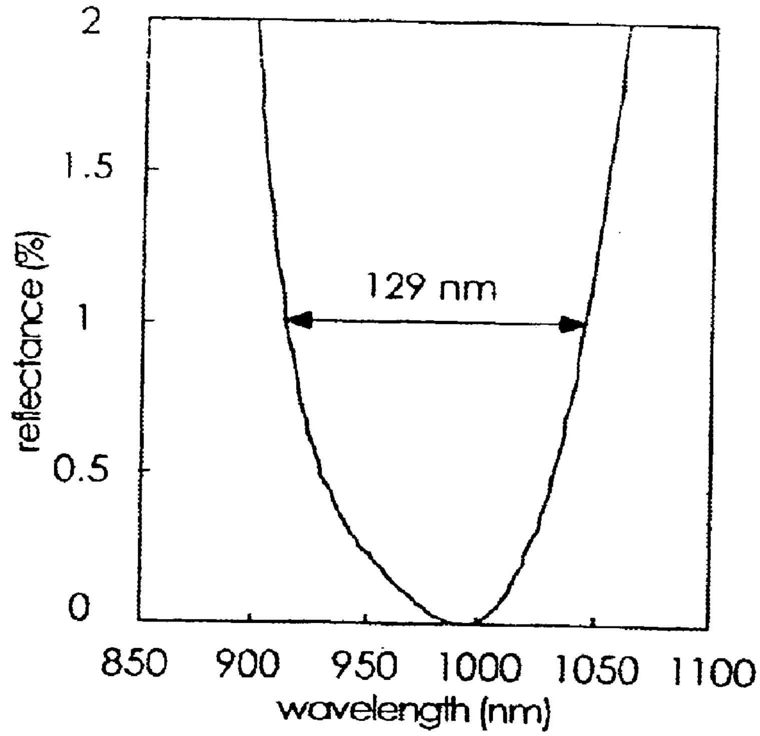

FIG. 36 is a graph showing the wavelength dependence of the reflectance of an end face of a semiconductor laser according to an embodiment (Example 17) of the present invention.

In FIG. 36, the width of the wavelength region whose reflectance is 1% or smaller is 129 nm.

EXAMPLE 18

Example 18 is configured in the same way as the example shown in FIG. 5. Example 18 is different from Example 12 in that the first-layer coating film 22*a*, the third-layer coating film 24*a*, the fifth-layer coating film 32*a*, and the surface layer coating film 38 are formed of $SiO_2$ (quartz) having a refractive index (n1) of 1.45. The second-layer coating film 22*b*, the fourth-layer coating film 24*b*, and the sixth-layer coating film 32*b*, on the other hand, are formed of $Ta_2O_5$ having a refractive index (n2) of 2.057 as in Example 12.

In Example 18, when a0=0.74, a1=2.0, a2=2.0, and b1=2.0, and the phase changes $\phi$1 and $\phi$2 of $SiO_2$ and $Ta_2O_5$ are such that $\phi$1=0.516451 and $\phi$2=1.33632, no reflection occurs at the wavelength λ0 (=980 nm).

At that time, the film thickness of each layer is such that D1/D2/D3/D4/D5/D6/Ds=41.11/74.98/111.11/202.65/111.11/202.65/111.11 nm.

The total film thickness is 1530.87 nm, which is very thick since it is approximately 6.2 times as thick as the λ0/4 film thickness (245 nm).

Figure 37:
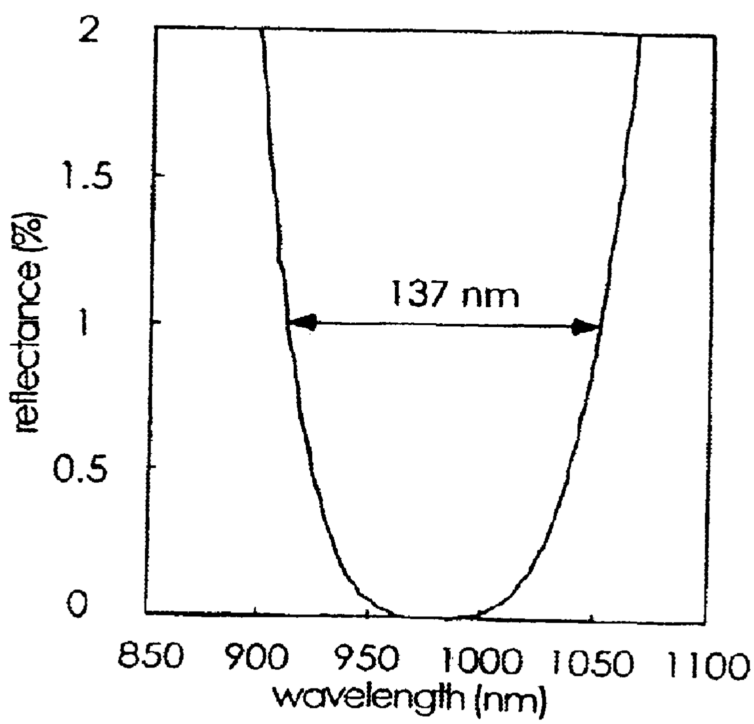

FIG. 37 is a graph showing the wavelength dependence of the reflectance of an end face of a semiconductor laser according to an embodiment (Example 18) of the present invention.

As shown in FIG. 37, the wavelength dependence (curve) of the reflectance has a U-shape (similar to a bathtub shape) in which the width of the wavelength region whose reflectance is 1% or smaller is as wide as 137 nm.

EXAMPLE 19

When the semiconductor laser in Example 18 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that in Example 18; each parameter may be set such that a0=0.74, a1=2.0, a2=2.0, and b1=2.0, and the phase changes $\phi$1 and $\phi$2 of $SiO_2$ and $Ta_2O_5$ are 0.516451 and 1.33632, respectively. Then, no reflection occurs at the wavelength λ (=978 nm).

It should be noted that at that time, the film thickness of each layer is such that D1/D2/D3/D4/D5/D6/Ds=41.03/74.83/110.88/202.34/110.88/202.34/110.88 nm.

Figure 38:
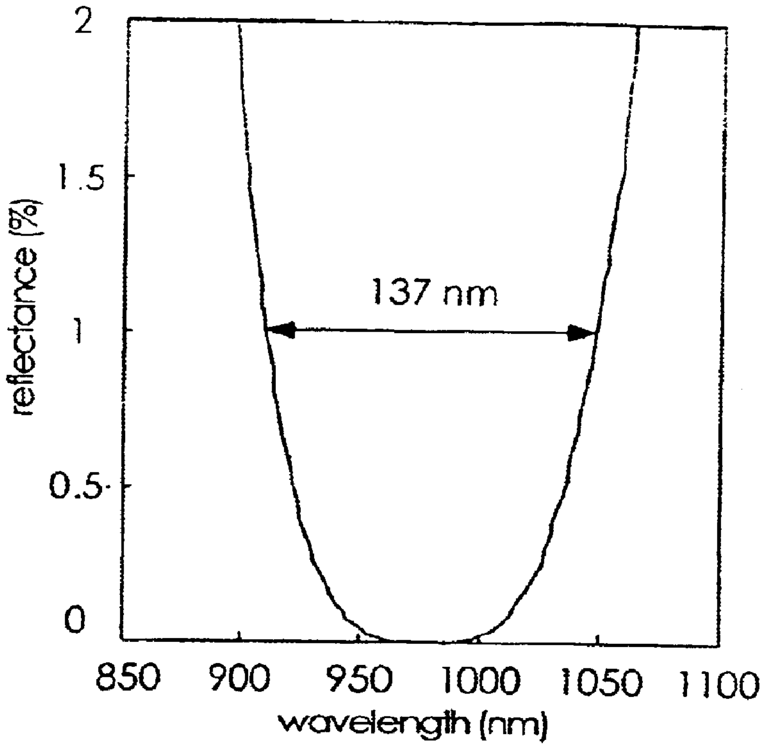

FIG. 38 is a graph showing the wavelength dependence of the reflectance of an end face of a semiconductor laser according to an embodiment (Example 19) of the present invention.

FIG. 38, the width of the wavelength region whose reflectance is 1% or smaller is 137 nm.

EXAMPLE 20

Example 20 is configured in the same way as the example shown in FIG. 5. Example 20 is different from Example 12 in that the first-layer coating film 22*a*, the third-layer coating film 24*a*, the fifth-layer coating film 32*a*, and the surface layer coating film 38 are formed of $SiO_2$ having a refractive index (n1) of 1.45, and the second-layer coating film 22*b*, the fourth-layer coating film 24*b*, and the sixth-layer coating film 32*b* are formed of Si having a refractive index (n2) of 2.954.

In Example 20, when a0=0.55, a1=2.3, a2=2.0, and b1=2.0, and the phase changes $\phi$1 and $\phi$2 of $SiO_2$ and Si are such that $\phi$1=0.570164 and $\phi$2=1.4274, no reflection occurs at the wavelengths λ0 (=980 nm).

At that time, the film thickness of each layer is such that D1/D2/D3/D4/D5/D6/Ds=33.73/41.45/141.06/173.34/122.66/150.73/122.66 nm.

The total film thickness is 1688.92 nm, which very thick since it is approximately 6.9 times as thick as the λ0/4 film thickness (245 nm).

Figure 39:
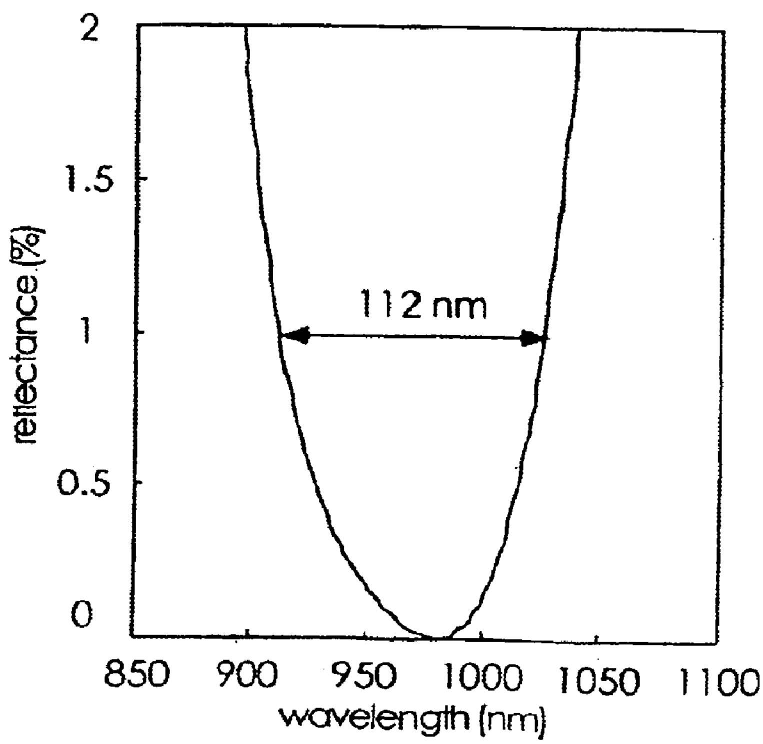

FIG. 39 is a graph showing the wavelength dependence of the reflectance of an end face of a semiconductor laser according to an embodiment (Example 20) of the present invention.

As shown in FIG. 39, the wavelength dependence (curve) of the reflectance has a U-shape (similar to a bathtub shape) in which the width of the wavelength region whose reflectance is 1% or smaller is as wide as 112 nm.

EXAMPLE 21

When the semiconductor laser in Example 20 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that in Example 20, each parameter may be set such that a0=0.55, a1=2.3, a2=2.0, and b1=2.0, and the phase changes φ1 and φ2 of $SiO_2$ and Si are 0.570164 and 1.4274, respectively. Then, no reflection occurs at the wavelength λ (=992 nm).

It should be noted that at that time, the film thickness of each layer is such that D1/D2/D3/D4/D5/D6/Ds=34.15/41.96/142.79/175.47/124.16/152.58/124.16 nm.

Figure 40:
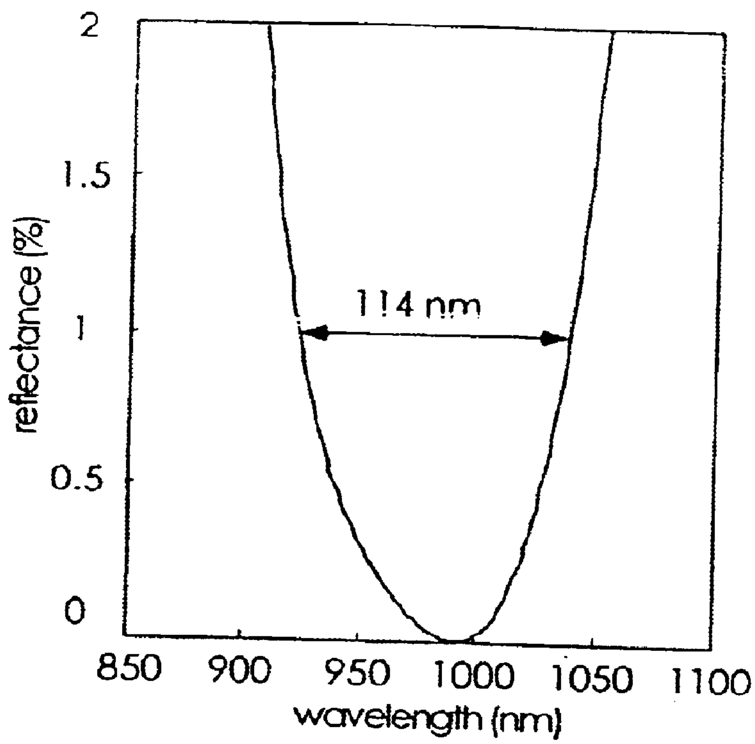

FIG. 40 is a graph showing the wavelength dependence of the reflectance of an end face of a semiconductor laser according to an embodiment (Example 21) of the present invention.

In FIG. 40, the width of the wavelength region whose reflectance is 1% or smaller is 114 nm.

Tenth Embodiment

The tenth embodiment is formed as follows.

An auxiliary layer coating film, as a sixth coating film, with a film thickness of c1*d1 made of a material having a refractive index of n2 is formed on an end face of a semiconductor laser element 12, where c1 is a positive real number; on the auxiliary layer coating film, a base coating film pair is formed of a coating film with a film thickness of a0*d1 made of a material having a refractive index of n1 and a coating film with a film thickness of a0*d2 made of a material having a refractive index n2; and on the base coating film pair, m coating film pairs (a first coating film pair to an m-th coating film pair) are formed one on another, each coating film pair consisting of a third coating film with a refractive index of n1 and a fourth coating film with a refractive index of n2 disposed on the third coating film, wherein the third coating film of the k-th coating film pair has a film thickness of ak*d1, and the fourth coating film of the k-th coating film pair has a film thickness of ak*d2, where k is 1, 2, . . . , and m, and ak is a positive real number.

Figure 41:
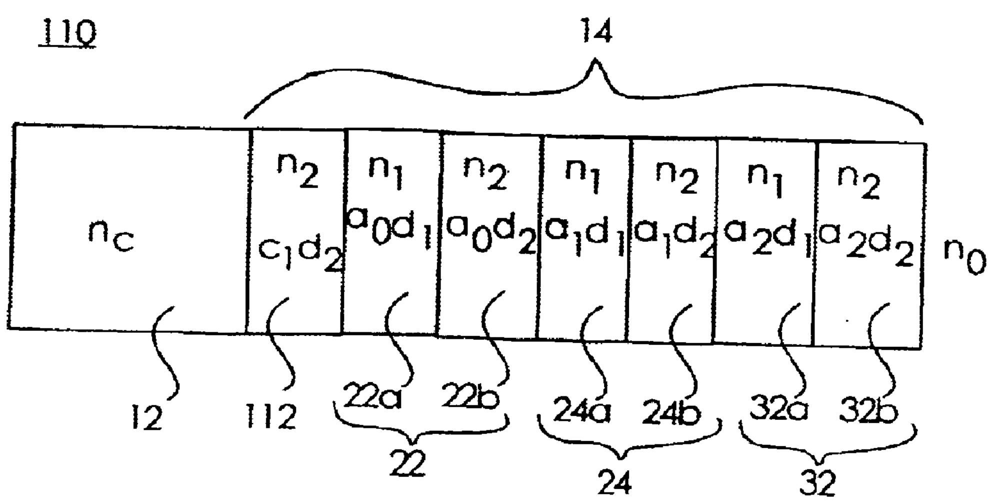
FIG. 41 is a schematic diagram showing a semiconductor laser device according to an embodiment of the present invention.

FIG. 41 is a schematic diagram showing a semiconductor laser device according to an embodiment of the present invention.

Referring to FIG. 41, reference numeral 110 denotes a semiconductor laser in which seven coating films are formed in layers on an end face of a semiconductor laser element 12.

Reference numeral 112 denotes an auxiliary layer coating film, which is formed in close contact with an end face of the semiconductor laser element 12. A first-layer coating film 22*a* with a film thickness of a0*d1 made of a material having a refractive index of n1 is formed in close contact with an interface surface of the auxiliary layer coating film 112.

A second-layer coating film 22*b* with a film thickness of a0*d2 made of a material having a refractive index of n2 is formed on the first-layer coating film 22*a*, collectively constituting the base coating film pair 22. A first coating film pair 24 and a second coating film pair 32 disposed on the first coating film 24 are formed on the base coating film pair 22 in a three-coating-film-pair structure. The first coating film pair 24 is made up of a third-layer coating film 24*a* with a film thickness of a1*d1 made of a material having a refractive index of n1 and a fourth-layer coating film 24*b* with a film thickness of a1*d2 made of a material having a refractive index of n2, while the second coating film pair 32 is made up of a fifth-layer coating film 32*a* with a film thickness of a2*d1 made of a material having a refractive index of n1 and a sixth-layer coating film 32*b* with a film thickness of a2*d2 made of a material having a refractive index of n2. The seven coating films in layers comprising the first- to sixth-layer coating films and the auxiliary layer coating film 112 collectively constitute a low-reflective coating film 14.

One interface surface of the sixth-layer coating film 32*b* is in close contact with the fifth-layer coating film 32*a* whereas the other interface surface is in contact with a free space whose refractive index n0 is equal to 1 in this embodiment.

Figure 42:
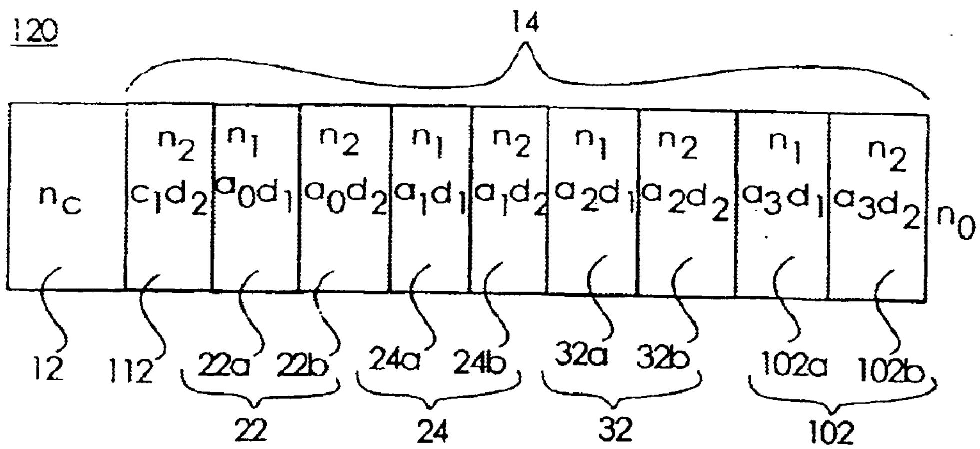
FIG. 42 is a schematic diagram showing a semiconductor laser device according to an embodiment of the present invention.

FIG. 42 is a schematic diagram showing a semiconductor laser device according to an embodiment of the present invention.

Referring to FIG. 42, reference numeral 120 denotes a semiconductor laser device.

The semiconductor laser device 120 is formed as follows.

An auxiliary layer coating film 112 is formed in close contact with an end face of a semiconductor laser element 12. A base coating film pair 22, a first coating film pair 24, and a second coating film pair 32 are formed in layers over the auxiliary layer coating film 112. Furthermore, a third coating film pair 102 is formed on the second coating film pair 32. The nine coating films in layers comprising the base coating film pair 22, the first to third coating film pairs and the auxiliary layer coating film 112 collectively constitute a low-reflective coating film 14.

One interface surface of the eighth-layer coating film 102*b* of the third coating film pair 102 is in close contact with the seventh-layer coating film 102*a* whereas the other interface surface is in contact with a free space whose refractive index n0 is equal to 1 in this embodiment.

The nonreflective conditions of both the low-reflective coating film 14 in FIG. 41 and the low-reflective coating film 14 in FIG. 42 are derived as in the second embodiment. Specifically, the film thicknesses d1 and d2 are set such that the end face on which the low-reflective coating film 14 is disposed has an amplitude reflectance r whose real part and imaginary part are equal to 0.

Furthermore, n1 and n2 are set such that one of n1 and n2 is smaller than $(nc*n0)^{1/2}$ and the other is larger than $(nc*n0)^{1/2}$. Since n0=1, the setting is made so that $(nc)^{1/2}$ exists between n1 and n2.

Especially, according to the present embodiment, the low-reflective coating film 14 is configured such that a coating film made of a material having a refractive index smaller than $(nc*n0)^{1/2}$ is in close contact with an end face of the semiconductor laser element 12.

With this arrangement, the tenth embodiment produces the same effect as that of the ninth embodiment.

In the above case where the low-reflective coating film 14 is configured such that a coating film made of a material having a refractive index smaller than $(nc*n0)^{1/2}$ is in close contact with an end face of the semiconductor laser element 12, the film thickness of the closest coating film to the semiconductor laser element 12 (the first-layer coating film 22*a* in case of the ninth embodiment and the auxiliary layer coating film 112 in the case of the tenth embodiment) has a significant influence on the reflectance distribution.

Therefore, the tenth embodiment not only produces the same effect of that of the ninth embodiment, but also has an advantage over the ninth embodiment in that the tenth embodiment can comparatively freely set the closest coating film to the end face of the semiconductor laser element 12, whereas the ninth embodiment needs to set the first-layer coating film 22*a* and the second-layer coating film 22*b* in combination. Thus, the tenth embodiment can more freely sets the shape of the portion of the curve in which the reflectance is 1% or smaller. For example, it is possible to form the portion in which the reflectance is 1% or smaller in a more desirable shape.

Accordingly, it is possible to further enhance the degree of freedom for setting the wavelength dependence of the reflectance of an end face on which a coating film layer is disposed, making it easy to provide an optical semiconductor device having a low-reflective coating film layer whose reflectance has a desired wavelength dependence selected from various types of wavelength dependence.

Further, a refractive index of a coating film closest to the end face of the optical semiconductor element is smaller than a refractive index of a coating film disposed adjacent to and over the coating-film closest to the end face.

Accordingly, it is possible to increase the film thickness of the coating film as well as widening the low-reflective region, making it possible to provide an optical semiconductor device which has good heat conductivity and in which the heat degradation of the end faces of the optical semiconductor element is reduced.

Further yet, the coating film disposed closest to the end face of the optical semiconductor element is made of alumina, and the coating film disposed adjacent to and over the coating film closest to end face is made of tantalum oxide.

Accordingly, it is possible to increase the film thicknesses of the coating films as well as widening the low-reflective region by employing simple component materials, making it possible to provide a low-cost optical semiconductor device in which the heat degradation of the end faces of the optical semiconductor element is reduced.

EXAMPLE 22

Example 22 employs seven films in layers as shown in FIG. 41.

Referring to FIG. 41, the equivalent refractive index nc of the semiconductor laser element 12 is set to be 3.37; and the auxiliary layer coating film 112, the second-layer coating film 22*b*, the fourth-layer coating film 24*b*, and the sixth-layer coating film 32*b* are formed of $Al_2O_3$ having a refractive index (n2) of 1.62.

Furthermore, the first-layer coating film 22*a*, the third-layer coating film 24*a*, and the fifth-layer coating film 32*a* are formed of $Ta_2O_5$ having a refractive index (n1) of 2.057.

Let the film thickness of each layer coating film be expressed as follows. The film thickness of D0 of the auxiliary layer coating film 112 is expressed as c1*d2; the film thickness D1 of the first-layer coating film 22*a* as a0*d1; the film thickness D2 of the second-layer coating film 22*b* as a0*d2; the film thickness D3 of the third-layer coating film 24*a* as a1*d1; the film thickness D4 of the fourth-layer coating film 24*b* as a1*d2; the film thickness D5 of the fifth-layer coating film 32*a* as a2*d1; and the film thickness D6 of the sixth-layer coating film 32*b* as a2*d2. In this case, when c1=0.38, a0=2.0, a1=2.0, and a2=2.0, and the phase changes φ1 and φ2 of $Ta_2O_5$ and $Al_2O_3$ are such that φ1=0.52568 and φ2=0.963283, no reflection occurs at the wavelengthλ0 (=980 nm).

At that time, the film thickness of each layer is such that D0/D1/D2/D3/D4/D5/D6=35.24/79.72/185.49/79.72/185.49/79.72/185.49 nm. The total film thickness (n2*D0+n1*D1+n2*D2+n1*D3+n2*D4+n1*D5+n2*D6) is 1450.50 nm, which is very thick since it is approximately 5.9 times as thick as the λ0/4 film thickness (245 nm).

Figure 43:
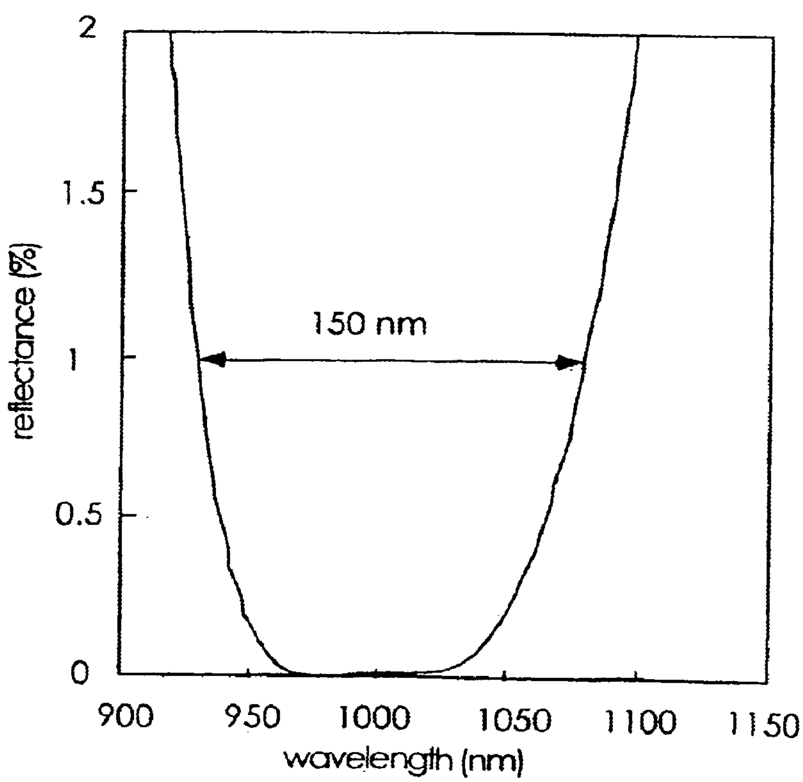
FIGS. 43–52 are graphs showing the wavelength dependence of the reflectance of an end face of a semiconductor laser according to embodiments (Example 22–31) of the present invention.

FIG. 43 is a graph showing the wavelength dependence of the reflectance of an end face of a semiconductor laser according to an embodiment (Example 22) of the present invention.

As shown in FIG. 43, the wavelength dependence (curve) of the reflectance has a U-shape (similar to a bathtub shape) in which the width of the wavelength region whose reflectance is 1% or smaller is as wide as 150 nm.

EXAMPLE 23

When the semiconductor laser in Example 22 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that of Example 22, each parameter may be set such that c1=0.38, a0=2.0, a1=2.0, and a2=2.0, and the phase changes φ1 and φ2 of $Ta_2O_5$ and $Al_2O_3$ are 0.52568 and 0.963283, respectively. Then, no reflection occurs at the wavelength λ (=956 nm).

It should be noted that at that time, the film thickness of each layer is such that D0/D1/D2/D3/D4/D5/D6=34.38/77.77/180.95/77.77/180.95/77.77/180.95 nm.

Figure 44:
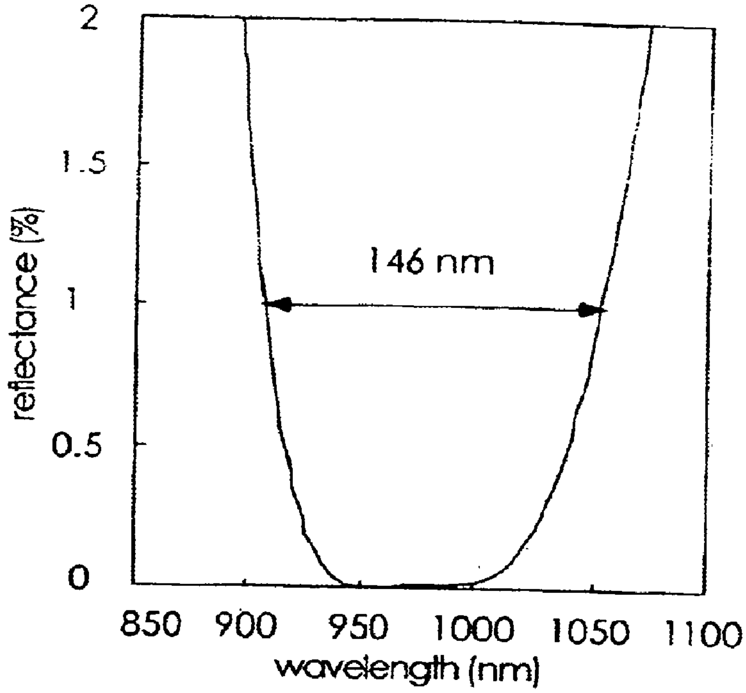

FIG. 44 is a graph showing the wavelength dependence of the reflectance of an end face of a semiconductor laser according to an embodiment (Example 23) of the present invention.

In FIG. 44, the width of the wavelength region whose reflectance is 1% or smaller is 146 nm.

EXAMPLE 24

Example 24 employs nine films in layers as shown in FIG. 42.

FIG. 42 shows the configuration of Example 24 employing nine films in layers.

Referring to FIG. 42, the equivalent refractive index nc of the semiconductor laser element 12 is set to be 3.37; and the auxiliary layer coating film 112, the second-layer coating film 22*b*, the fourth-layer coating film 24*b*, the sixth-layer coating film 32*b*, and the eighth-layer coating film 102*b* are formed of $Al_2O_3$ having a refractive index (n2) of 1.62.

Furthermore, the first-layer coating film 22*a*, the third-layer coating film 24*a*, the fifth-layer coating film 32*a*, and the seventh-layer coating film 102*a* are formed of $Ta_2O_5$ having a refractive index (n1) of 2.057.

Let the film thickness of each layer coating film be expressed as follows. The film thickness of D0 of the auxiliary layer coating film 112 is expressed as c1*d2; the film thickness D1 of the first-layer coating film 22*a* as a0*d1; the film thickness D2 of the second-layer coating film 22*b* as a0*d2; the film thickness D3 of the third-layer coating film 24*a* as a1*d1; the film thickness D4 of the fourth-layer coating film 24*b* as a1*d2; the film thickness D5 of the fifth-layer coating film 32*a* as a2*d1; the film thickness D6 of the sixth-layer coating film 32*b* as a2*d2; the film thickness D7 of the seventh-layer coating film 102*a* as a3*d1; and the film thickness D8 of the eighth-layer coating film 102*b* as a3*d2. In this case, when c1=0.58, a0=2.0, a1=2.0, a2=2.0, and a3=2.0, and the phase changes φ1 and φ2 of $Ta_2O_5$ and $Al_2O_3$ are such that φ1=0.382042 and φ2=1.05165, no reflection occurs at the wavelength λ0 (=980 nm).

At that time, the film thickness of each layer is such that D0/D1/D2/D3/D4/D5/D6/D7/D8=58.73/57.94/202.50/57.94/202.50/57.94/202.50/57.94/202.50 nm. The total film thickness (n2*D0+n1*D1+n2*D2+n1*D3+n2*D4+n1*D5+n2*D6+n1*D7+n2*D8) is 1884.06 nm, which is very thick since it is approximately 7.7 times as thick as the λ0/4 film thickness (245 nm).

Figure 45:
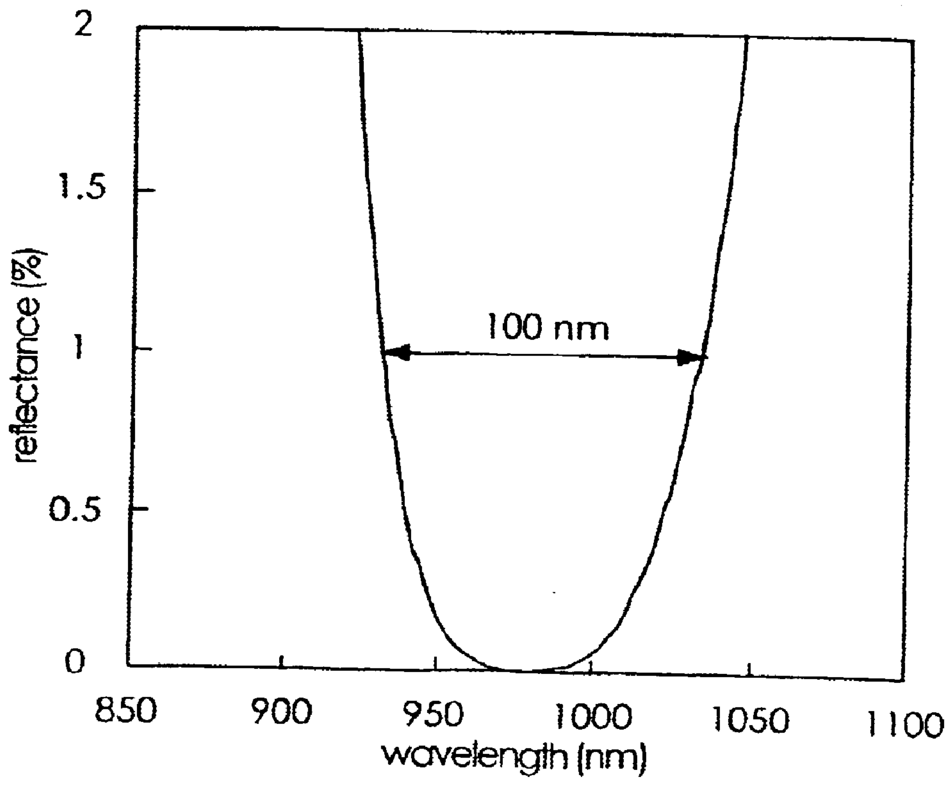

FIG. 45 is a graph showing the wavelength dependence of the reflectance of an end face of a semiconductor laser according to an embodiment (Example 24) of the present invention.

As shown in FIG. 45, the wavelength dependence (curve) of the reflectance has a U-shape (similar to a bathtub shape) in which the width of the wavelength region whose reflectance is 1% or smaller is as wide as 100 nm.

EXAMPLE 25

When the semiconductor laser in Example 24 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that of Example 24, each parameter may be set such that c1=0.58, a0=2.0, a1=2.0, a2=2.0, and a3=2.0, and the phase changes φ1 and φ2 of $Ta_2O_5$ and $Al_2O_3$ are 0.382042 and 1.05165, respectively. Then, no reflection occurs at the wavelength λ (=978 nm).

It should be noted that at that time, the film thickness of each layer is such that D0/D1/D2/D3/D4/D5/D6/D7/D8=58.61/57.82/202.09/57.82/202.09/57.82/202.09/57.82/202.09 nm.

Figure 46:
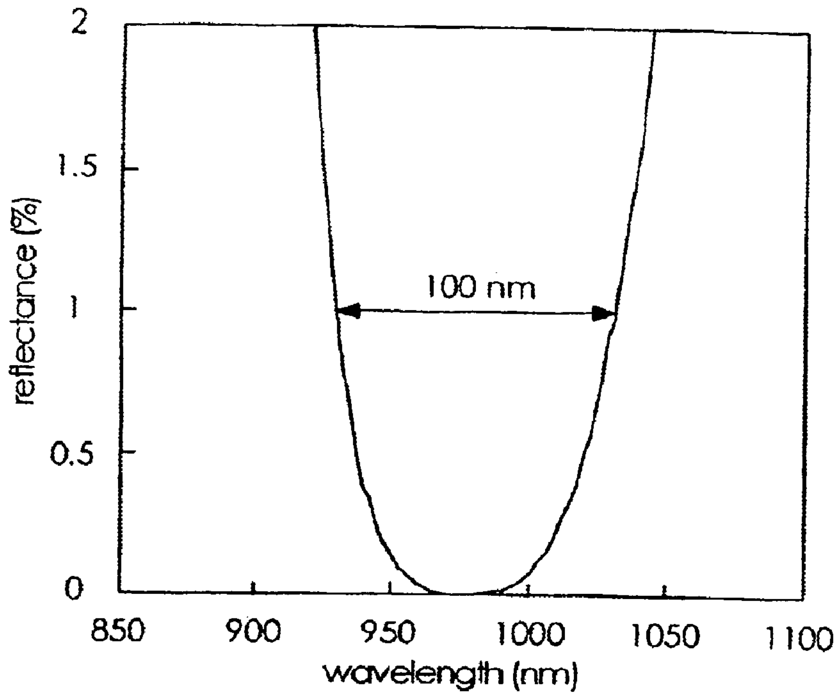

FIG. 46 is a graph showing the wavelength dependence of the reflectance of an end face of a semiconductor laser according to an embodiment (Example 25) of the present invention.

In FIG. 46, the width of the wavelength region whose reflectance is 1% or smaller is 100 nm.

EXAMPLE 26

Example 26 employs seven films in layers as shown in FIG. 41.

Referring to FIG. 41, the equivalent refractive index nc of the semiconductor laser element 12 is set to be 3.37; and the auxiliary layer coating film 112, the second-layer coating film 22*b*, the fourth-layer coating film 24*b*, and the sixth-layer coating film 32*b* are formed of $Al_2O_3$ having a refractive index (n2) of 1.62.

Furthermore, the first-layer coating film 22*a*, the third-layer coating film 24*a*, and the fifth-layer coating film 32*a* are formed of Si having a refractive index (n1) of 2.954.

In Example 26, when c1=0.75, a0=1.98, a1=2.0, and a2=2.0, and the phase changes φ1 and φ2 of Si and $Al_2O_3$ are such that φ1=0.182114 and φ2=1.08902, no reflection occurs at the wavelength λ0 (=980 nm).

At that time, the film thickness of each layer is such that D0/D1/D2/D3/D4/D5/D6=78.64/19.04/207.60/19.23/209.70/19.23/209.70 nm. The total film thickness is 1312.99 nm, which is very thick since it is approximately 5.4 times as thick as the λ0/4 film thickness (245 nm).

Figure 47:
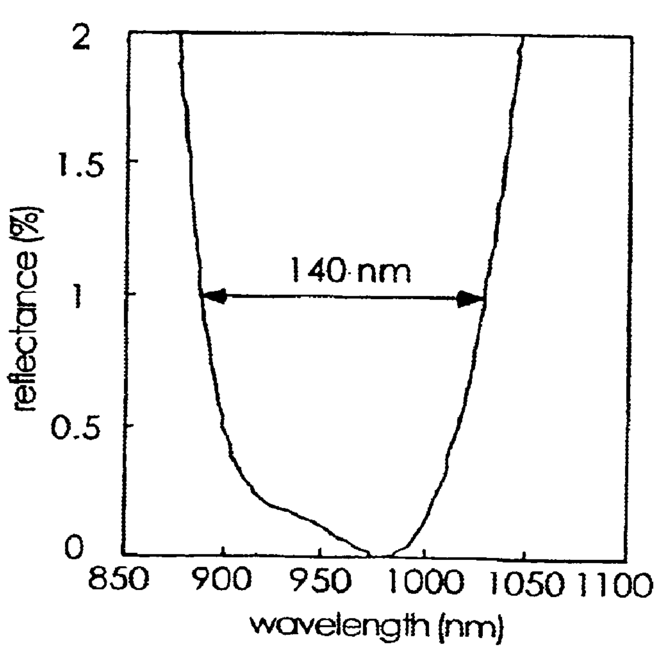

FIG. 47 is a graph showing the wavelength dependence of the reflectance of an end face of a semiconductor laser according to an embodiment (Example 26) of the present invention.

As shown in FIG. 47, the wavelength dependence (curve) of the reflectance has a U-shape (similar to a bathtub shape) in which the width of the wavelength region whose reflectance is 1% or smaller is as wide as 140 nm.

EXAMPLE 27

When the semiconductor laser in Example 26 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that of Example 26, each parameter may be set such that c1=0.75, a0=1.98, a1=2.0, and a2=2.0, and the phase changes φ1 and φ2 of Si and $Al_2O_3$ are 0.182114 and 1.08902, respectively. Then, no reflection occurs at the wavelength λ (=1002 nm).

It should be noted that at that time, the film thickness of each layer is such that D0/D1/D2/D3/D4/D5/D6=80.40/19.47/212.26/19.66/214.41/19.66/214.41 nm.

Figure 48:
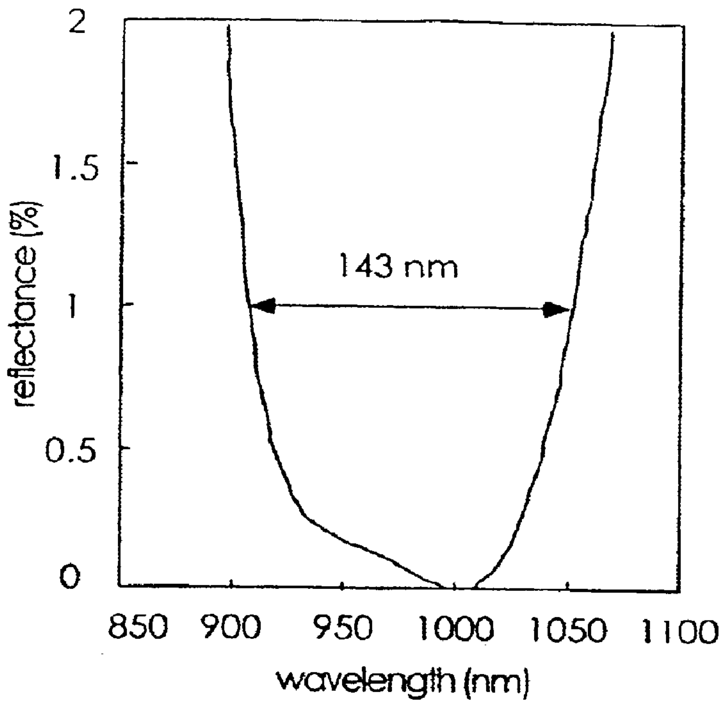

FIG. 48 is a graph showing the wavelength dependence of the reflectance of an end face of a semiconductor laser according to an embodiment (Example 27) of the present invention.

In FIG. 48, the width of the wavelength region whose reflectance is 1% or smaller is 143 nm.

EXAMPLE 28

Example 28 employs seven films in layers as shown in FIG. 41.

Referring to FIG. 41, the equivalent refractive index nc of the semiconductor laser element 12 is set to be 3.37; and the auxiliary layer coating film 112, the second-layer-coating film 22*b*, the fourth-layer coating film 24*b*, and the sixth-layer coating film 32*b* are formed of $SiO_2$ having a refractive index (n2) of 1.45.

Furthermore, the first-layer coating film 22*a*, the third-layer coating film 24*a*, and the fifth-layer coating film 32*a* are formed of $Ta_2O_5$ having a refractive index (n1) of 2.057.

In Example 28, when c1=0.2, a0=2.7, a1=2.0, and a2=2.0, and the phase changes φ1 and φ2 of $Ta_2O_5$ and $SiO_2$ are such that φ1=0.302025 and φ2=1.0705, no reflection occurs at the wavelength λ0 (=980 nm).

At that time, the film thickness of each layer is such that D0/D1/D2/D3/D4/D5/D6=23.03/61.83/310.91/45.80/230.30/45.80/230.30 nm. The total film thickness is 1437.69, which is very thick since it is approximately 5.9 times as thick as the λ0/4 film thickness (245 nm).

Figure 49:
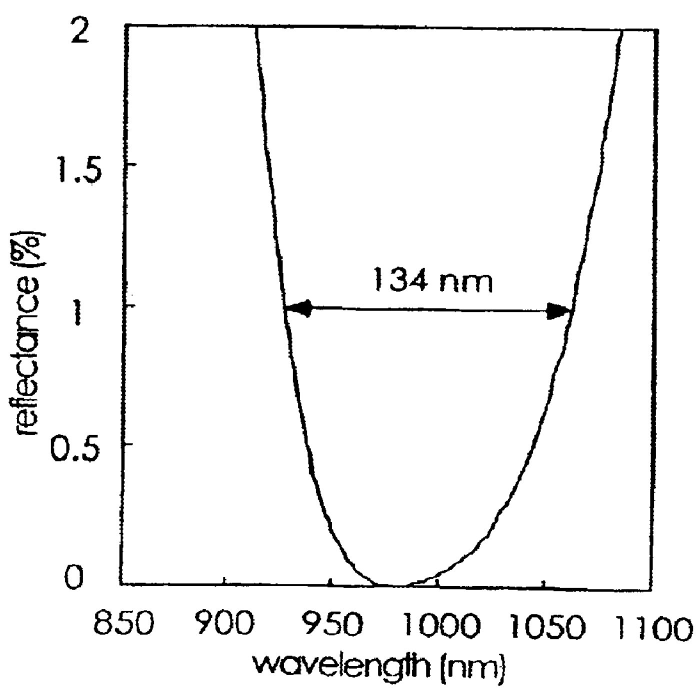

FIG. 49 is a graph showing the wavelength dependence of the reflectance of an end face of a semiconductor laser according to an embodiment (Example 28) of the present invention.

As shown in FIG. 49, the wavelength dependence (curve) of the reflectance has a U-shape (similar to a bathtub shape) in which the width of the wavelength region whose reflectance is 1% or smaller is as wide as 134 nm.

EXAMPLE 29

When the semiconductor laser in Example 28 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that of Example 28, each parameter may be set such that c1=0.2, a0=2.7, a1=2.0, and a2=2.0, and the phase changes φ1 and φ2 of $Ta_2O_5$ and $SiO_2$ are 0.302025 and 1.0705, respectively. Then, no reflection occurs at the wavelength λ (=966 nm).

It should be noted that at that time, the film thickness of each layer is such that D0/D1/D2/D3/D4/D5/D6=22.70/60.95/306.46/45.15/227.01/45.15/227.01 nm.

Figure 50:
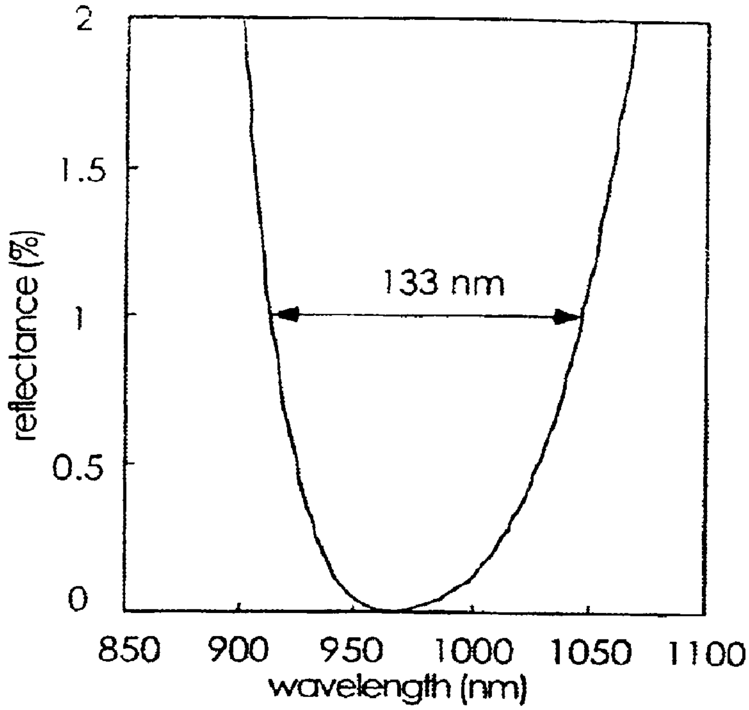

FIG. 50 is a graph showing the wavelength dependence of the reflectance of an end face of a semiconductor laser according to an embodiment (Example 29) of the present invention.

In FIG. 50, the width of the wavelength region whose reflectance is 1% or smaller is 133 nm.

EXAMPLE 30

Example 30 employs seven films in layers as shown in FIG. 41.

Referring to FIG. 41, the equivalent refractive index nc of the semiconductor laser element 12 is set to be 3.37; and the auxiliary layer coating film 112, the second-layer coating film 22*b*, the fourth-layer coating film 24*b*, and the sixth-layer coating film 32*b* are formed of $SiO_2$ having a refractive index (n2) of 1.45.

Furthermore, the first-layer coating film 22*a*, the third-layer coating 24*a*, and the fifth-layer coating film 32*a* are formed of Si having a refractive index (n1) of 2.954.

In Example 30, when c1=0.5, a0=2.5, a1=2.0, and a2=2.0, and the phase changes φ1 and φ2 of Si and $SiO_2$ are such that φ1=0.131051 and φ2=1.16158, no reflection occurs at the wavelength λ0 (=980 nm).

At that time, the film thickness of each layer is such that D0/D1/D2/D3/D4/D5/D6=62.47/17.30/312.37/13.84/249.90/13.84/249.90 nm. The total film thickness is 1401.10 nm, which is very thick since it is 5.7 times as thick as the λ0/4 film thickness (245 nm).

Figure 51:
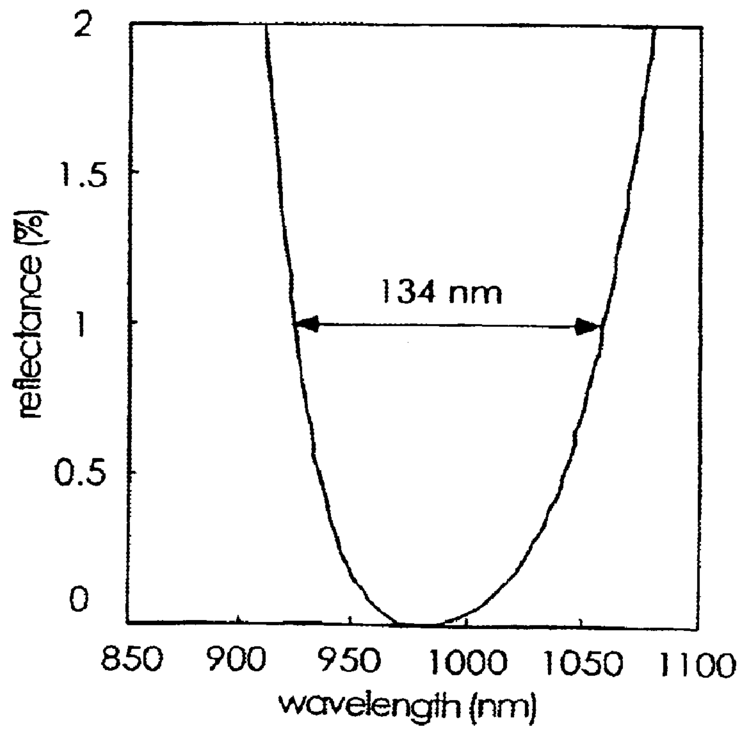

FIG. 51 is a graph showing the wavelength dependence of the reflectance of an end face of a semiconductor laser according to an embodiment (Example 30) of the present invention.

As shown in FIG. 51, the wavelength dependence (curve) of the reflectance has a U-shape (similar to a bathtub shape) in which the width of the wavelength region whose reflectance is 1% or smaller is as wide as 134 nm.

EXAMPLE 31

When the semiconductor laser in Example 30 is combined with a fiber grating, it is desirable to set the wavelength λ0 of the semiconductor laser light at the center of the reflectance distribution having the bathtub shape.

In this case, to set the wavelength λ0 (=980 nm) as the center wavelength of the wavelength region whose reflectance is 1% assuming that the configuration of the low-reflective coating film 14 is the same as that of Example 30, each parameter may be set such that c1=0.5, a0=2.5, a1=2.0, and a2=2.0, and the phase changes φ1 and φ2 of Si and $SiO_2$ are 0.131051 and 1.16158, respectively. Then, no reflection occurs at the wavelength λ (=969 nm).

It should be noted that at that time, the film thickness of each layer is such that D0/D1/D2/D3/D4/D5/D6=61.77/17.10/308.86/13.68/247.09/13.68/247.09 nm.

Figure 52:
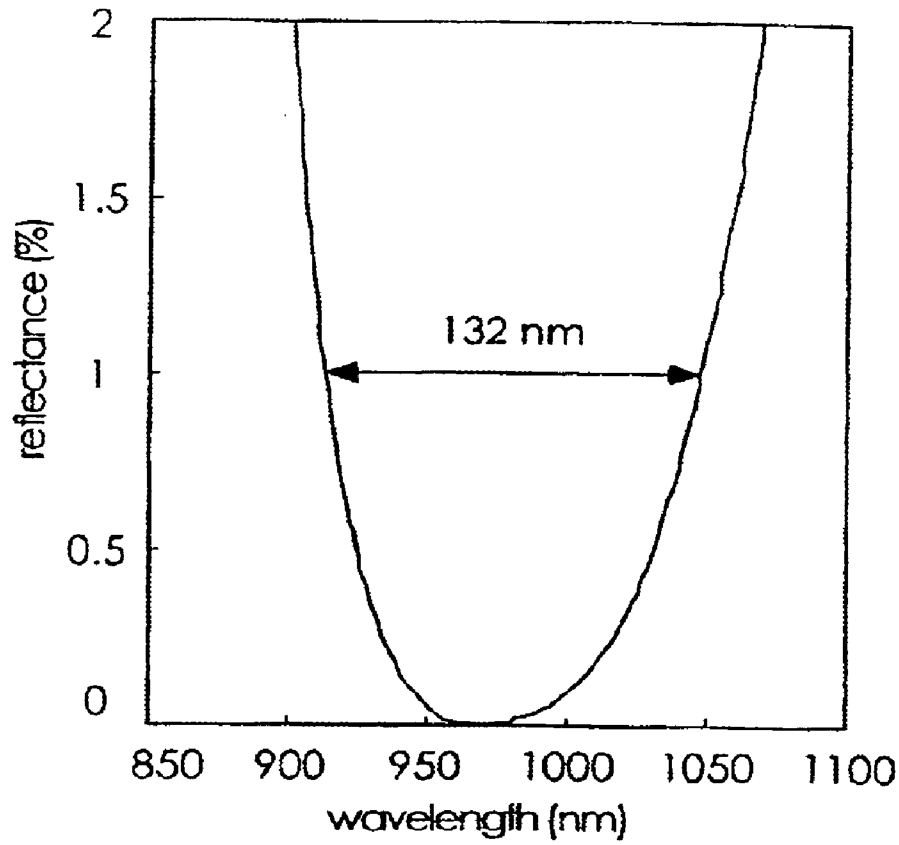
Figure 53:
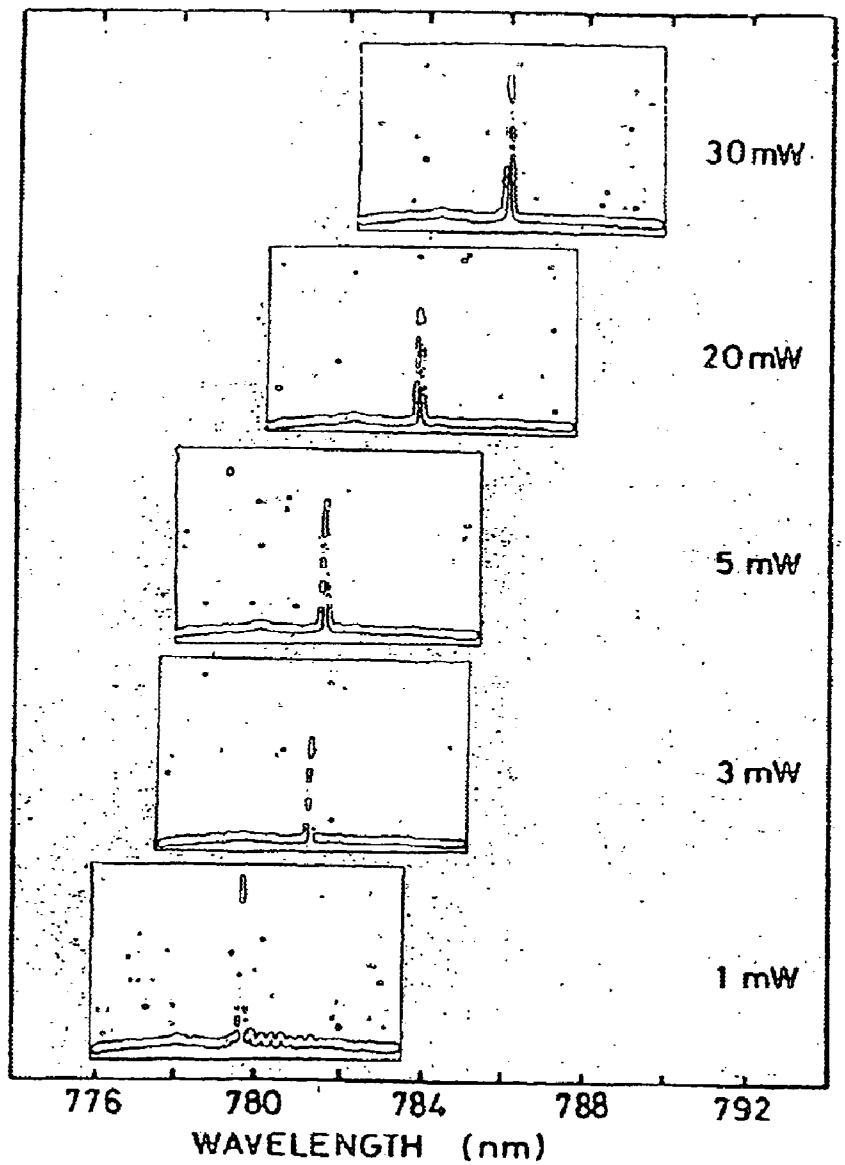
FIG. 53 is a schematic diagram showing an output dependence of the wavelength of a conventional semiconductor laser.
Figure 54:
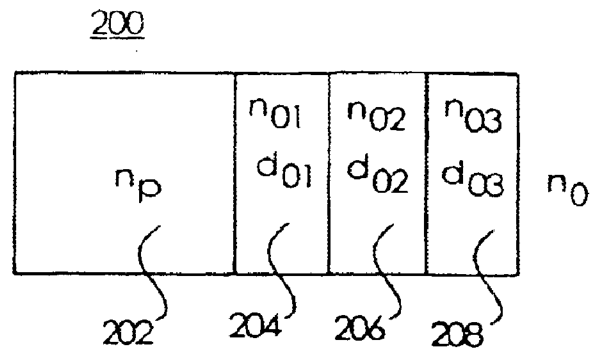
FIG. 54 is a schematic diagram showing the configuration of a non-reflective film of a conventional semiconductor laser.
Figure 55:
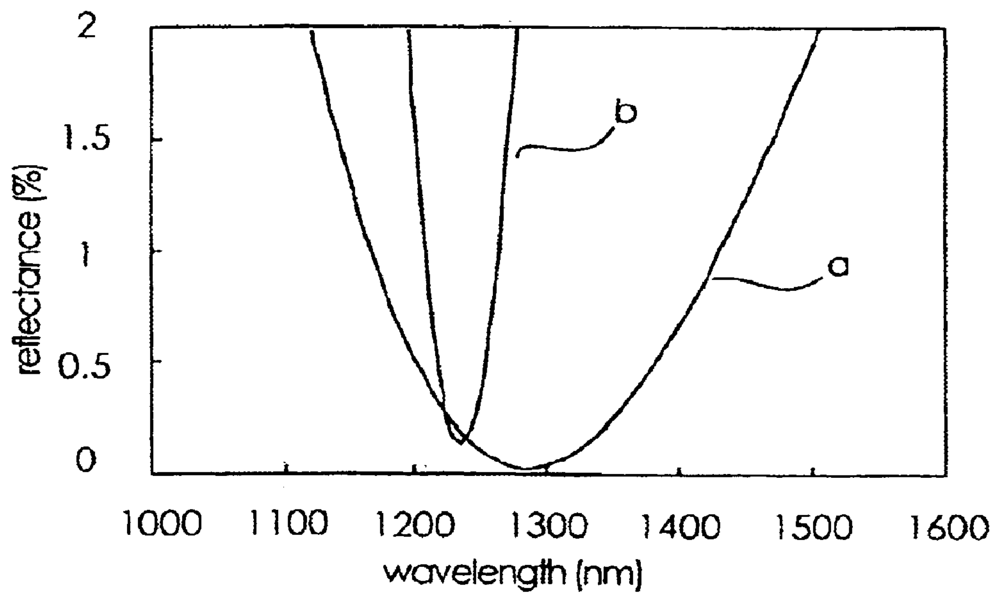
FIG. 55 includes graphs each showing the wavelength dependence of the reflectance of a conventional non-reflective film.

FIG. 52 is a graph showing the wavelength dependence of the reflectance of an end face of a semiconductor laser according to an embodiment (Example 31) of the present invention.

In FIG. 52, the width of the wavelength region whose reflectance is 1% or smaller is 132 nm.

Eleventh Embodiment

An eleventh embodiment of the present invention is obtained as a result of extending the sixth embodiment.

A semiconductor laser device according to this embodiment is configured such that the wavelength at which no reflection occurs is on the longer-wavelength side of the oscillation wavelength decided by the configuration of the active layer of the semiconductor laser. Specifically, a coating film is provided on the emitting end face of the resonator of the semiconductor laser such that the reflectance is minimized at a predetermined wavelength λ0, and the wavelength at which the gain of the semiconductor laser is maximized is on the shorter-wavelength side of the wavelength at which the reflectance of the coating film layer is minimized. As a result, the total loss of the semiconductor laser becomes equal to the gain of the semiconductor laser at a wavelength in a wavelength region in which the reflectance of the end face decreases with increasing wavelength.

The coating film of this semiconductor laser device is configured in the same way as that of the tenth embodiment. That is, the configuration of the semiconductor laser device of the eleventh embodiment is the same as that of either the semiconductor laser device 110 having the low-reflective coating film 14 made up of 7 layers shown in FIG. 41 or the semiconductor laser device 122 having the low-reflective coating film 14 made up of 9 layers shown in FIG. 42.

EXAMPLE 32

Example 32 employs seven films in layers as shown in FIG. 41.

Referring to FIG. 41, the equivalent refractive index nc of the semiconductor laser element 12 is set to 3.37; and the auxiliary layer coating film 112, the second-layer coating film 22*b*, the fourth-layer coating film 24*b*, and the sixth-layer coating film 32*b* are formed of $Al_2O_3$ having a refractive index (n2) of 1.63.

Furthermore, the first-layer coating film 22*a*, the third-layer coating film 24*a*, the fifth-layer coating film 32*a* are formed of $Ta_2O_5$ having a refractive index (n1) of 2.00.

Let the film thickness of each layer coating film be expressed as follows. The film thickness of D0 of the auxiliary layer coating film 112 is expressed as c1*d2; the film thickness D1 of the first-layer coating film 22*a* as a0*d1; the film thickness D2 of the second-layer coating film 22*b* as a0*d2; the film thickness D3 of the third-layer coating film 24*a* as a1*d1; the film thickness D4 of the fourth-layer coating film 24*b* as a1*d2; the film thickness D5 of the fifth-layer coating film 32*a* as a2*d1; the film thickness of the sixth-layer coating film 32*b* as a2*d2. In this case, when c1=0.30, a0=1.75, a1=2.00, and a2=2.00, and the phase changes φ1 and φ2 of $Ta_2O_5$ and $Al_2O_3$ respectively are such that $\phi 1=0.788239$ and $\phi 2=0.826943$, no reflection occurs at the wavelength $\lambda 0$ (=1000 nm).

At that time, the film thickness of each layer is such that D0/D1/D2/D3/D4/D5/D6=24.22/109.77/141.30/125.45/161.49/125.45/161.49 nm. The total film thickness (n2*D0+n1*D1+n2*D2+n1*D3+n2*D4+n1*D5+n2*D6) is 1517.60 nm, which is very thick since it is approximately 6.1 times as thick as the $\lambda 0/4$ film thickness (250 nm).

Figure 56:
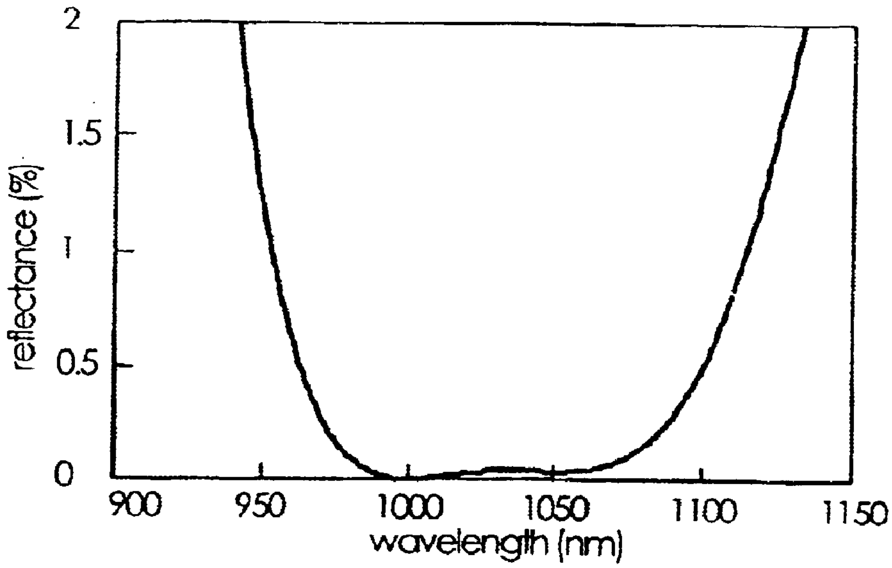
FIG. 56 is a graph showing the wavelength dependence of the reflectance of an end face of a semiconductor laser according to an embodiment of the present invention.

FIG. 56 is a graph showing the wavelength dependence of the reflectance of an end face of a semiconductor laser according to an embodiment (Example 32) of the present invention.

As shown in FIG. 56, the wavelength dependence (curve) of the reflectance has a U-shape (similar to a bathtub shape) in which the wavelength region whose reflectance is 1% or smaller ranges from 954 nm to 1114 nm with its center at the wavelength 1034 nm. Therefore, the wavelength 1000 nm at which no reflection occurs is on the shorter-wavelength side of the center wavelength of the wavelength region in which the reflectance is 1% or smaller.

When the wavelength at which no reflection occurs exists on the shorter-wavelength side of the center wavelength of the wavelength region in which the reflectance is 1% or smaller, as described above, a variation in the refractive indices or the film thicknesses of the materials constituting the low-reflective coating film 14 does not affect the reflectance of the low-reflective coating film 14 very much, that is, the reflectance of the low-reflective coating film 14 does not deviate from its design value by a large amount, making it easy to manufacture the low-reflective coating film 14, including its material selection and formation. Examples 33 and 34 described below also produces the same effect.

EXAMPLE 33

Example 33 also employs seven films in layers as shown in FIG. 41.

Referring to FIG. 41, the equivalent refractive index nc of the semiconductor laser element 12 is set to 3.37; and the auxiliary layer coating film 112, the second-layer coating film 22b, the fourth-layer coating film 24b, and the sixth-layer coating film 32b are formed of $Al_2O_3$ having a refractive index (n2) of 1.63.

Furthermore, the first-layer coating film 22a, the third-layer coating film 24a, and the fifth-layer coating film 32a are formed of $Ta_2O_5$ having a refractive index (n1) of 2.00.

Let the film thickness of each layer coating film be expressed as follows. The film thickness of D0 of the auxiliary layer coating film 112 is expressed as c1*d2; the film thickness D1 of the first-layer coating film 22a as a0*d1; the film thickness D2 of the second-layer coating film 22b as a0*d2; the film thickness D3 of the third-layer coating film 24a as a1*d1; the film thickness D4 of the fourth-layer coating film 24b as a1*d2; the film thickness D5 of the fifth-layer coating film 32a as a2*d1; and the sixth-layer coating film 32b as a2*d2. In this case, when c1=0.22, a0=1.80, a1=2.10, and a2=2.00, and the phase changes $\phi 1$ and $\phi 2$ of $Ta_2O_5$ and $Al_2O_3$ respectively are such that $\phi 1=0.800845$ and $\phi 2=0.785781$, no reflection occurs at the wavelength $\lambda 0$ (=1000 nm).

At that time, the film thickness of each layer is such that D0/D1/D2/D3/D4/D5/D6=15.34/114.71/138.10/133.83/161.12/127.46/153.45 nm. The total film thickness (n2*D0+n1*D1+n2*D2+n1*D3+n2*D4+n1*D5+n2*D6) is 1514.85 nm, which is very thick since it is approximately 6.1 times as thick as the $\lambda 0/4$ film thickness (250 nm).

Figure 57:
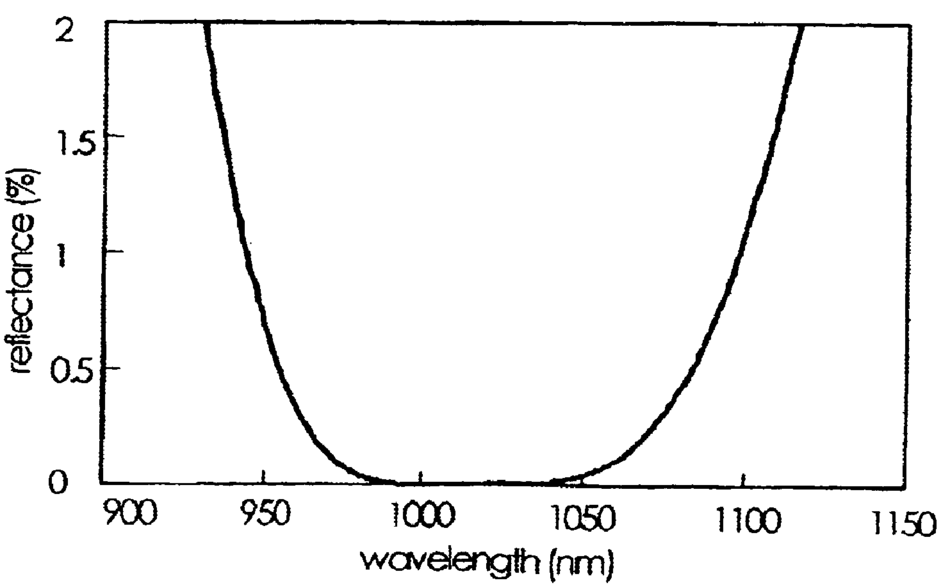
FIG. 57 is a graph showing the wavelength dependence of the reflectance of an end face of a semiconductor laser according to an embodiment of the present invention.

FIG. 57 is a graph showing the wavelength dependence of the reflectance of an end face of a semiconductor laser according to an embodiment (Example 33) of the present invention.

As shown in FIG. 57, the wavelength dependence (curve) of the reflectance has a U-shape (similar to a bathtub shape) in which the wavelength region whose reflectance is 1% or smaller ranges from 944 nm to 1098 nm with its center at the wavelength 1021 nm. Therefore, the wavelength 1000 nm at which no reflection occurs is on the shorter-wavelength side of the center wavelength of the wavelength region in which the reflectance is 1% or smaller.

EXAMPLE 34

Example 34 employs nine films in layers as shown in FIG. 42.

Referring to FIG. 42, the equivalent refractive index nc of the semiconductor laser element 12 is set to 3.37; and the auxiliary layer coating film 112, the second-layer coating film 22b, the fourth-layer coating film 24b, the sixth-layer coating film 32b, and the eighth-layer coating film 102b are formed of $Al_2O_3$ having a refractive index (n2) of 1.63.

Furthermore, the first-layer coating film 22a, the third-layer coating film 24a, the fifth-layer coating film 32a, and the seventh-layer coating film 102a are formed of $Ta_2O_5$ having a refractive index (n1) of 2.00.

Let the film thickness of each layer coating film be expressed as follows. The film thickness of D0 of the auxiliary layer coating film 112 is expressed as c1*d2; the film thickness D1 of the first-layer coating film 22a as a0*d1; the film thickness D2 of the second-layer coating film 22b as a0*d2; the film thickness D3 of the third-layer coating film 24a as a1*d1; the film thickness D4 of the fourth-layer coating film 24a as a1*d2; the film thickness D5 of the fifth-layer coating film 32a as a2*d1; the film thickness D6 of the sixth-layer coating film 32b as a2*d2; the film thickness D7 of the seventh-layer coating film 102a as a3*d1; and the film thickness D8 of the eighth layer coating film 102b as a3*d2. In this case, when c1=0.58, a0=1.95, a1=2.00, a2=2.00, and a3=2.00, and the phase changes $\phi 1$ and $\phi 2$ of $Ta_2O_5$ and $Al_2O_3$ respectively are such that $\phi 1=0.40465$ and $\phi 2=1.12054$, no reflection occurs at the wavelength $\lambda 0$ (=1000 nm).

At that time, the film thickness of each layer is such that D0/D1/D2/D3/D4/D5/D6/D7/D8=63.46/62.79/213.35/64.40/218.82/64.40/218.82/64.40/218.82 nm. The total film thickness (n2*D0+n1*D1+n2*D2+n1*D3+n2*D4+n1*D5+n2*D6+n1*D7+n2*D8) is 2033.22 nm, which is very thick since it is approximately 8.1 times as thick as the $\lambda 0/4$ film thickness (250 nm).

Figure 58:
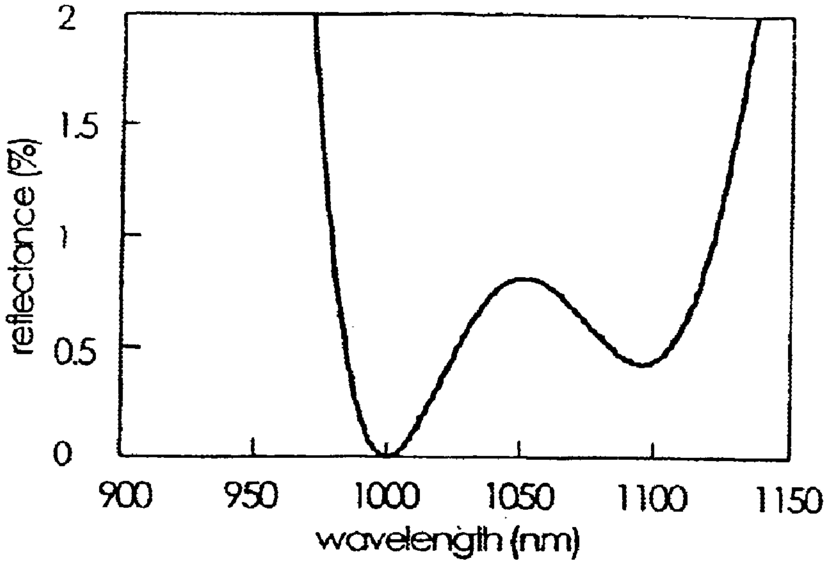
FIG. 58 is a graph showing the wavelength dependence of the reflectance of an end face of a semiconductor laser according to an embodiment of the present invention.

FIG. 58 is a graph showing the wavelength dependence of the reflectance of an end face of a semiconductor laser according to an embodiment (Example 34) of the present invention.

As shown in FIG. 58, the wavelength dependence (curve) of the reflectance has a W-shape (similar to a bathtub shape) in which the wavelength region whose reflectance is 1% or smaller ranges from 979 nm to 1121 nm with its center at the wavelength 1050 nm. Therefore, the wavelength 1000 nm at which no reflection occurs is on the shorter-wavelength side of the center wavelength of the wavelength region in which the reflectance is 1% or smaller.

The semiconductor laser devices of Examples 32, 33, and 34 each employ a low-reflective coating film 14 having the configuration of the tenth embodiment described above.

However, the semiconductor laser devices of Examples 32, 33, and 34 may have the configuration of a low-reflective coating film employed by the first, second, or ninth embodiment, or they may use a low-reflective coating film made up of only a single layer.

Figure 59:
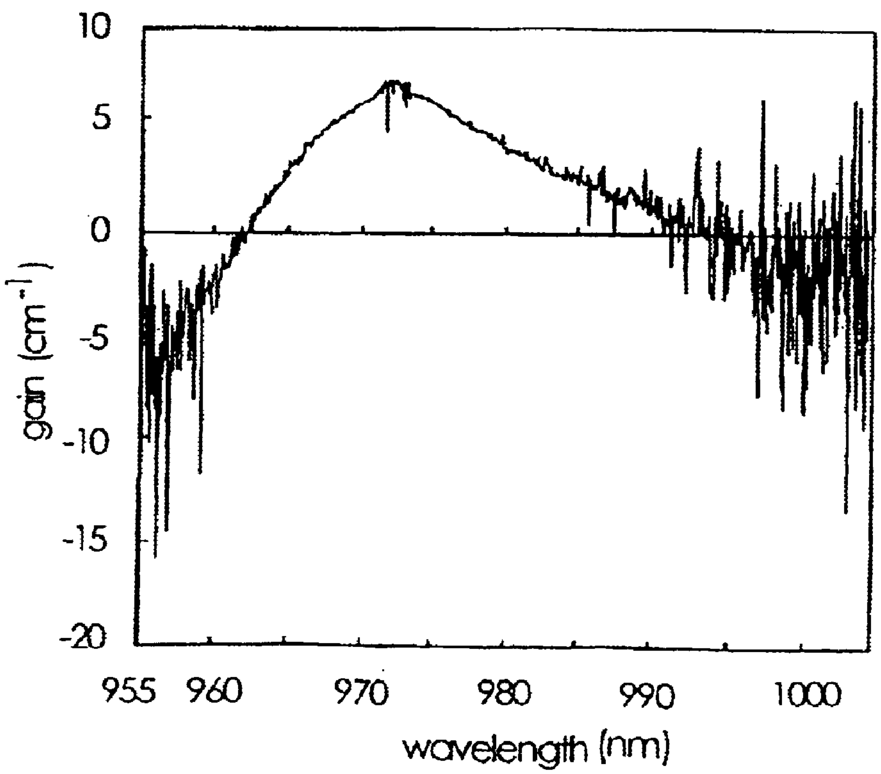
FIG. 59 is a graph showing a gain distribution of a semiconductor laser according to an embodiment of the present invention.

FIG. 59 is a graph showing a gain distribution of a semiconductor laser according to an embodiment of the present invention.

The wavelength at which the gain of the semiconductor laser 12 shown in FIG. 59 is maximized, that is, the gain peak wavelength, is approximately 972 nm.

It should be noted that the graph showing the gain distribution was obtained before the low-reflective coating film 14 was formed. Therefore, it is considered that the semiconductor laser devices described later also have the same gain-distribution.

The gain peak wavelength of the semiconductor laser 12 is set to be always on the shorter-wavelength side of the wavelength 1000 nm at which the reflectance of the emitting end face having the low-reflective coating film 14 formed thereon is zero (or no reflection occurs). With this arrangement, the gain of the semiconductor laser 12 can be made equal to the loss of the semiconductor laser device at a wavelength in the wavelength region in which the loss of the semiconductor laser device increases with increasing wavelength. As a result, it is possible to reduce the change in the oscillation wavelength of the semiconductor laser device due to a change in the ambient temperature or the injection current.

Figure 60:
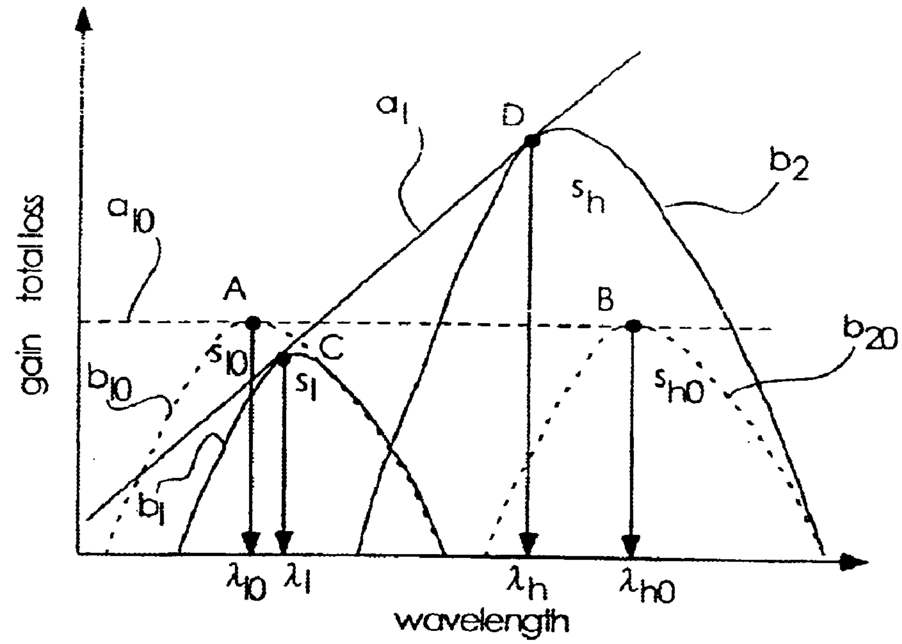
FIG. 60 is a schematic diagram showing the relationship between the loss and the gain of a semiconductor laser device according to an embodiment of the present invention.

FIG. 60 is a schematic diagram showing the relationship between the loss and the gain of a semiconductor laser device according to an embodiment of the present invention.

In the figure, a solid line a1 indicates the total loss of a semiconductor laser device of the present invention, while solid lines b1 and b2 indicate the gain of the semiconductor laser device. Furthermore, reference numeral Sl indicates the total gain at a low temperature, while Sh indicates the total gain at a high temperature. Each total-gain is proportional to the injection current.

It should be noted that broken line a10 indicates the total loss of a conventional semiconductor laser device for the 980 nm band, while broken lines b10 and b20 indicate the gain of the semiconductor laser device. These are provided for comparison. Furthermore, reference numeral Sl0 indicates the total gain of a conventional semiconductor laser device at a low temperature, while Sh0 indicates the total gain at a high temperature. Each total gain is proportional to the injection current.

The total loss of the conventional semiconductor laser device indicated by broken line a10 exhibits little dependence on the change in the wavelength. At a low temperature, since the gain becomes equal to the total loss at point A, the oscillation occurs at the wavelength λl0. At a high temperature, the gain is produced on the long-wavelength side since the bandgap is reduced. Therefore, the gain becomes equal to the loss at point B, resulting in oscillation at the wavelength λh0. That is, the oscillation wavelength difference is expressed as "λh0−λl0".

On the other hand, the mirror loss of the semiconductor laser device of the present embodiment has a wavelength dependence and furthermore the total loss increases with increasing wavelength as indicated by solid line a1. Therefore, at a low temperature, the gain becomes equal to the loss when the value of the gain is small as indicated by point C, resulting in oscillation at the wavelength λl. At a high temperature, a larger gain is required, resulting in oscillation at the wavelength λh as indicated by point D. Therefore, the oscillation wavelength difference is expressed as "λh−λl".

As can be seen from FIG. 60, (λh−λl)<(λh0−λl0).

The difference between the gains of the conventional semiconductor laser device obtained at the high and low temperatures is expressed as "Sh0−Sl0", while that for the semiconductor laser device of the present embodiment is expressed as "Sh−Sl". Then, the inequity (Sh−Sl)>(Sh0−Sl0) holds.

The change in the wavelength of the semiconductor laser device of the present embodiment due to a change in the temperature or the injection current is related to that for the conventional semiconductor laser device by the following inequality.

$$(\lambda h-\lambda l)/(Sh-Sl)<<(\lambda h0-\lambda l0)/(Sh0-Sl0)$$

Thus, the change in the wavelength of the semiconductor laser device of the present embodiment due to a change in the temperature or the injection current can be very greatly reduced, as compared with the conventional semiconductor laser device.

Figure 61:
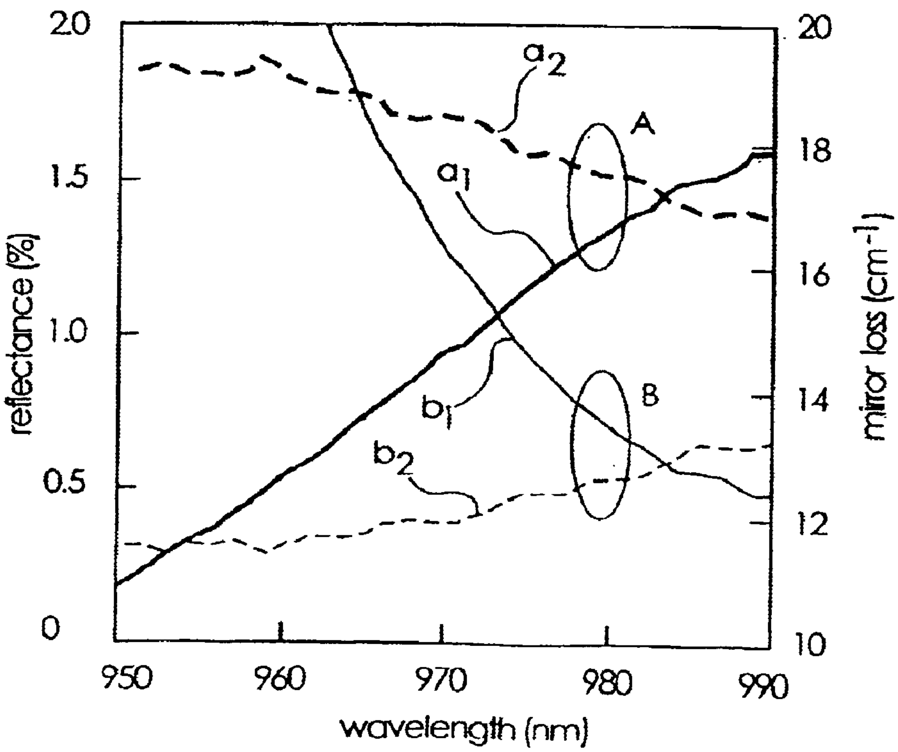
FIG. 61 is a graph showing the wavelength dependences of the reflectance and the mirror loss of a semiconductor laser device according to an embodiment of the present invention.

FIG. 61 is a graph showing the wavelength dependences of the reflectance and the mirror loss of a semiconductor laser device according to an embodiment of the present invention. For comparison, FIG. 61 also shows the wavelength dependences of the reflectance and the mirror loss of a conventional semiconductor laser device.

In the figure, the group of curves denoted by reference numeral A indicate mirror losses. Specifically, a solid line a1 indicates the wavelength dependence of the mirror loss of the semiconductor laser device of the present embodiment, while a broken line a2 indicates the wavelength dependence of the mirror loss of the conventional semiconductor laser device.

The group of curves denoted by reference numeral B, on the other hand, indicate reflectances. Specifically, a solid line b1 indicates the wavelength dependence of the reflectance of the semiconductor laser device of the present embodiment, while a broken line b2 indicates the wavelength dependence of the reflectance of the conventional semiconductor laser device.

As shown in FIG. 61, the mirror loss and the reflectance of the conventional semiconductor laser device have little wavelength dependence.

As for the semiconductor laser device of the present embodiment, the reflectance decreases and the mirror loss increases with increasing wavelength.

In the semiconductor laser device of the present embodiment shown in FIG. 61, the ratio of a change in the mirror loss to the corresponding change in the wavelength ($\Delta\alpha/\Delta\lambda$) is approximately 0.18 $cm^{-1}$/nm.

Figure 62:
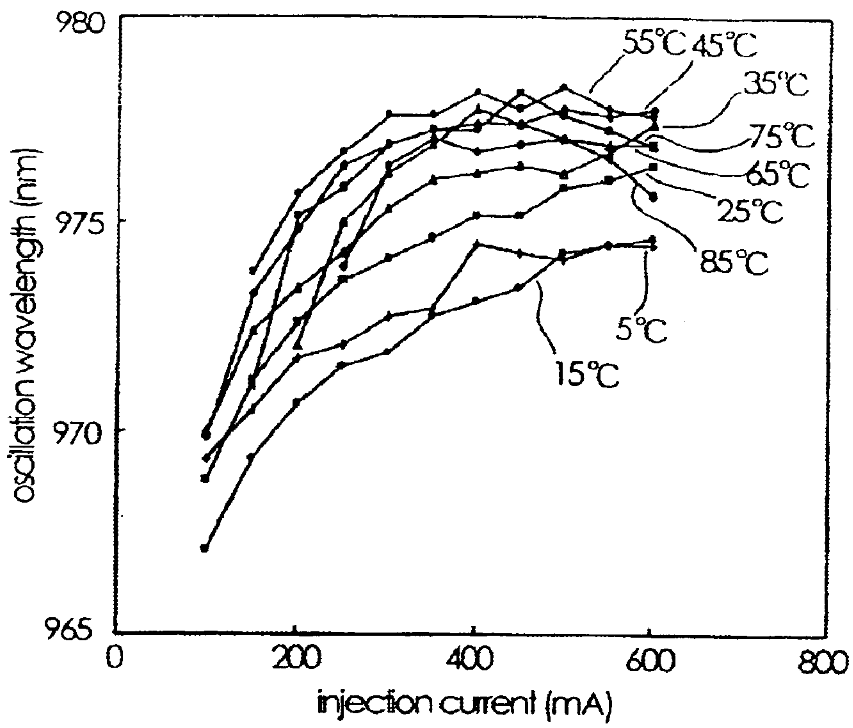
FIG. 62 is a graph showing the temperature and the injection current dependences of the oscillation wavelength of a semiconductor laser device according to an embodiment of the present invention.

FIG. 62 is a graph showing the temperature and the injection current dependences of the oscillation wavelength of a semiconductor laser device according to an embodiment of the present invention.

The temperature is increased from 5° C. to 85° C. in ten steps, while the injection current is increased from 100 mA to 600 mA at intervals of 50 mA.

As shown in the figure, there is a wavelength change ($\Delta\lambda L$) of 11.2 nm between the condition in which the temperature is 5° C. and the injection current is 100 mA and the condition in which the temperature is 85° C. and the injection current is 600 mA.

Figure 63:
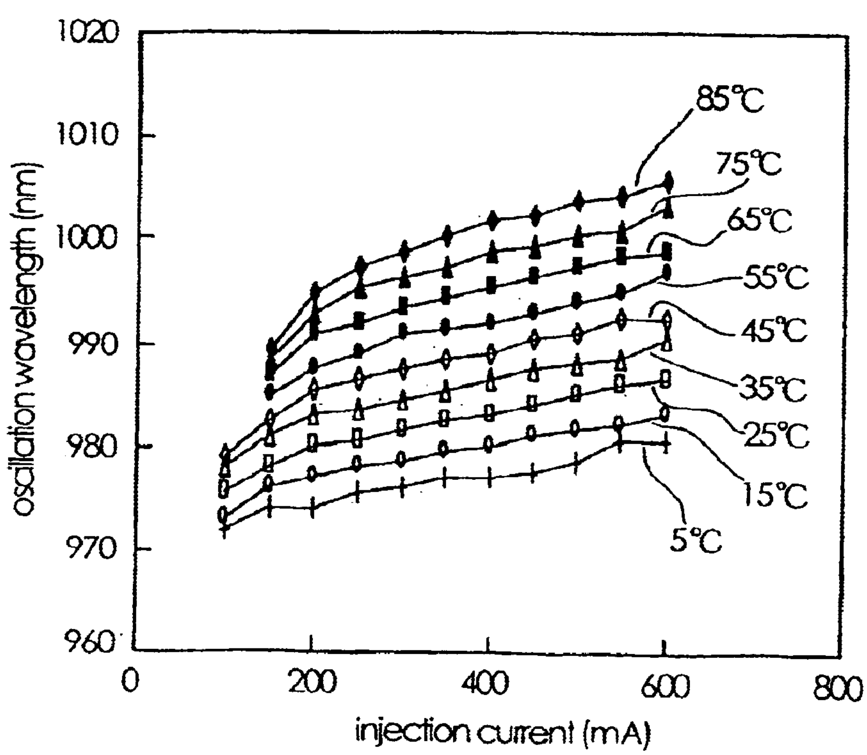
FIG. 63 is a graph showing the temperature and the injection current dependences of the oscillation wavelength of a conventional semiconductor laser device.

FIG. 63 is a graph showing the temperature and the injection current dependences of the oscillation wavelength of a conventional semiconductor laser device. This graph is provided for comparison with the above graph showing the temperature and the injection current dependences of the semiconductor laser device of the present embodiment.

The measurement method is the same as that employed for the semiconductor laser device of the present embodiment.

As shown in the figure, there is a wavelength change (ΔλL) of 33.5 nm between the condition in which the temperature is 5° C. and the injection current is 100 mA and the condition in which the temperature is 85° C. and the injection current is 600 mA.

As can be seen by comparison between FIGS. 62 and 63, the semiconductor laser device of the present embodiment exhibits an oscillation wavelength change approximately one-third of that of the conventional semiconductor laser device when the temperature or the injection current is changed.

Figure 64:
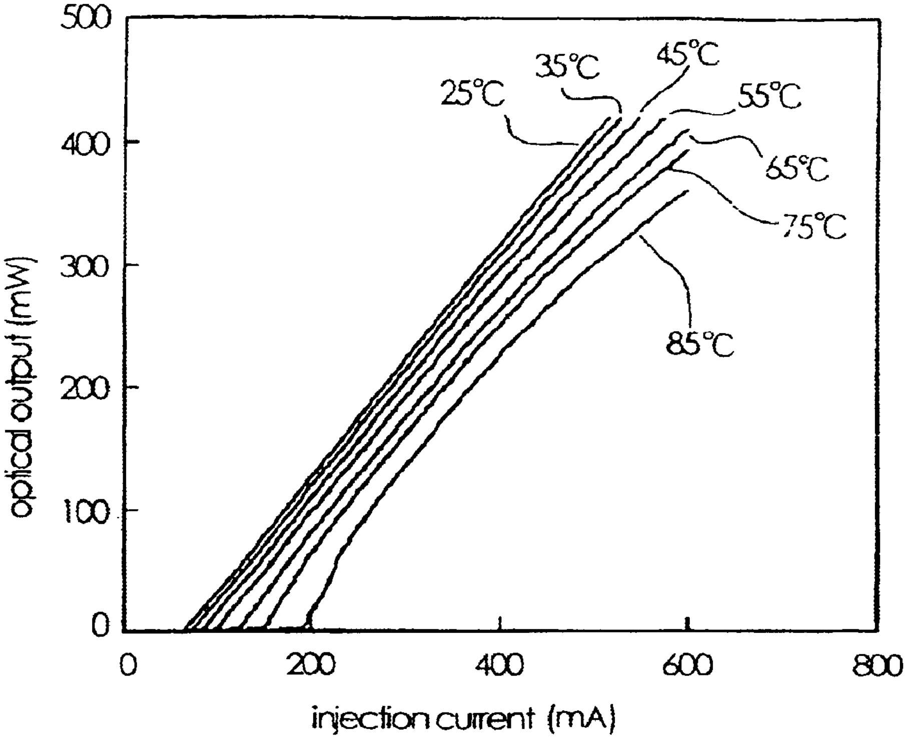
FIG. 64 is a graph showing the temperature dependence of the optical output vs. injection current characteristic of a semiconductor laser device according to an embodiment of the present invention.

FIG. 64 is a graph showing the temperature dependence of the optical output vs. injection current characteristic (hereinafter referred to as P-I characteristic) of a semiconductor laser device according to an embodiment of the present invention.

The temperature was increased from 25° C. to 85° C. in ten steps in a continuous operation, obtaining a continuous wave (CW), when the P-I characteristic was measured.

Figure 65:
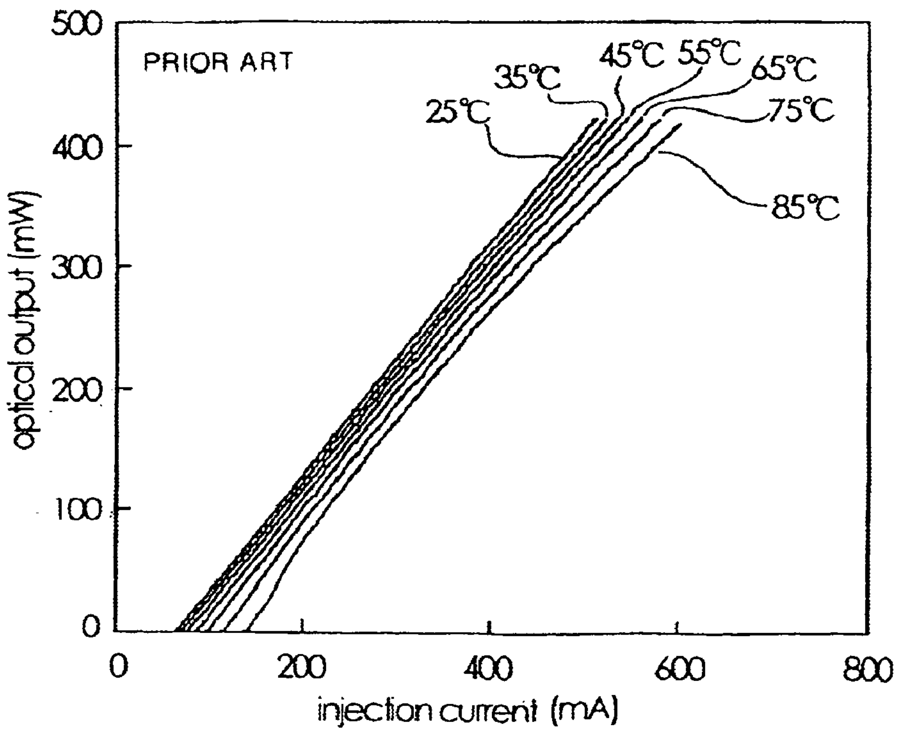
FIG. 65 is a graph showing the temperature dependence of the P-I characteristic of a conventional semiconductor laser device.

FIG. 65 is a graph showing the temperature dependence of the P-I characteristic of a conventional semiconductor laser device.

The P-I characteristic of the conventional semiconductor laser device was measured in the same way as that of the semiconductor laser device of the present embodiment.

As can be seen by comparison between the P-I characteristics of the semiconductor laser device of the present embodiment and the conventional semiconductor laser device, the P-I characteristic curves of the semiconductor laser device of the present embodiment are spaced from one another at intervals larger than those for the conventional semiconductor laser device, and exhibit larger threshold current changes.

Observation of the P-I characteristics shown in FIGS. 64 and 65 and the temperature and the injection current dependences of the oscillation wavelength shown in FIGS. 62 and 63 indicates that in the semiconductor laser device of the present embodiment, the band filtering effect reduces the change in the oscillation wavelength even though it increases the change in the threshold current.

Figure 66:
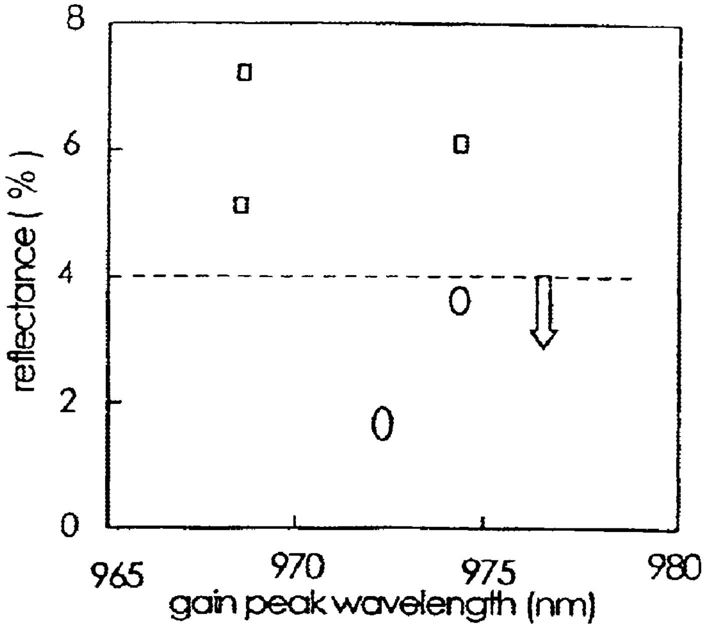
FIG. 66 is a graph showing the wavelength change reducing effects produced by semiconductor laser devices according to embodiments of the present invention, wherein the reflectance value is used to measure these effects.

FIG. 66 is a graph showing the wavelength change reducing effects produced by semiconductor laser devices according to embodiments of the present invention, wherein the reflectance value is used to measure these effects.

The present embodiment provides semiconductor laser devices which employ different gain peak wavelengths and low-reflective coating films, producing different effects in reducing the oscillation wavelength change. In FIG. 66, the effect of reducing the oscillation wavelength change is determined using as a reference a reflectance value which corresponds to (equal to or less than) half of the oscillation wavelength change of the conventional semiconductor laser device.

In the figure, the symbol "○" indicates a semiconductor laser device (of the present embodiment) whose oscillation wavelength change is equal to or smaller than half of that of the conventional semiconductor laser device, while the symbol "□" indicates a semiconductor laser device whose oscillation wavelength change is larger than half of that of the conventional semiconductor laser device. As shown in the figure, the semiconductor laser devices whose emitting end face has a reflectance of 4% or smaller exhibit an oscillation wavelength change equal to or smaller than half of that of the conventional semiconductor laser device. In FIG. 66, the broken line indicates a reflectance value of 4%, which is the borderline, and the arrow indicates the desired area.

Figure 67:
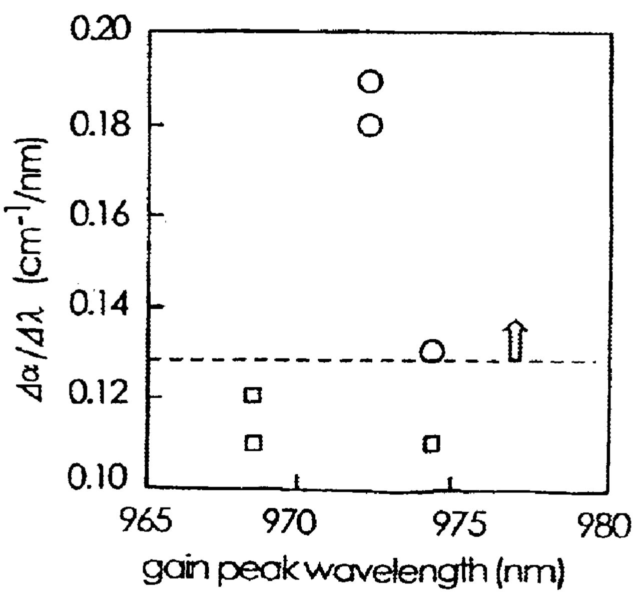
FIG. 67 is a graph showing the wavelength change reducing effects produced by semiconductor laser devices according to embodiments of the present invention, wherein the ratio of a change in the mirror loss to the corresponding change in the wavelength is used to measure these effects.

FIG. 67 is a graph showing the wavelength change reducing effects produced by semiconductor laser devices according to embodiments of the present invention, wherein the ratio of a change in the mirror loss to the corresponding change in the wavelength is used to measure these effects.

In FIG. 67, the effect of reducing the oscillation wavelength change is determined using as a reference a ratio of a change in the mirror loss to the corresponding change in the wavelength ($\Delta\alpha/\Delta\lambda$) in a neighborhood of each gain peak wavelength. The ratio ($\Delta\alpha/\Delta\lambda$) used as the reference corresponds to half of the oscillation wavelength change of the conventional semiconductor laser device.

In the figure, the symbol "○" indicates a semiconductor laser device (of the present embodiment) whose oscillation wavelength change is equal to or smaller than half of that of the conventional laser device, while the symbol "□" indicates a semiconductor-laser device whose oscillation wavelength change is larger than half of that of the conventional semiconductor laser device. As shown in the figure, the semiconductor laser devices whose ratio of the mirror loss change to the corresponding wavelength change ($\Delta\alpha/\Delta\lambda$) is 0.13 $cm^{-1}$/nm or more exhibit an oscillation wavelength change equal to or smaller than half of that of the conventional semiconductor laser device.

According to the present embodiment described above, a coating film is provided on the emitting end face of the resonator of a semiconductor laser such that the reflectance is minimized at a predetermined wavelength λ0, and the wavelength at which the gain of the semiconductor laser is maximized is on the shorter-wavelength side of the wavelength at which the reflectance of the coating film layer is minimized. As a result, the total loss of the semiconductor laser becomes equal to the gain of the semiconductor laser at a wavelength in a wavelength region in which the reflectance decreases with increasing wavelength. With this arrangement, it is possible to reduce the change in the oscillation wavelength of the semiconductor laser device due to a change in the ambient temperature or the injection current.

Further according to the present embodiment, the reflectance of the emitting end face is set to 4% or smaller, and the radio of a change in the mirror loss to the corresponding change in the wavelength ($\Delta\alpha/\Delta\lambda$) in a neighborhood of the gain peak wavelength is set to 0.13 $cm^{-1}$/nm or more. As a result, the oscillation wavelength change becomes equal to or smaller than half of that of the conventional semiconductor laser device, making it possible to provide a semiconductor laser device producing noticeable effect in reducing the oscillation wavelength change.

The above description was made of low-reflective coating films having up to nine layers. However, the present invention can be applied to a configuration employing a low-reflective film of more than nine layers.

Further, the present invention is not limited to the above values of the parameters ak, b1, and c1.

Still further, even though each embodiment (and their examples) assumes that the light propagating through the optical semiconductor device has a wavelength near 980 nm, the present invention is not limited to this specific wavelength and can also be applied to visible light of other wavelengths, infrared light, and ultraviolet light.

Still further, the above description illustrates semiconductor laser devices as examples. However, it goes without saying that the present invention can be applied to other optical semiconductor devices such as semiconductor optical amplifiers (SOAs), superluminescent diodes (SLDs), and optical modulators.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. An optical semiconductor device comprising:

an optical semiconductor element having an equivalent refractive index nc and an end face for receiving and emitting light; and a coating film layer structure which includes a first coating film disposed on the end face of said optical semiconductor element, having a refractive index n1 and a thickness a0*d1, where a0 is a positive real number, and a second coating film disposed on said first coating film and having a refractive index n2 and a thickness a0*d2, wherein n0 and λ0 respectively denote a refractive index of free space at a surface of said coating film layer structure and a wavelength of light propagating through said optical semiconductor element, both a real part and an imaginary part of an amplitude reflectance of the coating film layer structure, which is determined by the wavelength λ0, the refractive indexes n1 and n2, and the film thickness a0*d1 and a0*d2, are zero, and only one of the refractive indexes n1 and n2 is smaller than a square root of a product of the refractive indexes nc and n0.

2. The optical semiconductor device according to claim 1, said coating film layer structure further including m (where m is an integer and at least 2) coating film pairs disposed over a surface of the second coating film, one on another, a k-th coating film pair (where k is 1, 2, . . . , and m) consisting of a third coating film with a refractive index n1 and a thickness $a_k$*d1 and a fourth coating film with a refractive index n2 and a film thickness $a_k$*d2, disposed on said third coating film (where $a_k$ is a positive real number), and the amplitude reflectance is determined, in part, by the thicknesses $a_k$*d1 and $a_k$*d2.

3. The optical semiconductor device according to claim 2, wherein said coating film layer structure further includes a fifth coating film disposed on the fourth coating film of the m-th coating film pair and having a refractive index n1 and a thickness b1*d1, where b1 is a positive real number.

4. The optical semiconductor device according to claim 1, wherein said optical semiconductor element is a semiconductor laser, said end face is a light emitting front end face of said semiconductor laser, and total loss of said semiconductor laser becomes equal to gain of said semiconductor laser at wavelengths on both a longer-wavelength side and a shorter-wavelength side of the wavelength λ0.

5. The optical semiconductor device according to claim 1, wherein said optical semiconductor element is a semiconductor laser, said end face is a light emitting front end face of said semiconductor laser, and total loss of said semiconductor laser becomes equal to gain of said semiconductor laser at a wavelength on one of a longer-wavelength side and a shorter-wavelength side of the wavelength λ0, and the total loss of said semiconductor laser becomes larger than the gain of said semiconductor laser at a wavelength on the other of the longer-wavelength side and the shorter-wavelength side.

6. The optical semiconductor device according to claim 1, wherein said optical semiconductor element is a semiconductor laser, said end face is a light emitting front end face of said semiconductor laser, and light produced by said semiconductor laser has a wavelength shorter than the wavelength λ0.

7. The optical semiconductor device according to claim 1, wherein said optical semiconductor element is a semiconductor laser and further including a fiber grating facing an emitting front end face of said semiconductor laser, said coating film layer structure is disposed on the emitting front end face of said semiconductor laser, and has reflectance of more than 1% in a wavelength region having a width at least 55 nm at the wavelength λ0.

8. The optical semiconductor device according to claim 1, wherein said optical semiconductor element is a semiconductor laser and further including a fiber grating facing an emitting front end face of said semiconductor laser, said coating film layer structure is disposed on the emitting front end face of said semiconductor laser, wherein when a reflection wavelength of said fiber grating is longer than the wavelength λ0, reflectance of said coating film layer structure increases more gradually on a longer-wavelength side of the wavelength λ0 than on a shorter-wavelength side of the wavelength λ0, and when the reflection wavelength of said fiber grating is shorter than the wavelength λ0, the reflectance of said coating film layer structure decreases more gradually on the shorter-wavelength side of the wavelength λ0 than on the longer-wavelength side of the wavelength λ0.

9. An optical semiconductor device comprising:

a semiconductor laser, and a low-reflective coating film structure on an end face of said semiconductor laser, wherein reflectance of said low-reflective coating film structure has a minimum at a wavelength λ0, a sum of respective products of refractive indexes and thicknesses of each of layers of said low-reflective coating film structure is larger than one-quarter of the wavelength λ0 of laser light produced by said semiconductor laser, and said coating film layer structure has a reflectance no larger than 1% at a wavelength region having a width exceeding 55 nm at the wavelength λ0.

10. An optical semiconductor device comprising:

a semiconductor laser including a resonator extending between a front end face and a rear end face of said semiconductor laser; and a low-reflective coating film structure on the front end face of said semiconductor laser through which laser light is emitted, wherein reflectance of said low-reflective coating film structure has a minimum at a wavelength λ0, and total loss of said semiconductor laser becomes equal to gain of said semiconductor laser at a wavelength in a region of the reflectance of said low-reflective coating layer structure in which the reflectance of said low-reflective coating film structure decreases with increasing wavelength.

11. The optical semiconductor device according to claim 2, said coating film layer structure further including a fifth coating film having a refractive index n2 and a thickness c1*d2 and disposed between said end face of said optical semiconductor element and said first coating film, where c1 is a positive real number.

12. The optical semiconductor device according to claim 1, wherein refractive index of a coating film closest to said end face of said optical semiconductor element is smaller than refractive index of a coating film disposed adjacent to and over said coating film closest to said end face.

13. The optical semiconductor device according to claim 11, wherein refractive index of a coating film closest to said end face of said optical semiconductor element is smaller than refractive index of a coating film disposed adjacent to and over said coating film closest to said end face.

14. The optical semiconductor device according to claim 3, wherein a sum of a product of the refractive index and the thickness of each coating film of said coating film layer structure is larger than ¼ of the wavelength λ0, and said coating film layer structure has a reflectance no more than 1% at a wavelength region having a width of at least 100 nm at the wavelength λ0.

15. The optical semiconductor device according to claim 11, wherein a sum of a product of the refractive index and the thickness of each coating film of said coating film layer structure is larger than ¼ of the wavelength λ0, and said coating film layer structure has a reflectance no more than 1% at a wavelength region having a width of at least 100 nm at the wavelength λ0.

16. The optical semiconductor device according to claim 14, wherein said optical semiconductor optical element is a semiconductor laser, and said coating film layer structure is disposed on an emitting front end face of said semiconductor laser, and further including a fiber grating facing said emitting front end face of said semiconductor laser.

17. The optical semiconductor device according to claim 15, wherein said optical semiconductor optical element is a semiconductor laser, and said coating film layer structure is disposed on an emitting front end face of said semiconductor laser, and further including a fiber grating facing said emitting front end face of said semiconductor laser.

18. The optical semiconductor device according to claim 3, wherein:

said semiconductor optical clement is a semiconductor laser;

said coating film layer structure is disposed on an emitting front end face of said semiconductor laser;

a wavelength at which reflectance of said coating film layer structure is minimized is on a shorter-wavelength side of a center wavelength of a wavelength region in which the reflectance of said coating film layer structure is no more than 1%; and a wavelength at which a gain of the semiconductor laser is maximized is on a shorter-wavelength side of said wavelength at which the reflectance of said coating film layer structure is minimized.

19. The optical semiconductor device according to claim 11, wherein:

said semiconductor optical element is a semiconductor laser;

said coating film layer structure is disposed on an emitting front end face of said semiconductor laser;

a wavelength at which reflectance of said coating film layer structure is minimized is on a shorter-wavelength side of a center wavelength of a wavelength region in which the reflectance of said coating film layer structure is no more than 1%; and a wavelength at which a gain of the semiconductor laser is maximized is on a shorter-wavelength side of said wavelength at which the reflectance of said coating film layer structure is minimized.

20. The optical semiconductor device according to claim 10, wherein:

reflectance of said coating film layer structure is no more than 4%;

a ratio of rate of change of mirror loss as a function of wavelength is at least 0.13 $cm^{-1}$/nm; and mirror loss equals (1/(2L) ln(1/(Rf*Rr)), L is the length of the resonator of said semiconductor laser, Rf is reflectance of the front end face of said semiconductor laser, and Rr is reflectance of the rear end face of said semiconductor laser.

* * * * *